(12) United States Patent
Yamada et al.

(10) Patent No.: US 7,193,358 B2
(45) Date of Patent: Mar. 20, 2007

(54) LIGHT-EMITTING DEVICE ARRANGED IN THE LIGHT DISTRIBUTION PATTERN FOR A VEHICLE

(75) Inventors: Motokazu Yamada, Anan (JP); Takahiro Naitou, Anan (JP)

(73) Assignee: Nichia Corporation, Anan (JP)

( * ) Notice: Subject to any disclaimer, the term of this patent is extended or adjusted under 35 U.S.C. 154(b) by 0 days.

(21) Appl. No.: 10/934,567

(22) Filed: Sep. 7, 2004

(65) Prior Publication Data
US 2005/0052878 A1    Mar. 10, 2005

(30) Foreign Application Priority Data

| Sep. 5, 2003 | (JP) | ............................. 2003-314553 |
| Sep. 5, 2003 | (JP) | ............................. 2003-314554 |
| Sep. 5, 2003 | (JP) | ............................. 2003-314555 |
| Nov. 27, 2003 | (JP) | ............................. 2003-398211 |

(51) Int. Cl.
*F21M 3/12* (2006.01)
(52) U.S. Cl. ........................................ 313/502; 362/249
(58) Field of Classification Search ................ 313/502, 313/500, 505; 362/121, 538, 539, 543–545, 362/252, 249
See application file for complete search history.

(56) References Cited

U.S. PATENT DOCUMENTS 5,967,651 A * 10/1999 Neumann et al. ........... 362/538
6,121,639 A * 9/2000 Van de Walle ............. 257/103
6,445,127 B1 * 9/2002 Oku et al. ................... 313/506
6,454,448 B2 * 9/2002 Taniuchi et al. ............ 362/517
6,575,609 B2 * 6/2003 Taniuchi et al. ............ 362/517
6,614,170 B2 * 9/2003 Wang et al. ................ 313/498
6,621,211 B1 * 9/2003 Srivastava et al. .......... 313/503
6,657,379 B2 * 12/2003 Ellens et al. ................ 313/503
6,736,524 B2 * 5/2004 Albou ........................ 362/228
6,882,110 B2 * 4/2005 Ishida et al. .................. 315/82

FOREIGN PATENT DOCUMENTS

JP      2001-155510 A      6/2001

* cited by examiner

*Primary Examiner*—Karabi Guharay
*Assistant Examiner*—Dalei Dong
(74) *Attorney, Agent, or Firm*—Smith Patent Office

(57) ABSTRACT

The light distribution pattern for a vehicle having a predetermined horizontal cut-off line section at the top portion on one side of the vertical central line and an oblique cut-off line section whose central line side is lowered in another side. The light distribution pattern of the light source is formed by arranging a plurality of semiconductor light emitting devices with a configuration almost the same shape as the light distribution pattern for a vehicle. The semiconductor light emitting device has a luminance surface whose configuration is almost the same shape as the light distribution pattern for a vehicle. Further, the light source comprising the semiconductor light emitting device includes a fluorescent material whose excitation source is the emission from the nitride semiconductor device and a part of region of the fluorescent material emits light with higher luminance or higher color rendering properties compared with the other regions.

22 Claims, 26 Drawing Sheets

LIGHT-EMITTING DEVICE ARRANGED IN THE LIGHT DISTRIBUTION PATTERN FOR A VEHICLE

BACKGROUND OF THE INVENTION

1. Field of the Invention

The present invention relates to a lighting device and a lighting fixture for a vehicle and more particularly to a lighting device and a lighting fixture for a vehicle comprising a light emitting device including a nitride semiconductor layer.

2. Discussion of the Related Art

Recently development of light emitting devices with high luminance has advanced and light emitting devices have become available for various sources of light in our life. For example, Japanese Patent Application Publication No. 2001-155510 (pages 2 to 3, FIG. 1 and FIG. 5) discloses a lighting device using the combination of a light emitting device and a reflector in order to distribute light from the light emitting device in a narrow angle for a pavement marker with automatic luminescence trigger which is installed in a roadway surface or a wall surface.

Such lighting devices are required to have characteristics capable of emitting light with high luminance and high luminous flux. However, conventional lighting devices have yet to fulfill these requirements.

In addition to high luminance, a light emitting device capable of emitting white light is being put into practical use, and the expectation that such a light emitting device can be a substitute for the conventional halogen lamp has been rising. For example, it is under consideration to use the light emitting device as a headlight for a vehicle.

However, a lighting device using a light emitting device has not yet fulfilled the requirements as a lighting fixture for a vehicle, especially as a headlamp, in terms of spatial distribution of luminous intensity, luminance, etc., and its practical utilization has continued to be desired.

SUMMARY OF THE INVENTION

The objects of the present invention include using a light emitting device as a lighting device in order to illuminate a specific area, and to provide a lighting device and a lighting fixture for a vehicle with high luminance, excellent light distribution, and moreover, a longer operating life.

BRIEF DESCRIPTION OF THE DRAWINGS

The present invention becomes more fully understood from the detailed description given hereinafter and accompanying drawings which are given by way of illustration only, and thus are not limitative of the present invention and wherein.

FIG. 26AA is partially enlarged view of the encircled portion shown in FIG. 26A.

DETAILED DESCRIPTION OF THE PREFERRED EMBODIMENTS

The light emitting device of the present invention mainly comprises a nitride semiconductor layer and a pair of electrode layers, and further includes a fluorescent material layer whose excitation source is light emitted from the nitride semiconductor layer on the surface thereof. The lighting device is comprised of a plurality of the light emitting devices arranged to form a light distribution pattern similar to the shape of the two dimensional light distribution pattern for a vehicle (hereafter referred to as "light distribution pattern"). Moreover, the light emitting device is formed so that the shape of the electrode is almost the same as the shape of the two dimensional light distribution pattern.

In the present specification, the light distribution pattern for a vehicle is referred to as a pattern having a predetermined horizontal cut-off line section on one side of a central vertical line (for example, the right side) and an oblique cut-off line section having an end closer to the central line side (for example, on the left side) being lower than another end. This pattern is based on the traffic regulations under which the vehicles go on the left-hand side on a road, the oncoming lane is on the right side, and the pedestrians and the road signs are designated on the left side. In the present specification, the case in the left-hand traffic will be described. However, the right and left sides can be interchanged depending on the type of traffic encountered.

In a headlight for a vehicle, the horizontal cut-off line section is normally designed to illuminate about 40 to 80 m ahead of the vehicle with the headlight, and the light distribution pattern has an almost flat top in one side of the light distribution pattern. In a vehicle headlight, an oblique cut-off line section is normally designed to illuminate about 40 to 100 m ahead of the vehicle on an open road, especially to illuminate pedestrians and road signs on the left. There are a variety of light distribution patterns for a vehicle such as high beam, low beam, and main beam. However, in the present invention, the light distribution pattern will be described with reference to a so-called low beam.

The oblique cut-off line section is normally a slanted line higher in the left which intersects with the horizontal cut-off line section. The angle of the oblique line to the horizontal cut-off line section is from about 30° to 60°, preferably from about 40° to 50°, more preferably about 45°. The length of the oblique cut-off line section is from about 1/30 to 1/10, preferably from about 1/30 to 1/20, more preferably from about 1/30 to 1/25 of the horizontal length of the light distribution pattern.

Figure 29:
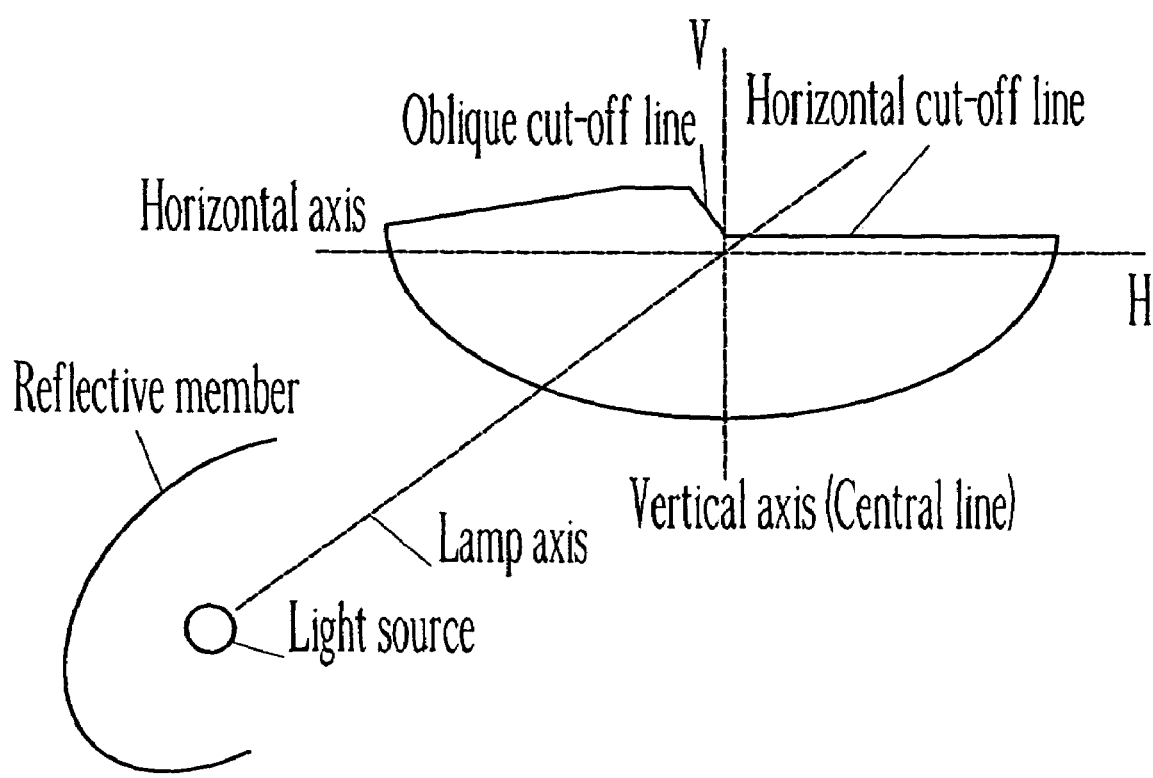
FIG. 29 illustrates the relationships among the central line, the lamp axis, the H—V graph and the cut-off lines.

As shown in FIG. 29, an end of the oblique cut-off line section intersects with the horizontal cut-off line section near the center of the horizontal length of the light distribution pattern, and preferably at the center thereof. It is suitable to construct the other end of the oblique cut-off line section parallel to the horizontal cut-off line section or combine it with an oblique cut-off line section extending in the opposite direction, considering the illumination of the road surface and the traffic signs.

In another respect, the light distribution pattern can be described using the H-V graph which indicates the luminous intensity distribution measurement points according to the JIS D 5500 standard. Let the line H be an intersection formed by a horizontal plane including the lamp axis and a vertical plane which is perpendicular to the lamp axis, and the line V be an intersection formed by a vertical plane including the lamp axis and the vertical plane perpendicular to the lamp axis, the light distribution point can be expressed by the angles of the crossed line H and the crossed line V.

Consequently, the shape of the light distribution pattern can also be expressed. Here, the lamp axis is defined as a line running through the optical center parallel to the central horizontal plane of the vehicle when the lamp is placed in the position of normal operation. The meaning of the lamp axis is not limited to the definition according to the JIS specification for a vehicle, and is applicable to other specifications relating to headlights for vehicles, with appropriate adjustments.

In the H-V graph described above (in the region of $-20°≦H≦20°$, $-5°≦V≦5°$, preferably $-15≦H≦15°$, $-5°≦V≦5°$), the horizontal cut-off line section on one side can be defined as straight lines defined by $0°≦H≦15°$ and $V=0°$. Also, the oblique cut-off line section can be defined as a straight line running through $H=V=0°$, $H=-1°$, and $V=1°$. Moreover, the other end of the oblique cut-off line section can be combined with a straight line defined by $-15°≦H≦-1°$, and $V=1°$, or a straight line defined by $-20°≦H≦-5°$, for example, any one of the straight lines running through $H=-20°$, $-15°$ or $-10°$, and $V=0°$.

In addition, in the lighting device of the present invention, it is specifically desirable to make a portion of the light distribution pattern on the other side of the central vertical line of the light distribution pattern for a vehicle in the vicinity of the upper central line, of higher luminance than other portions including the portion corresponding to the portion for illuminating the road surface ahead. For this reason, the light source corresponding to this portion is desirable to satisfy two or more conditions of (1) having a higher correlated color temperature, (2) having a higher y-value in the CIE chromaticity coordinates, and (3) having a higher optical output than the light sources in other positions.

Such position in the light distribution pattern can be identified with a different view point, as a position corresponding to the region within ±1° from the point $H=-2°$ and $V=-1°$, in other words, a region of $-3°≦H≦-1°$ and $-2°≦V≦0°$ in the H-V graph.

The correlated color temperature is expressed in terms of Kelvin (K) and classified into levels according to the color of light. The correlated color temperature is ranked higher as the light hue changes from yellowish to whitish to bluish (PHOSPHOR HANDBOOK, Phosphor Research Society, Ohmsha, page 429). In terms of incandescent color (2800K to 3200K) which has a demand for the headlamp for a vehicle, the higher correlated color means the higher luminance. The CIE chromaticity coordinates is a chromaticity diagram of a CIE 1931 xyz indication system which illustrates an approximate colors corresponding to the respective chromaticity coordinates of a color of the surface illuminated with a standard illuminant of Illuminant C or D65 (UNIVERSITY OF TOKYO PRESS, Color-science Handbook New Edition, the second edition, frontispiece drawing and page 109). Therefore, in order to obtain a high correlated color temperature, a high y-value in CIE chromaticity coordinates, and/or a high optical output from the light emitting device at the position described above, a light emitting device having such characteristics higher than that of other light emitting devices may be positioned, or a fluorescent material layer can be used in combination with the light emitting device. In order to obtain a high output power, various factors of the light emitting device such as the composition of the semiconductor, the thickness of the layer, the structure of the layer, the doping concentration in the semiconductor, the material for the electrode, and the structure of the electrode can be adjusted as needed.

Moreover, in the lighting device of the present invention, it is specifically desirable that the light source at the position corresponding to a part of the top portion in the oncoming side of the light distribution pattern, i.e., the position for illuminating a pedestrian or a road sign on the road has higher color rendering properties than other positions. Such a position in the light distribution pattern can be selected in the upper region than the extension of the horizontal cut-off line section of one side and in the region from ¼ to ½ of the length of the light distribution pattern for a vehicle from the end of the other side.

From another view point, it may be the position corresponding to the region of $H=-1.5°$ to $-7.5°$ and $0°<V\leqq 1.5°$ in the H-V graph described above.

The color rendering properties of a light source means the characteristics of the light source which dominates the color of an object illuminated by the light source. A high color rendering property means, generally, the property of a light source rendering the color appearance of an object closer to that of under sunlight (PHOSPHOR HANDBOOK, Phosphor Research Society, Ohmsha, Ltd. 429). The color rendering properties can be improved by using a fluorescent material layer which is to be hereinafter described, in combination with the light emitting device.

In order to obtain the peak wavelength longer than the emission from the light emitting devices of other positions, it is suitable to adjust the light emitting device corresponding to the position described above by varying conditions such as the composition of the semiconductor, the thickness of the layer, the structure of the layer, the doping concentration, the material for the electrode, and the structure of the electrode. It is also suitable to use a fluorescent material layer capable of emitting a light with a longer wavelength in combination with the light emitting device.

In the lighting device of the present invention, either of the following properties is required for the light distribution pattern for a vehicle. That is, only a predetermined portion, which is a position in the oncoming side of the central line extending in vertical direction which is also positioned corresponding to near the top of the central line (for example, the position for illuminating the road ahead of the vehicle), has a high luminance; or a position corresponding to a portion of the upper end of the light distribution pattern in the oncoming side (for example, the position for illuminating a pedestrian or a road sign on the road) only has high color rendering properties. However, it is desirable to have both of the high luminance and the high color rendering properties by using a combination of both of the above-described requirements.

Embodiment 1

In the lighting device of the present invention, a plurality of the light emitting devices are arranged so as to form almost the same light distribution pattern as the light distribution pattern for a vehicle. The light distribution pattern for a vehicle has a predetermined horizontal cut-off line section on the top of one side of a central vertical line and an oblique cut-off line section whose central line end being lowered in another end. Also, the light emitting diode is preferably comprised of a nitride semiconductor layer and a pair of electrode layers. Moreover, a fluorescent material layer, to be excited by the emission from the light emitting device, can be provided on the surface of the light emitting device.

Moreover, in the light fixture for a vehicle of the present invention, the luminescent surface of the light emitting device in the above-described lighting device is arranged in a perpendicular direction, and a reflective member having a parabolic surface having a focal point on the luminescent surface is disposed over a front surface or a rear surface of the luminescent surface.

Moreover, in the light fixture for a vehicle of the present invention, the luminescent surface of the light emitting device in the lighting device is arranged in a perpendicular direction, and a lens having a focal point on the luminescent surface is disposed in front of the luminescent surface.

According to the present embodiment, a lighting device having high luminance, long lifetime, white light emission with desired color tone, desired light distribution pattern, and high luminance and/or high color rendering properties in a specific portion, can be provided. At the same time, the lighting device fulfilling the standards for headlights and suitable for a practical use, can be provided.

In the lighting device comprising a plurality of light emitting devices, a plurality of light emitting devices are arranged in positions so as to form a light distribution pattern almost the same as the above-described light distribution pattern, in other words, to configure the light distribution pattern. Here, the phrase "almost the same pattern" is used not only in a mathematically strict meaning but also in approximation, that is, the configuration such as the peripheral shapes of the light emitting device or the luminescent surface are not necessarily similar to the light distribution pattern, but the positioned light emitting devices can illuminate an object with a light distribution pattern similar to the pattern described above.

Figure 1A:
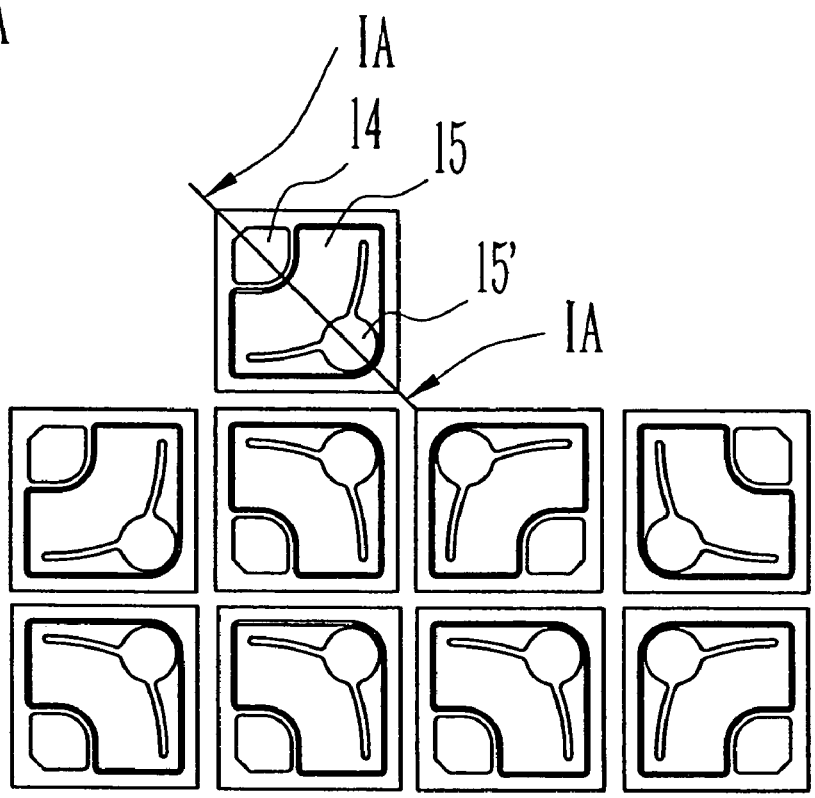
FIGS. 1A to 1E are schematic plan views showing examples of a light emitting device arrangement for a lighting device according to the present invention.
Figure 1B:
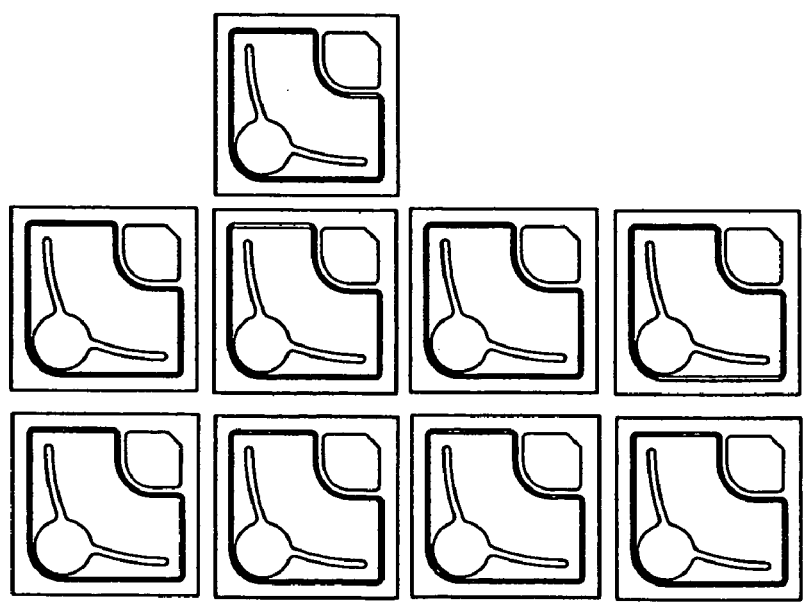
Figure 1C:
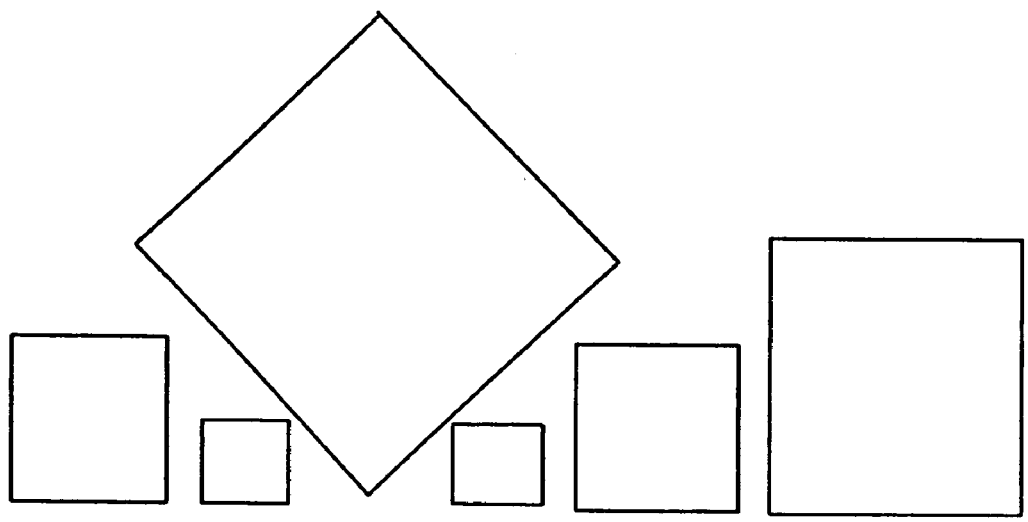
Figure 1D:
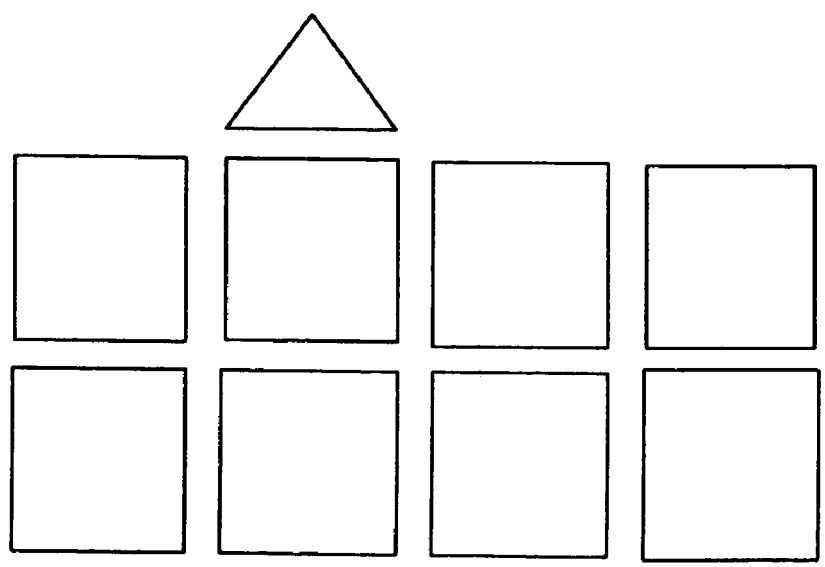
Figure 1E:
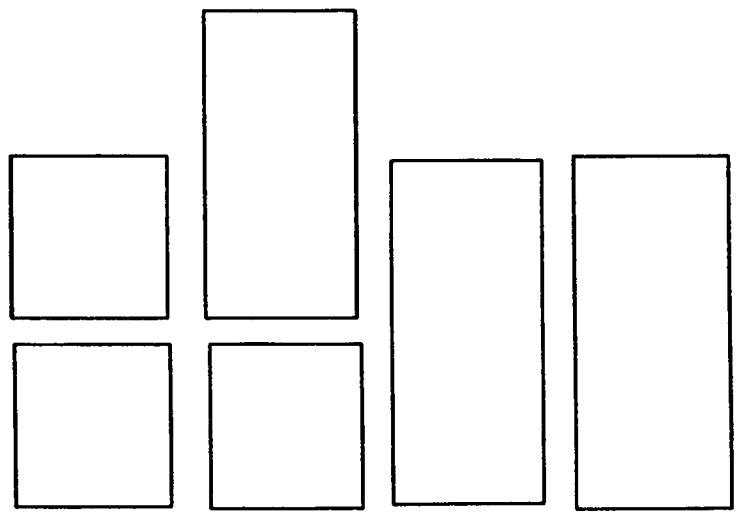

Moreover, in the present invention, either of the light distribution patterns that are in a mirror image relation can be obtained according to the differences in the light extracting planes. Therefore, "almost the same pattern" in the present specification includes a reversed configuration such as in a mirror image. Consequently, the light emitting devices can be arranged such that, for example, with a plurality of light emitting devices having the same shape and the same size as shown in FIGS. 1A and 1B, with a plurality of light emitting devices having the same shape and different sizes as shown in FIG. 1C, or with a plurality of light emitting devices including different shapes as shown in FIGS. 1D and 1E.

Embodiment 2

The light emitting device used in the lighting device in the present embodiment mainly comprises a nitride semiconductor layer and a pair of the electrode layers. The luminescent surface of the light emitting device is configured so as to form a light distribution pattern almost the same as the light distribution pattern for a vehicle. Further, a fluorescent material layer excited by the light emitted from the nitride semiconductor layer can also be disposed on the surface of the light emitting device. In this lighting device, a single light emitting device can compose a lighting device, or a plurality of light emitting devices can compose a lighting device.

In the lighting device of the present embodiment, the luminescent surface of the light emitting device is formed so as to form a light distribution pattern almost the same as the light distribution pattern for a vehicle, in other words, formed into the shape capable of composing the light distribution pattern.

In order to correspond to the shape of the light emitting layer, and further to the shape of one of a pair of the electrode layers (normally the p-electrode) of the light emitting device, the luminescent surface of the light emitting device is formed in a shape corresponding to one of them. It is desirable that both shapes are formed into almost the same as the light distribution pattern for a vehicle.

Figure 11A:
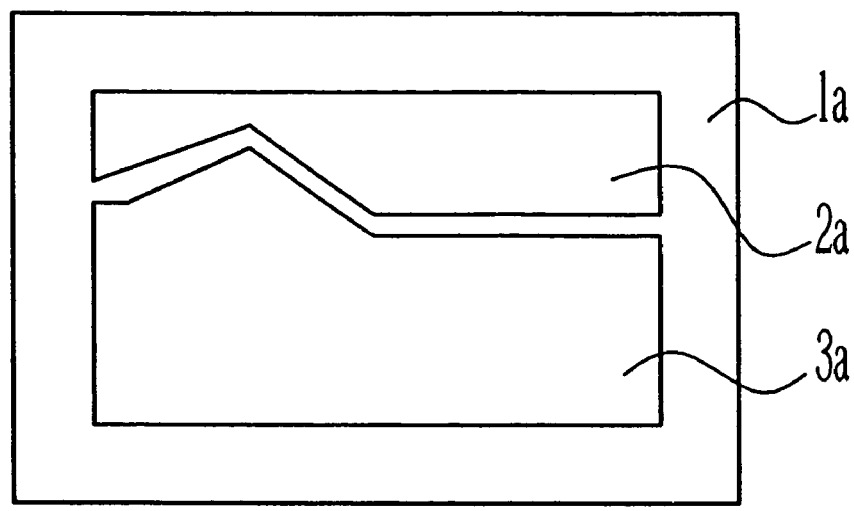
FIGS. 11A to 11C are schematic plan views showing examples of electrode configurations of a light emitting device for lighting devices according to the present invention.
Figure 11B:
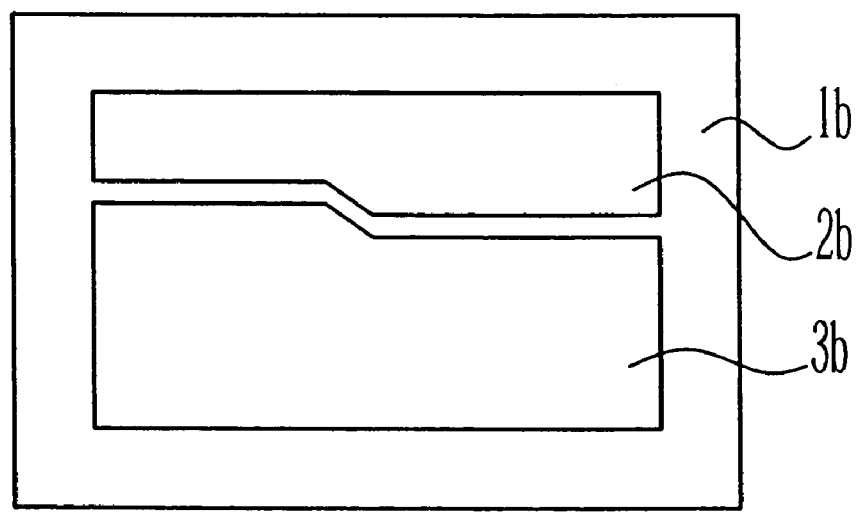
Figure 11C:
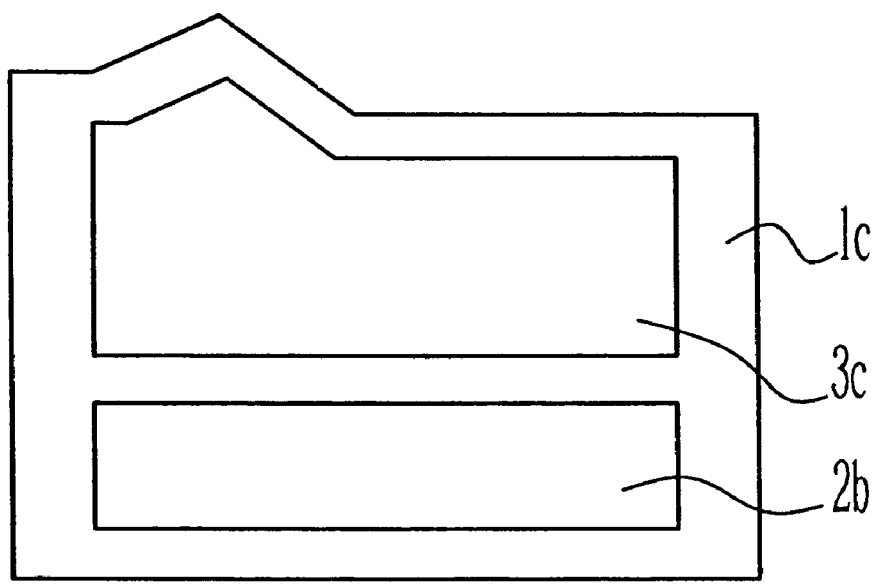

Therefore, in the light emitting device, as shown in FIGS. 11A to 11C, one of the electrode layers, that is, the second electrodes 3a, 3b, and 3c can be formed into almost the same shape as the light emitting layer, and arranged in the position so as to form almost the same shape as the light distribution pattern.

In order to make the luminescent surface corresponding to the above-described position emit light with a longer wavelength than the light from the luminescent surfaces of other positions, it is suitable to use a fluorescent material layer capable of emitting light with a longer peak wavelength in combination with the portion corresponding to this region.

Especially, in the lighting device of the present invention, the shape of the light emitting device is not limited to the above described shape, but a rectangular shape and the like can also be formed. A rectangular shape having the ratio of the sides of about 1:1 to 1:3 is specifically suitable. In this case, the length of a side may be about 250 μm to 5 mm, further preferably about 250 μm to 1 mm. From another viewpoint, the size may be about 0.06 mm² to 10 mm², and further preferably about 0.1 mm² to 1 mm². As described above, it is desirable that one of the electrodes, that is, the second electrode, be formed into a shape corresponding to the light distribution pattern or almost the same shape as the light distribution pattern (FIGS. 11A to 11C), so that the light distribution pattern of the luminescent surface shows almost the same shape as the light distribution pattern for a vehicle.

In the present invention, the light distribution pattern may take two patterns due to the difference in the light extraction surface of the light emitting device. Therefore, "almost the same shape" in the present specification includes inverted shapes such as mirror images.

In any cases described above, it is suitable to construct the lighting device so that the emitted light can be extracted from the opposite side from the electrode layer, that is, from the substrate side. In order to realize this construction, it is suitable to mount the light emitting device with a face-up configuration.

Embodiment 3

The light emitting device of the present invention is provided with a fluorescent material layer whose excitation source is the irradiation on the surface thereof. Moreover, the light emitting device is preferably comprised of the nitride semiconductor layer and a pair of electrode layers. The fluorescent material layer may also be formed so as to show a high luminance, high color rendering properties, or both thereof, by a portion of irradiation from the light emitting device. In this lighting device, either a single light emitting device or a plurality of light emitting devices can be used.

Also, it is preferable that the light emitting device of the present invention be constructed so as to form a light distribution pattern in accordance with the size and shape of the object to be illuminated. For this, it is suitable to form the shape of the luminescent surface of the light emitting device so as to correspond to a desired light distribution pattern. That is, it is formed in almost the same shape as the light distribution pattern. The determining factors of the light distribution pattern include the shape of the luminescent layer and the shape of one of the electrode layers (generally the p-type electrode) of the light emitting device in a single luminescent surface structure, and the arrangement of the luminescent surfaces in a structure with multiple luminescent surfaces.

Figure 16A:
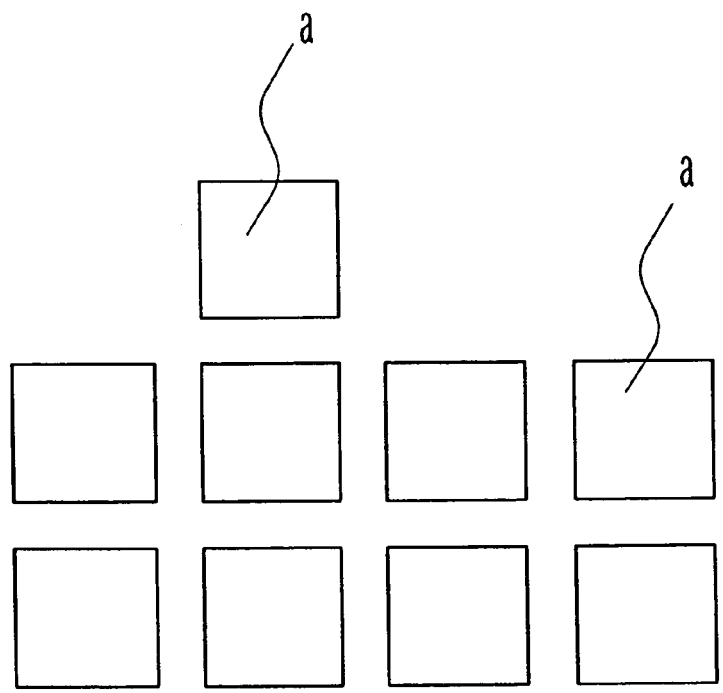
FIGS. 16A to 16C are schematic plan views showing examples of a light emitting device alignments.
Figure 16B:
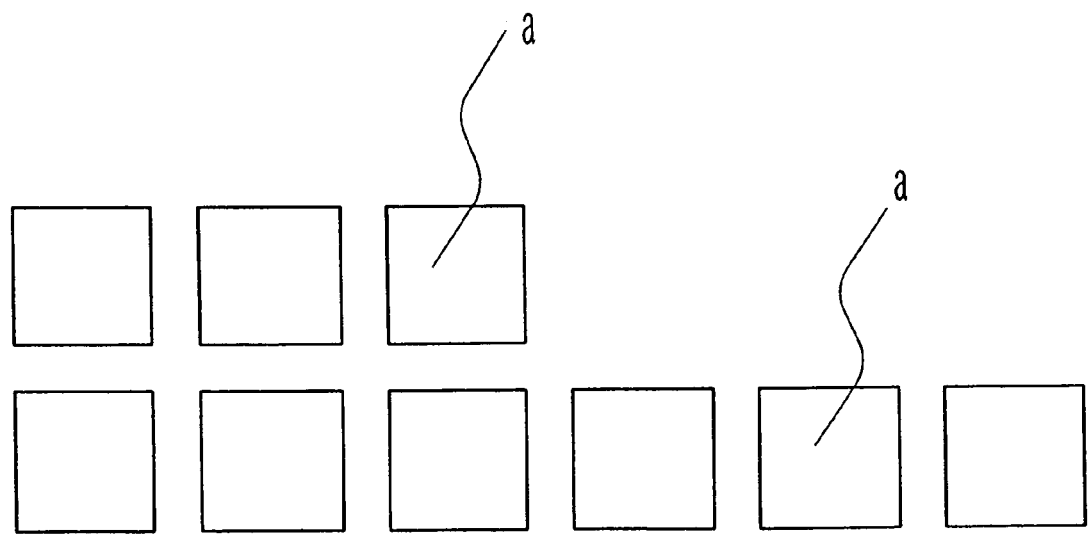
Figure 16C:
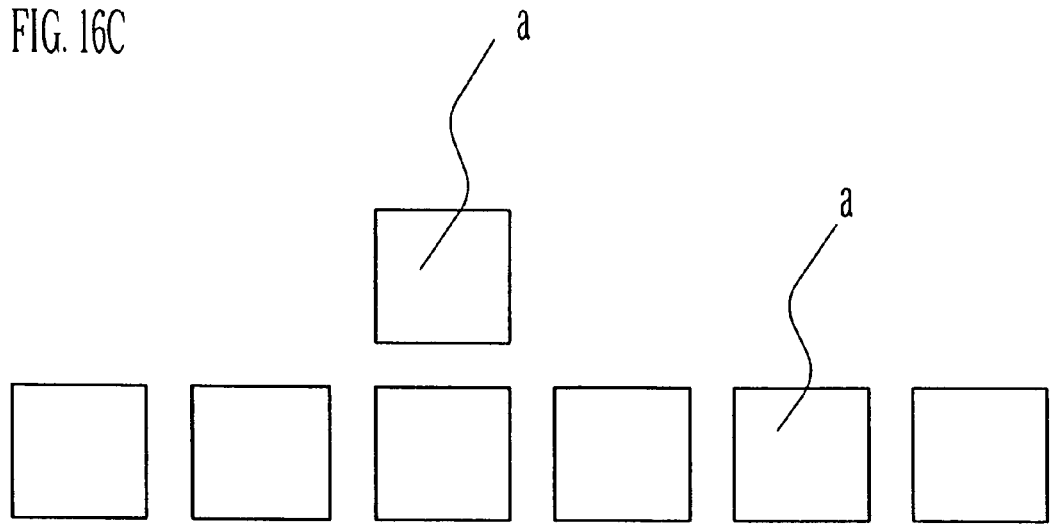
Figure 16D:
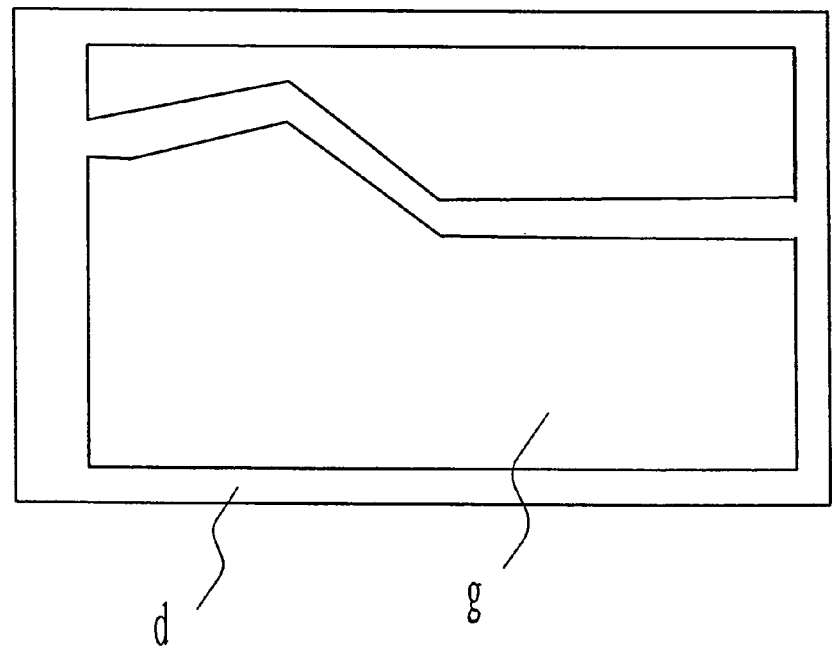
FIGS. 16D to 16F are electrode configurations for lighting devices according to the present invention.
Figure 16E:
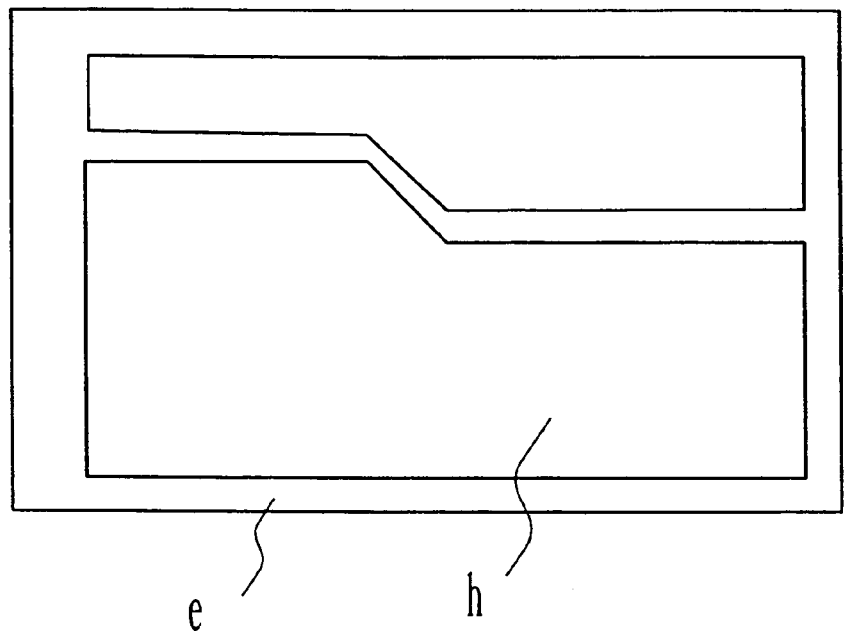
Figure 16F:
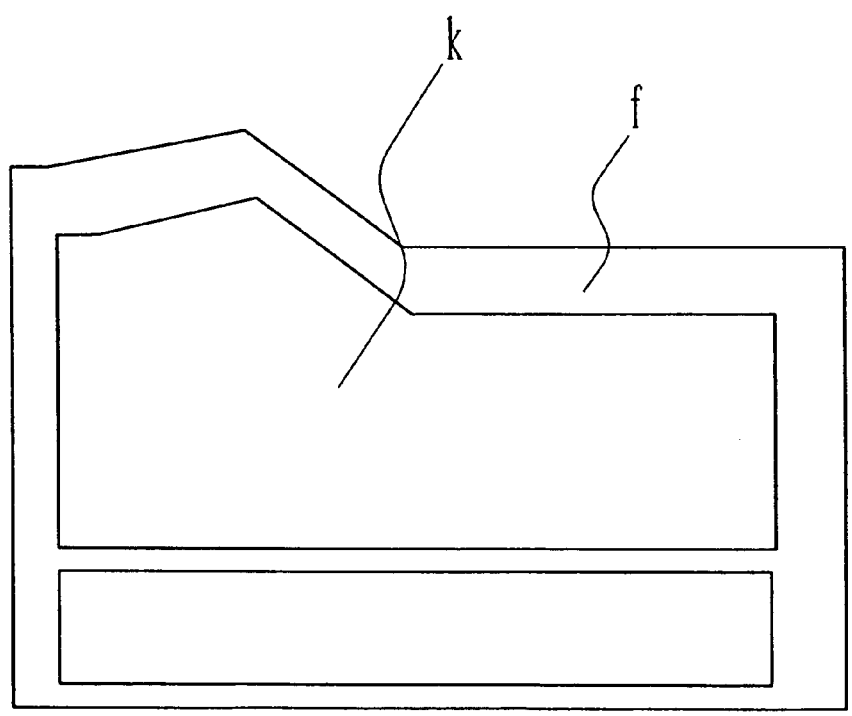

Therefore, for example, as shown in FIGS. 16A to 16C, a plurality of light emitting devices (a) are arranged so as to form the overall peripheral shape of the luminescent surface into almost the same shape as the light distribution pattern for a vehicle, or as shown in FIGS. 16D to 16F, the luminescent layers (d), (e), and (f) and the electrodes (g), (h), and (k) of a light emitting device are formed into almost the same shape as the light distribution pattern for a vehicle.

Examples of the light distribution pattern are not specifically limited, and other than the light distribution pattern for a vehicle described above, various light distribution patterns can be included such as a pattern for illuminating road signs and signboards, a pattern for stage effects and photographic effects, and a pattern for flashlights and searchlights.

The light emitting device described above comprises a fluorescent material layer whose excitation source is the emission from the light emitting device.

Specific example of the region whose luminance to be enhanced is a position corresponding to the other side of the central line and near the upper portion of the central line in the light distribution pattern, that is, a position for illuminating the road surface ahead of the vehicle. Therefore, it is desirable that the luminescent surface corresponding to this position satisfies two or more of the following conditions compared with the luminescent surfaces of other positions: (1) a higher correlated color temperature, (2) a higher y-value in CIE chromaticity coordinates, and (3) a higher optical output.

Such a position in the light distribution pattern can be described from another viewpoint. That is, it is the region defined as ±1° of H=−2° and V=−1°, in other words, a region of −3° ≦H≦−1° and −2°≦V≦0° in the H-V graph.

Specific examples of a portion to be enhanced in the light distribution pattern include the portion where the letters are arranged in the light distribution pattern for illuminating road signs and signboards, the portion for illuminating person's face in the light distribution pattern for exerting stage effects and photographic effects, and the central portion in the light distribution pattern for flashlights and searchlights.

A specific example of the region whose color rendering properties is to be enhanced is a position corresponding to a part of the top portion in the opposite side in the light distribution pattern for a vehicle, that is, a position for illuminating a pedestrian and a road sign on the road. That is, such a position is desirably formed to have higher color rendering properties than other positions. It is desirable that light corresponding to such a position has higher color rendering properties than the light from the other positions. Moreover, such light may have a longer wavelength than the light from the other positions.

The position in the light distribution pattern may be an upper region than the horizontal cut-off line section in one side and within the range from ¼ to ½ of the length of the light distribution pattern for a vehicle from the other end.

Seen from another standpoint, the position may be the region corresponding to H=−1.5 to −7.5°, and 0°<V≦1.5° in the H-V graph.

Specific examples of a portion to be enhanced in the light distribution pattern include the portion for illuminating an area having a plurality of colors or a person's face in the light distribution pattern for exerting stage effects and photographic effects or illuminating road signs and signboards, and a peripheral portion for flashlights and searchlights.

In order to make the luminescent surface correspond to the position described above to have a longer peak wavelength than other positions, it is suitable to use a fluorescent material layer capable of converting light into a longer peak wavelength in combination with the other wavelengths.

The lighting device of the present invention can be made such that only a portion has a high luminance, only a portion has high color rendering properties, or a portion has high luminance and another portion has high color rendering properties. For example, a designated portion of the light distribution pattern for a vehicle, that is, a position on the other side of the vertical central line of the light distribution pattern and near an upper portion of the central line (for example, a portion for illuminating the road surface ahead of the vehicle) can only have a high luminance, and a position corresponding to a part of the top portion on the outgoing direction side in the light distribution pattern (for example, the position for illuminating a pedestrian or a road sign on the road) can only have high color rendering properties. However, a combination of both properties described above is desirable because high luminance and high color rendering properties can be obtained.

Embodiment 4

The light emitting device in the present embodiment mainly comprises at least an n-type semiconductor layer provided with an n-electrode and a p-type semiconductor layer provided with a p-electrode. Moreover, when viewed from the emission observing main surface, the n-electrode or the p-electrode has at least a first electrode and a second electrode including a first line and a second line at an obtuse angle with the first line.

A specific light distribution pattern having regions in the luminescent surface with different luminance and optical output powers, especially a light distribution pattern for headlight of a vehicle, can be obtained by forming a first electrode as a specific shape comprising a first line and a second line at an obtuse angle with the first line and providing at least a second electrode which is, a different electrode from the first electrode. The electrodes are disposed so as to form a luminescent surface having a specific light distribution pattern, and especially have almost the same shape as the light distribution pattern for headlight of a vehicle. The electrode is comprised of a plurality of electrodes including at least a first electrode and a second electrode. The plurality of electrodes include electrodes such as a third electrode and a fourth electrode provided on the surface of the same semiconductor layer, in addition to the first electrode and the second electrode.

In order to obtain such a specific light distribution pattern, the oblique cut-off line section of the light distribution pattern corresponds to the second straight line section of the electrode, and the horizontal cut-off line section corresponds to the first straight line section of the electrode. Therefore, the angle formed by the first straight line section and the second straight line section is within the range from 120° to 150°, and preferably within the range from 130° to 140°, and more preferably the angle is about 135°. The lighting device of the present invention comprises the light emitting device having the first electrode with a configuration including the first straight line section and the second straight line section which intersects with the first straight line section at an obtuse angle.

In the case where there is no specific limitation, the peripheral shape used in the present invention indicates the shape observed from the luminescent surface side.

In the lighting device of the present invention, the luminescent surface of the light emitting device is formed into almost the same shape as the light distribution pattern described above, in other words, a shape capable of forming the light distribution pattern.

The luminescent surface of the light emitting device corresponds to the shape of the light emitting layer, and further corresponds to one of the electrodes of the light emitting device (normally, the p-electrode). Therefore, either configuration, or preferably both, is formed into a shape almost the same as the light distribution pattern for a vehicle. Here, when the n-type and the p-type semiconductor layers are a nitride semiconductor, one of the pair of electrodes is preferably the p-electrode. This is because in the nitride semiconductor, at present, a p-type semiconductor has a higher electrical resistance than that of the n-type semiconductor. Therefore, an emission corresponding to the electrode can be easy to obtain from the light emitting layer between the n-type semiconductor layer and the p-type semiconductor layer, by forming the p-electrode so as to include at least a first electrode and a second electrode. Conversely, if the n-electrode is formed so as to include the first electrode and the second electrode, the electric current tends to spread in the lateral direction in the n-type semiconductor due to low electrical resistance, so that it is difficult to obtain an emission which corresponds to the electrode.

Therefore, the light emitting device is provided with the n-electrode and the p-electrode as shown in FIGS. 11A to 11C.

In FIG. 11A to 11C, reference numerals 1a, 1b, and 1c show the peripheral shape of the light emitting device, and reference numerals 2a, 2b, and 2c show the n-electrode, and reference numerals 3a, 3b, and 3c show the p-electrode. Although the n-electrode and the p-electrode can be interchanged, it is desirable that 3a, 3b, and 3c are the p-electrodes. The electrodes 3a, 3b, and 3c can be disposed with almost the same shape as the light emitting layer and almost the same shape as the light distribution pattern. The light distribution pattern for a vehicle is specifically illustrated in the preferred embodiments where the construction of the light distribution pattern is described. However, the present invention can be applied to a lighting device which requires a specific light distribution pattern such as for the headlamps for a sightseeing boat where one of the right and left headlamps also illuminates in the upward direction and the other headlamp illuminates only in the downward direction.

In the light emitting device of the present invention, especially in the light distribution pattern for a vehicle, the position illuminating the road surface ahead of the vehicle preferably has a higher luminance than the other positions. This position approximately corresponds to the other side of the central line and the upper portion of the central line. Therefore, it is desirable that the luminescent surface corresponding to this position has a higher optical output than the luminescent surfaces of the other positions. Thus, the p-electrode comprises at least the first electrode and the second electrode. The region having high optical output and the region having low optical output can be formed by making the p-electrode, which is formed almost the same shape as the light distribution pattern for a vehicle, with a plurality of electrodes.

The position in such a light distribution pattern can be described from another view point, that is, the position corresponding to a region of ±1° of point H=−2° and V=−1°, in other words, a region of −3°≦H≦−1° and −2°≦V≦0° in the H-V graph. The region is formed so as to be included in a region of higher luminance than the other regions, and also in a region of higher optical output among the electrodes forming the p-electrode.

The p-electrode is comprised of at least the first electrode and the second electrode. In order to obtain a region of high optical output, the lighting device is constructed so that each of the electrodes comprising the p-electrode is provided with a current controller. With this construction, the electric current or electric power loaded into each p-electrode can be respectively controlled. Thus, much of the current or the power can be applied to the region where the optical output is to be increased, so that a region with a high optical output and a region with a low optical output can be formed.

As described above, the shape of such light emitting devices are shown as examples in FIGS. 17 to 20 which are seen from the luminescent surface. Those light emitting devices are constructed so as to have a luminescent surface with the light distribution pattern almost the same shape as the light distribution pattern for a vehicle. For this, the p-electrode is formed to include at least the first straight line section and the second straight line section so as to have a region with high luminance and a region with high output power as described above. As shown in FIGS. 17 to 22, the p-electrode is formed into almost the same shape as the light distribution pattern for a vehicle, the n-type semiconductor layer 11 is exposed from the non-luminescent surface when viewed from the top surface in the rectangular light emitting device, and the n-electrode 14 is disposed thereon. The first electrode 16 whose peripheral shape includes the first straight line section 60 and the second straight line section 70, and the second electrode 17 which is different from the first electrode 16 are disposed. The n-electrode 14 is disposed on the luminescent surface closer to and along the first straight line section 60 and the second straight line section 70 side, extending along a side line of the rectangular light emitting device. Thus, the current density in the region including the two straight lines described above and near the n-electrode (first electrode 16) becomes high. Therefore, the region becomes possible to emit light with a higher luminance and a higher optical output than other regions, such as the central region of the p-electrode. That is, it is possible for the first electrode 16 including the first straight line section 60 and the second straight line section 70 to emit light with a higher luminance and a higher optical output.

Figure 17:
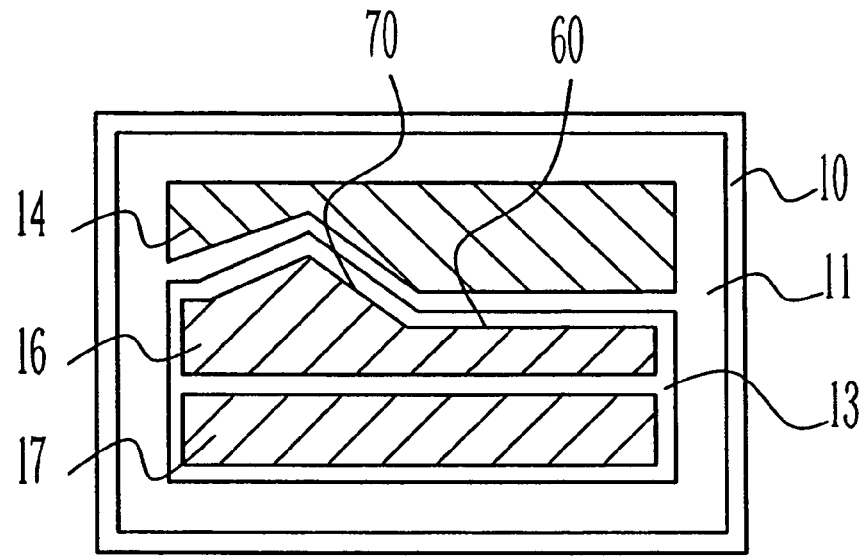
FIG. 17 is a schematic view of a light emitting device seen from the luminescent surface side according to an embodiment of the present invention.

FIG. 17 shows an embodiment where the p-electrode is separated into two regions, that is, the first region is disposed on the n-electrode side (first electrode 16) and the second region is disposed apart from the n-electrode 14 (second electrode 17). The first region (first electrode 16) becomes a region which includes the first straight line section 60 and the second straight line section 70. The second region (second electrode 17) becomes a region along a side opposite from the side along the n-electrode 14 of the rectangular light emitting device. Thus, by forming the p-electrode with two portions, the lighting device having the luminescent surfaces with different luminance or optical outputs can be obtained. Moreover, the lighting device can be utilized for the headlight for a vehicle which satisfies the regulations.

Figure 18:
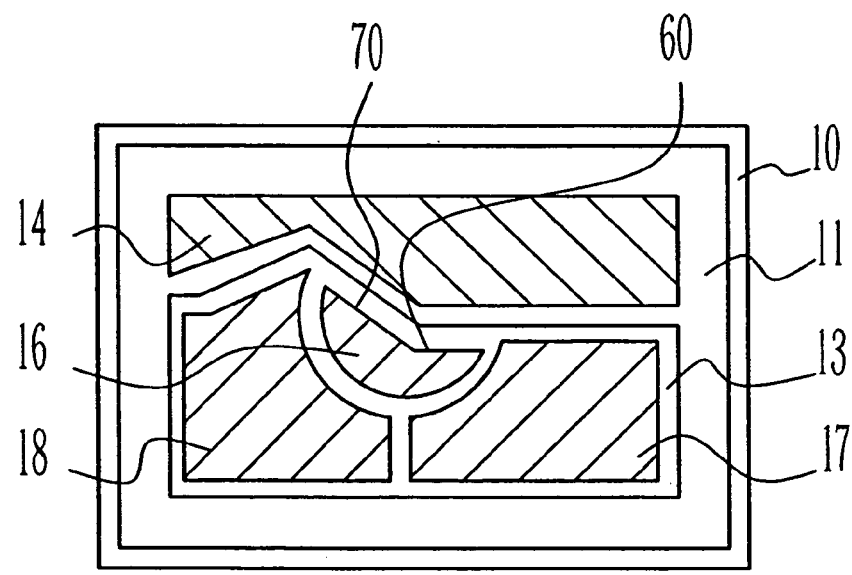
FIG. 18 is a schematic view of another light emitting device seen from the luminescent surface side according to another embodiment of the present invention.

In FIG. 18, the p-electrode is divided into three regions. The first region (first electrode 16) is disposed on the n-electrode side and facing the position where an end of the second straight line section 70 intersects an end of the first straight line section 60. The second region (second electrode 17) is disposed along the two sides facing a side adjacent to a side along the n-electrode 14 of the rectangular light emitting device. The third region (third electrode 18) is disposed along the two sides facing another side adjacent to a side along the n-electrode 14 of the rectangular light emitting device. In the embodiment shown in FIG. 18, the first straight line section 60 is included in the first region (first electrode 16) and the second region (second electrode 17) of the p-electrode, and the second straight line section 70 is included in the first region (first electrode 16) and the third region (third electrode 18) of the p-electrode. Here, at least the first region (first electrode 16) is formed so as to face the position where an end of the second straight line section 70 and an end of the first straight line section 60 intersect. The peripheral shape of the first region (that is, the peripheral shape of the first electrode 16) comprises the first and the second straight lines and curves along the second region (second electrode 17) and the third region (third electrode 18).

Figure 19:
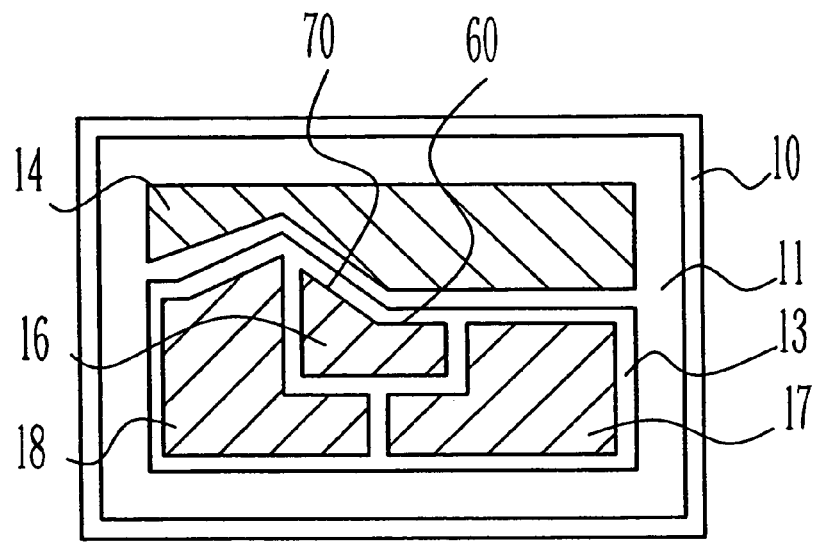
FIG. 19 is a schematic view of another light emitting device seen from the luminescent surface side according to another embodiment of the present invention.

In FIG. 19, in the same manner as the embodiment in FIG. 18, the p-electrode is divided into three regions, the first to the third regions (three electrodes). The peripheral shape of the first region (first electrode 16) comprises the first and the second straight line section, and the straight line section along the second region (second electrode 17) and the third region (third electrode 18).

Figure 20:
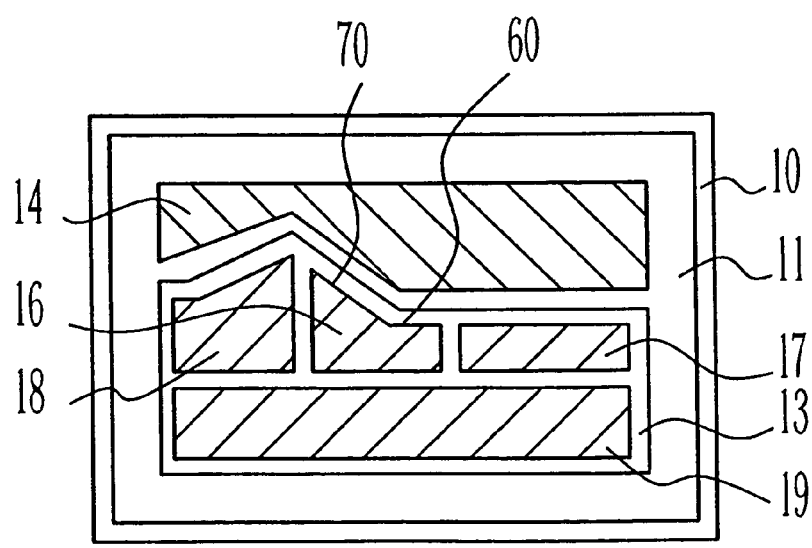
FIG. 20 is a schematic view of yet another embodiment of light emitting device seen from the luminescent surface side according to the present invention.

In FIG. 20, the p-electrode is divided into four portions. The first portion (first electrode 16) is disposed on the n-electrode side and is facing the position where an end of the second straight line section 70 merges into an end of the first straight line section 60. The second portion (second electrode 17) is disposed along the two sides facing a side adjacent to a side along the n-electrode of the rectangular light emitting device. The third portion (third electrode 18) is disposed along the two sides facing a side adjacent to a side along the n-electrode of the rectangular light emitting device. Moreover, the fourth portion (fourth electrode 19) is disposed at a portion further from the n-electrode than the first to the third regions.

As shown above, a region of high optical output and a region of low optical output can be formed in the p-electrode which is disposed in a specific pattern, which is especially almost the same shape as the light distribution pattern for a vehicle, by disposing an electrode (especially the p-electrode) comprising electrodes which are divided into multiple regions. Further, the distance between each of the p-electrodes, that is, the distance between an electrode and its adjacent electrodes is preferably adjusted to 50 µm or less. When the distant becomes greater, luminance and optical output decrease in a part of the light distribution pattern, therefore, it is undesirable. When the distance is 50 µm or less, a desired light distribution pattern can be obtained, and the light emitting device becomes easy to control its luminance and optical output. Although the lower limit for the distance is not specifically limited, it is preferably 2 µm or more, in consideration of the patterning accuracy.

In the case where the light emitting device of the present invention is used for the lighting device, the regions of high output and low output in the p-electrode can be formed by providing an electric controller to each of multiple electrodes constructing the p-electrode, or by displaying the gradation sequence with the duty ratio by applying a pulsed current to each of the electrodes. Moreover, it can be obtained by differing the electric conductivity in each electrode by varying the material and the thickness of the electrode, or by differing the contact resistance between each electrode and the p-type semiconductor layer. Such specific constructions can be used either singly or in combination. Especially, when an electric controller is provided or pulse current is applied to each part of the electrodes, simultaneous forming of each electrode layer of the light emitting device can be achieved by using patterning technology. This is preferable in terms of productivity, and it is possible to vary the luminance and the optical output in each electrode. When varying the electrical conductivity of each part of the electrodes, and varying the contact resistance with the p-type semiconductor layer, a region with high luminance or high optical output can be formed in the luminescent surface by using a single electric controlling method. Therefore, the light emitting device can be fabricated with ease.

The p-electrode of the present invention is disposed on the almost entire surface of the p-type semiconductor layer 13. The material which shows good ohmic features with the p-type semiconductor layer 13 and has a good adhesion is used for the p-electrode. The p-electrode typically takes two configurations according to the mounting form of the light emitting device. In one configuration, the p-electrode side of the light emitting device is used as a light extracting surface and the opposite surface from the p-electrode is used as the mounting surface (in the same manner as above, the face-up mounting method may also be applied). In this case, the p-electrode is required to be transparent at least to the light having the emission wavelength of the light emitting device. In the other configuration, the p-electrode side of the light emitting device is used as the mounting surface and the surface opposite from the p-electrode is used as the light extracting surface (in the same manner as above, the face-down mounting method may also be applied). In this case, although the material for the p-electrode is not specifically limited, it is desirable to use a material with high reflectance at least to the light having emission wavelength of the light emitting device. The material with high reflectance is only needed to have thickness of at least 500 Å, in order to enhance reflectivity.

When the light emitting device is mounted using the face-up method, the p-electrode of the present invention may be bonded by soldering. A p-pad electrode may be disposed on the p-electrode as a wire-bonding portion. When the p-pad electrode is used, the p-electrode is made as the ohmic electrode, and the p-pad electrode is disposed on the p-ohmic electrode. Then, wire-bonding is carried out using the p-pad electrode. When the face-down method is used, the provision of such a pad electrode is not necessary.

In the light emitting device of the present invention, especially when the p-electrode and the n-electrode 14 are disposed on the same surface side, the n-type semiconductor layer 11 is exposed by etching a part of the p-type semiconductor layer 13, and the exposed surface of the n-type semiconductor layer is used as the region for forming the n-electrode. The n-electrode 14 is disposed on the n-electrode forming region. The n-electrode forming region is preferably provided at the position at least facing the first straight line section 60 and the second straight line section 70 formed on the luminescent surface. That is, the n-type semiconductor layer 11 is exposed along the first straight line section 60 and the second straight line section 70 formed on the luminescent surface, and the n-electrode forming region is formed. Thus, by providing the n-electrode forming region so as to face the first straight line section 60 and the second straight line section 70, a rectangular light emitting device can be obtained with ease. After growing the n-type semiconductor layer 11 and the p-type semiconductor layer 13 as a wafer by using a known vapor growth method, the light emitting device having the n-type semiconductor layer 11 and the p-type semiconductor layer 13 is completed by dividing the wafer into chips by using dicing, scribing, or laser scribing, or by using the cleavability of the semiconductor layer. Here, the rectangular shape allows dividing the wafer into chips with ease and thus facilitates the manufacturing process and also improves the process yield.

Moreover, in the lighting device of the present invention, it is desirable to form a uniform luminescent surface. However, when the p-electrode and the n-electrode 14 are disposed on the same surface, the electric current density tends to become unequal in the electric current between the n-type semiconductor layer 11 and the p-type semiconductor layer 13. That is, in the light emitting layer 12 facing the luminescent surface, the electric current density tends to become higher in the portion near the n-electrode 14 than in the other portions. Therefore, the optical output from the first and the second straight line section side tends to rise easily by disposing the n-electrode 14 in the first and second straight line section side (and facing the first straight line section) of the light emitting layer 12. Thus, a region having high optical output, which is one of the objects of the present invention, becomes easy to obtain.

As described above, the nonuniformity in the electric current density in the light emitting layer 12 between the n-type semiconductor layer 11 and the p-type semiconductor layer 13 can be used. However, there is no need for exploiting this property. For example, the electric current tends to flow in the first and second straight line section side and emits light in the instant of driving the lighting device or emission of the light emitting device. That is, when this lighting device is used for the headlamp for a vehicle, the cut-off line section side corresponding to the furthest area to be illuminated emits light preferentially (the first line 60 corresponds to the horizontal cut-off line section 80, and the second line 70 corresponds to the oblique cut-off line section 90). Thus, this is advantageous because the time for illuminating the distant object can be reduced. The lighting device described above can be preferably used in the cases other than the headlight for a vehicle, because the side corresponding to the farthest object emits light preferentially.

Further, the region for disposing the n-electrode 14 is allocated along the first side facing the first straight line section 60 of the rectangular light emitting device. By this configuration, when a rectangular light emitting device is used as a light emitting device having the luminescent surface including the first straight line section 60 and the second straight line section 70, a further preferable n-electrode 14 can be formed. When a rectangular light emitting device is used, the first straight line section 60 is approximately in parallel with the first side of the light emitting device. Therefore, it can be identified from the peripheral shape of the light emitting device. The n-electrode 14 is disposed on the first straight line section 60 and the second straight line section 70 side. Therefore, if the n-electrode 14 is viewed as being divided into the portions of the first straight line section side and the second straight line section side, the portion of the second straight line section side is smaller than that of the first straight line section side. Here, even if the area of the second straight line section side is reduced to the size adequate for a small current flow, the portion of the n-electrode 14 of the first straight line section side can be large enough to secure a sufficient contact area with the n-type semiconductor layer 11. Therefore, the occurrence rate of detachment of the n-electrode from the n-type semiconductor layer 11 (electrode detachment) can be reduced, and at the same time, reduction in size of the light emitting device becomes possible.

Moreover, a sufficient mounting area in the n-electrode side can be obtained in the lighting device using the light emitting device mounted on the submount. That is, at least the mounting area is provided on the n-electrode 14 of the first straight line section side. This is especially effective in the case of face-up mounting described above. In the case where the wire bonding is carried out using soldering etc., the region for the wire bonding can be provided on the n-electrode 14. By providing the wire bonding portion on the first straight line section side, the rectangular light emitting device having the luminescent surface including the first straight line section 60 and the second straight line section 70 can be miniaturized, and the detachment of the wire bonding can be controlled. Therefore, the lighting device with high reliability can be obtained. Here, the n-pad electrode may also be provided as the wire-bonding portion on the n-electrode 14. When the n-pad electrode is used, the n-electrode 14 is formed as the n-ohmic electrode especially having good ohmic features with the n-type semiconductor layer 11. The n-pad electrode is disposed on the n-ohmic electrode and wire bonding is carried out using the n-pad electrode. In the case of face-down mounting described above, the lighting device is formed by mounting the light emitting device using a eutectic solder. In this case, a sufficient mounting area can also be obtained, so that the detachment can be reduced. The submount used in the present invention includes a package provided with the light emitting device, and the n-electrode 14 and the p-electrode of the light emitting device are electrically connected. The submount may have a portion to connect to an external current supply medium, which is one of the components of the lighting device in the present invention.

Moreover, the region for disposing the n-electrode 14 in the present invention preferably has a linearly extending portion along the second and third sides which are the two sides adjacent to the first side facing the first straight line section 60. With this construction, it becomes easy for a uniform electric current to flow in the surface of the light emitting layer 12 between the n-type semiconductor layer 11 and the p-type semiconductor layer 13.

As a result, unevenness in luminance in the light emitting layer 12 can be prevented. It is desirable that the regions with high optical output and low optical output are particularly formed in the present invention so as to prevent unevenness in luminance especially in the region with low optical output.

FIGS. 21 to 26B show the specific configurations for the linearly extending portion at least formed along the second and third sides.

Figure 21:
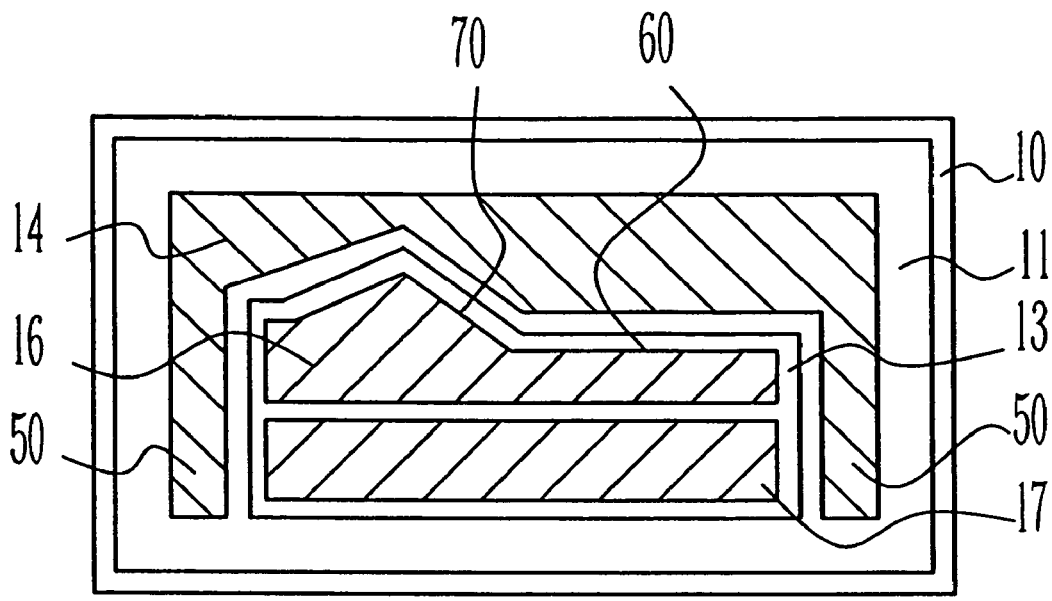
FIG. 21 is a schematic view of still another embodiment of the light emitting device seen from the luminescent surface side according to the present invention.
Figure 22:
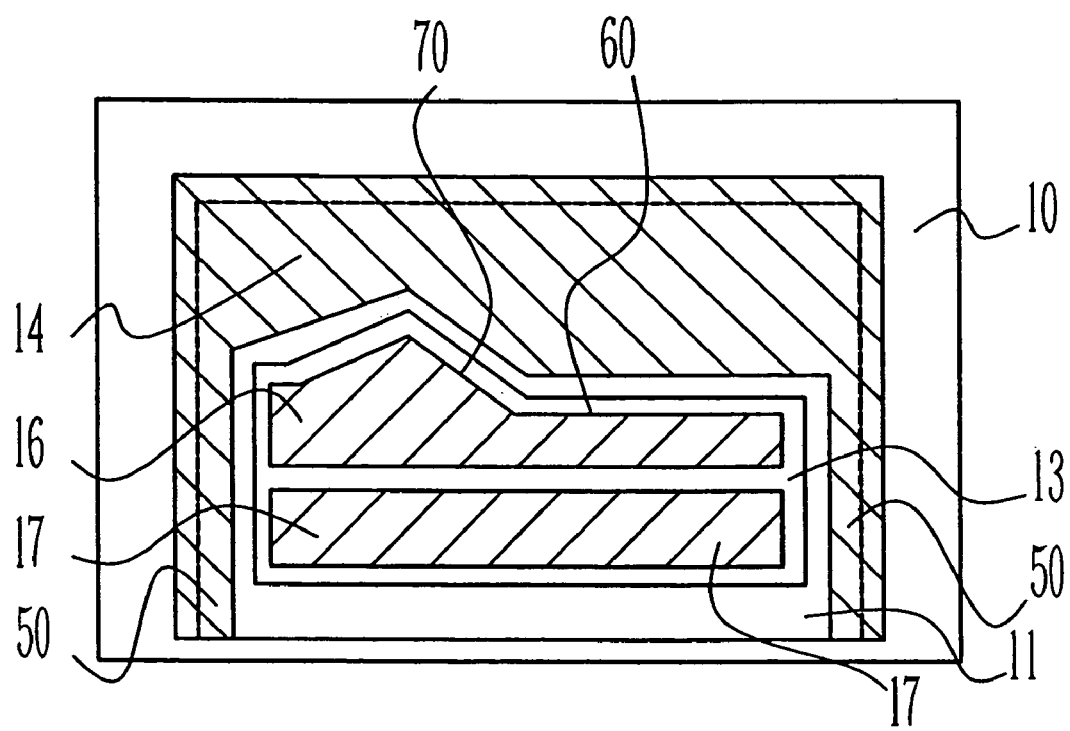
FIG. 22 is a schematic view of a still further embodiment of the light emitting device seen from the luminescent surface side according to the present invention.
Figure 23:
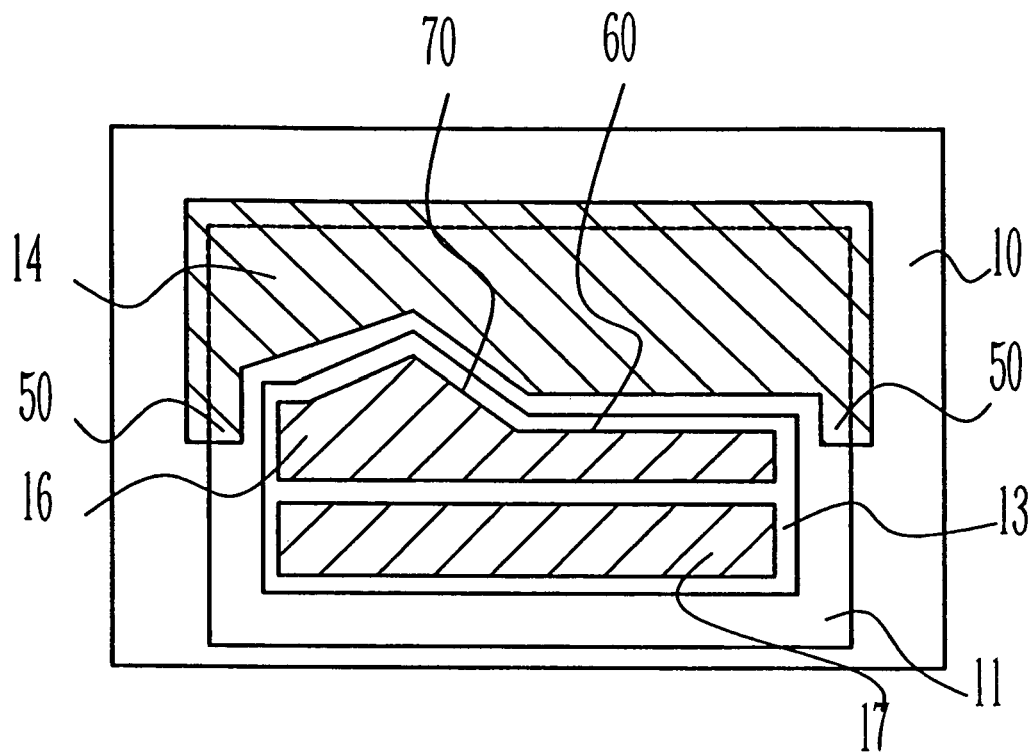
FIG. 23 is a schematic view of yet another embodiment of the light emitting device seen from the luminescent surface side according to the present invention.
Figure 24:
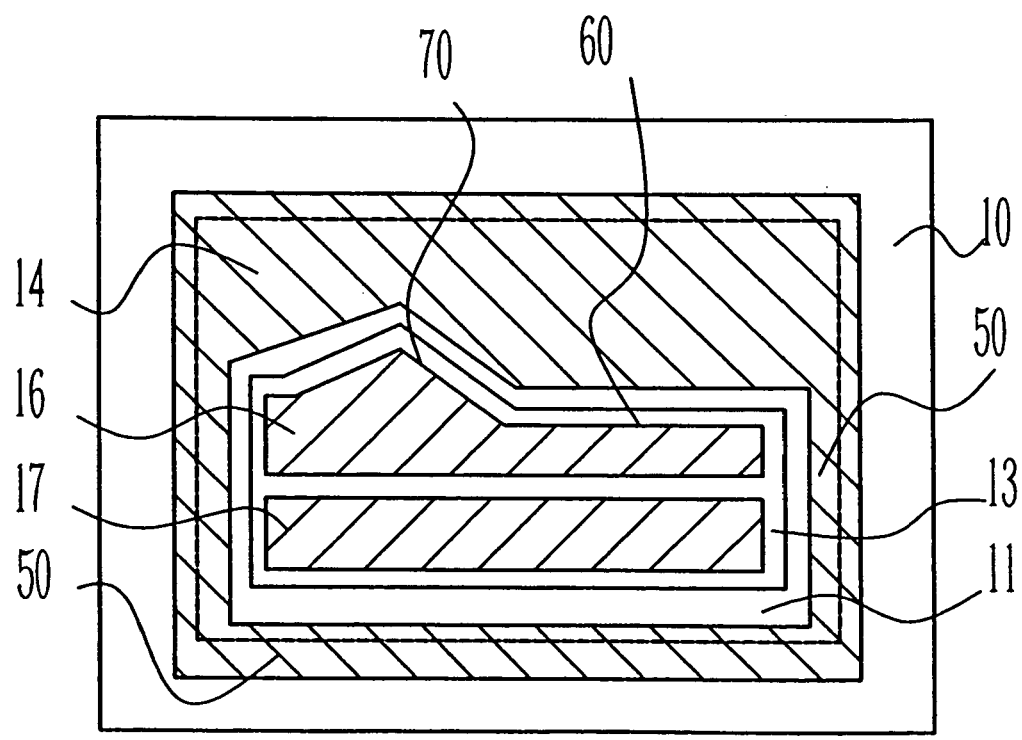
FIG. 24 is a schematic view of still another embodiment of the light emitting device seen from the luminescent surface side according to the present invention.
Figure 25A:
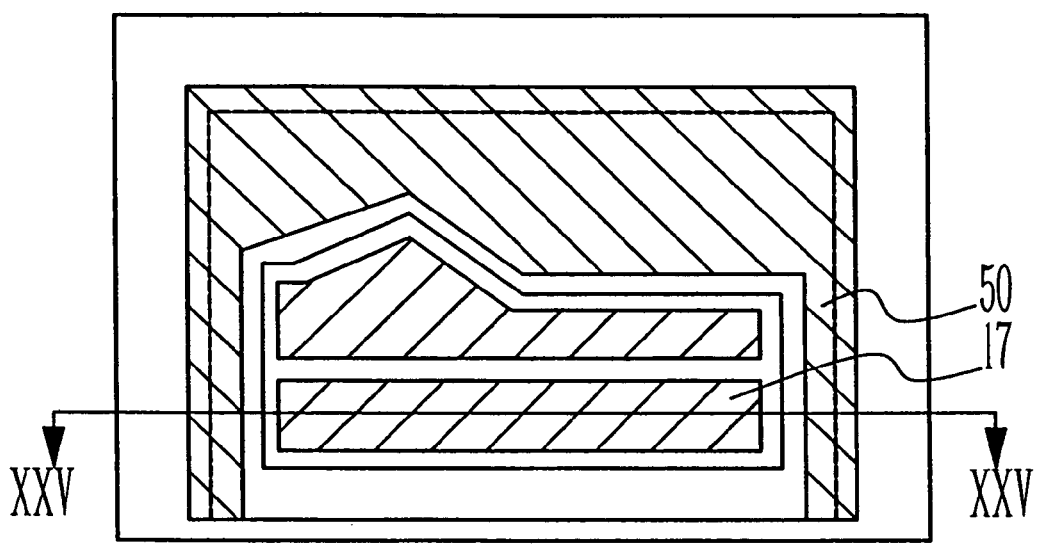
FIG. 25A is a schematic view of a light emitting device of the embodiment shown in FIG. 22 seen from the luminescent surface side.
Figure 25B:
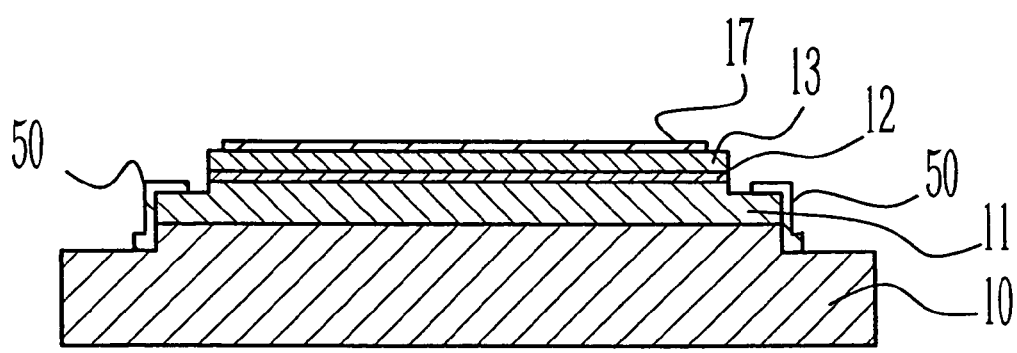
FIG. 25B is a schematic sectional view taken along line XXV—XXV of FIG. 25A.

In FIG. 21, the linearly extending portion is formed along the second and third sides, and the n-electrode 14 is disposed on the n-electrode disposing region. In the configuration shown in FIG. 22, the linearly extending portion is formed along the second and third sides as shown in FIG. 21, and in the configuration in FIG. 23, the linearly extending portion is formed on a portion along the second and third sides. Furthermore, in the configuration in FIG. 24, a linearly extending portion is formed by connecting the tip of the linearly extending portion formed on the second side and the linearly extending portion formed on the third side. In other words, a linearly extending portion is formed along the fourth side of the light emitting device which is facing the first side. The configurations shown in FIG. 21 and FIG. 22 are preferable in terms of the most effective miniaturization of the light emitting device, and the configuration shown in FIG. 24 is preferable in terms of the most effective electric current flow. The n-electrode 50 disposed on those linearly extending portions exhibits an auxiliary function to the n-electrode 14 disposed along the first side. Therefore, it is only needed to be formed to the extent where adequate electric current can flow. The linearly extending portion is preferably formed with the width in the range from 2 to 200 μm, and can be formed, for example, with the width of 20 μm. With this construction, the stable n-electrode 14 can be disposed on the linearly extending portion with good adhesion and also with equal intervals.

Moreover, in the present invention, the n-electrode forming region for the n-electrode 50 preferably includes the side surface of the n-type semiconductor layer which is continuous with the linearly extending portion. Especially, after growing the n-type semiconductor layer 11 and the p-type semiconductor layer 13 as a wafer by using a known vapor growth method, the light emitting device having the n-type semiconductor layer 11 and the p-type semiconductor layer 13 is completed by dividing the wafer into chips by dicing, scribing, or laser scribing, or by using the cleavability of the semiconductor layer. The problem of a short-circuit occurs by exposing the side surface. However, this problem can be solved by disposing an insulating layer extending from the surface to the side surface. However, the light from the light emitting layer 12 may not only be emitted from the luminescent surface but it also transmits through the semiconductor layer and the substrate, and is emitted from the side surface of the light emitting device.

When the emission from the side face is minimal compared to the emission from the luminescent surface, it does not pose a big problem. However, it is also preferable to prevent the emission from the side surface. The emission from the side surface can be prevented by disposing the n-electrode 50 from the linearly extending portion to the side surface of the n-type semiconductor layer which is contiguous with the linearly extending portion. The n-electrode 50 is disposed continuously from the linearly extension portion through the n-type semiconductor side surface so as to reach the substrate. It is also desirable that by disposing the n-electrode 14 on the side surface, the contact area between the n-type semiconductor layer 11 and the n-electrode 14 can be increased and the drive voltage can be reduced, and also it becomes difficult to detach the n-electrode 50 disposed on the linearly extending portion from the n-type semiconductor layer 11. FIGS. 22 to 26B illustrate the configurations where the n-electrode 50 is disposed from the linearly extending portion to the side surface of the n-type semiconductor layer which is continuous with the linearly extending portion. Especially, the effect of disposing the n-electrode on the side surface becomes more significant in the configuration shown in FIG. 22 than in the configuration shown in FIG. 21.

In the region where an end of the second straight line section 70 intersects an end of the first straight line section 60, the n-electrode disposing region has a portion with an obtuse angle, and the first electrode 16 of the p-electrode and the n-electrode 14 have a corner portion, respectively. Electric current tends to concentrate in this region because the both electrodes have corner portions. Therefore, it becomes difficult to control the luminance intensity or the optical output power. However, the n-electrode disposing region is formed by carrying out etching on the p-type semiconductor layer 13 in order to expose the n-type semiconductor layer 11, and the etching depth becomes deeper than the etching depth made by etching carried out on the patterned p-electrode and the n-electrode. When the etching becomes deep as is in this case, the corners tend to be rounded. That is, the n-electrode disposing region loses a corner portion, or at least becomes a different shape from the corner portions of the p-electrode and the n-electrode 14.

Figure 26A:
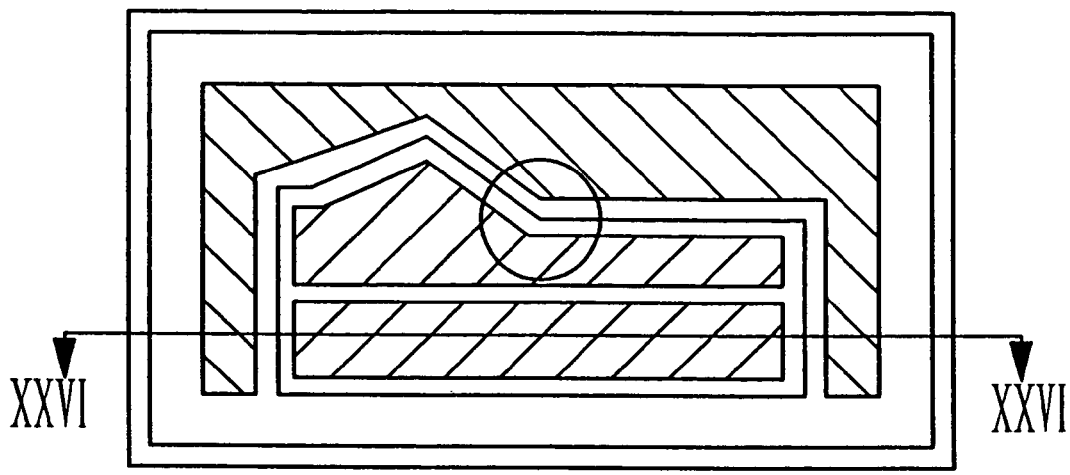
FIG. 26A is a schematic view of a light emitting device of the embodiment shown in FIG. 21 seen from the luminescent surface side.
Figure 26A:
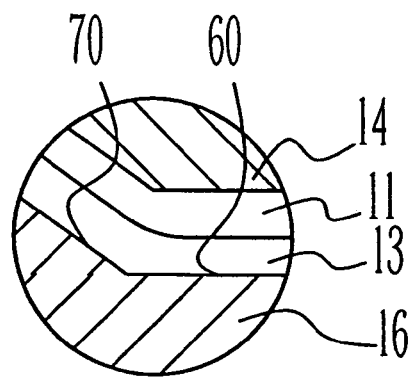
Figure 26B:
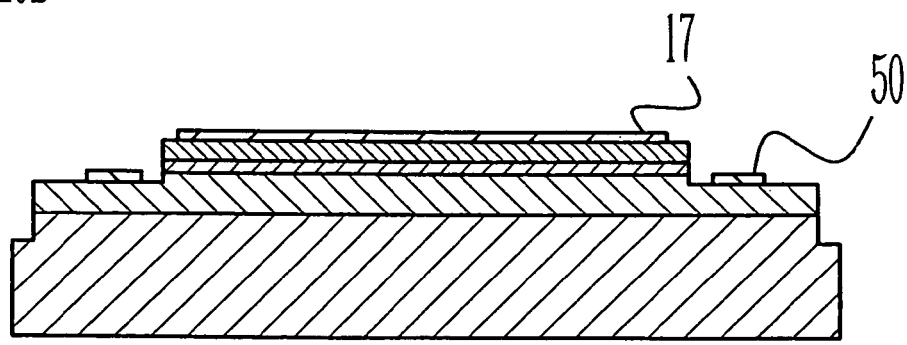
FIG. 26B is a schematic cross sectional view taken along line XXVI—XXVI of FIG. 26A.

FIG. 26A schematically illustrates the construction described above (in FIG. 23, the first electrode 16 among the p-electrodes has a corner portion). With this construction, the electric current can be prevented from concentrating in the region even if both electrodes have corner portions. As a result, the light emitting device and also the lighting device having the specific light distribution pattern with easy control of the luminance or the optical output power can be obtained. The light emitting device used in the lighting device of the present invention preferably includes a fluorescent material whose excitation source is the light emitted from the light emitting device. By using the fluorescent material, the light emitted from the light emitting device and the light emitted from the fluorescent material, which are complementary colors, can be used. For example, when the light from the light emitting device and the light from the fluorescent material excited by the light from the light emitting device correspond to the three colors (red hue, green hue, and blue hue), each light can be mixed. As a result, a lighting device which emits desired white light can be obtained, and the lighting device become applicable to the headlight for a vehicle.

The specific portion where the fluorescent material is to be disposed is not limited, and the fluorescent material can be disposed on any portions as long as the lighting device with the desired white light is obtained. For example, when the light emitting device is encapsulated or molded, the fluorescent material can be disposed on the surface of the encapsulating material or the molding member. When the light emitting device is used as the lighting device, the fluorescent material can be disposed on any places on the optical-path from the light emitting device to the light extraction side where the light color mixture can be confirmed with a visual check. It is preferable that the fluorescent material is provided on the light emitting device, and further preferably, to the surface of the p-electrode.

By disposing the fluorescent material on the surface of the p-electrode, a light distribution pattern with clear outline can be obtained. This is because absorption of light or in some cases diffusion of light occurs when the light emitted from the light emitting device transmits through the fluorescent material. As a result, the outline of the light distribution pattern becomes blurred when the fluorescent material is disposed away from the luminescent surface, compared with the case where the fluorescent material is disposed on the surface of the p-electrode (that is, on the luminescent surface).

When the light emitting device which is provided with a substrate and emits light from the substrate side is used, the fluorescent material can be disposed on the surface of the substrate. With this configuration, a light distribution pattern with a clear outline can also be obtained. Moreover, in the light emitting device whose luminescent surface has a region with a high optical output and a region with a low optical output, the light distribution pattern where such regions accurately correspond to each other can be obtained by disposing the fluorescent material on the surface of the p-electrode.

The light emitting device in the present invention includes a fluorescent material. Therefore, different kinds or different quantities of the fluorescent material can also be used. That is, each of the plurality of divided p-electrodes can be coated with the fluorescent materials. For example, the regions with high color rendering properties and low color rendering properties can be obtained with ease by changing the type of the fluorescent material in the lighting device which emits white light. The regions with high optical output and low optical output can also be obtained by changing the type of the fluorescent material. When the construction described above is combined with the configuration where the first electrode 16 and the second electrode 17 are disposed so as to increase the optical output from the first electrode 16, the difference in the optical output can be further widened. Moreover, it is possible that when the regions of high optical output and low optical output are formed using white light, a large amount of fluorescent material can be applied to the region for high optical output and less fluorescent material can be applied to the region for low optical output. With this construction, a uniform white light can be obtained in the luminescent surface. Moreover, it is also possible that the entire surface of the p-electrode is coated with a fluorescent material to the thickness suitable for the region for low optical output, and the region for high optical output is further coated with the fluorescent material.

Various known applying methods for apply the fluorescent material can be used in the present invention in addition to coating. The fluorescent material in the present invention is only required to be applied over the surface of the semiconductor layer. For example, the fluorescent material can be applied over the surface of the semiconductor layer via an intermediate layer. Another layer may further be formed on the surface of the fluorescent material. A configuration described below may be added to the light emitting device or the lighting device of the present invention.

In the present invention, the oblique cut-off line section can be formed as described below. The other end of the oblique cut-off line section combines with the cut-off line section along the horizontal cut-off line section or the oblique cut-off line section extending in the opposite direction. The other end of the oblique cut-off line section may also be combined with a line defined as $-15° \leq H \leq -1°, V=1°$ in the H-V graph (under the conditions of: $-15° \leq H \leq -15°$, $-5° \leq V \leq 5°$) showing measurement points for the light distribution pattern according to JIS D 5500 standard.

In the present invention, it is desirable to construct the lighting device as described below. The light emitting device is mounted on the submount. That is, a plurality of light emitting devices including various shapes and/or sizes are arranged on the submount.

In the case where the lighting device is used as a headlight for a vehicle, the luminescent surface of the light emitting device is arranged in the vertical direction to the lighting device, and a reflective member having a parabolic surface whose focal point is adjusted on the luminescent surface and is disposed on the front and/or back of the luminescent surface.

In the case where the lighting device is used as the headlight for a vehicle, a lens with its focal point being adjusted on the luminescent surface is disposed on the opposite side from the reflective member in relation to the light emitting device in the lighting device.

In the case where the lighting device is used as the headlight for a vehicle, the luminescent surface of the light emitting device is arranged in the vertical direction with respect to the lighting device, and a lens with its focal point being adjusted on the luminescent surface is disposed in front of the luminescent surface in the lighting device.

In the present invention, it is desirable to use the light emitting device having a fluorescent material as described hereinafter. In detail, the light emitting device is equipped with a specific construction for the correlated color temperature and the color rendering properties. A preferable construction for the correlated color temperature will be described below.

The light emitting device, which is at a position approximately corresponding to the other side and the upper portion of the central line which is extending in the vertical direction of the light distribution pattern, has a fluorescent material having a higher correlated color temperature than the fluorescent materials used in the other positions. Moreover, the light emitting device, at the position approximately corresponding to the other side and the upper portion of the central line which is extending in the vertical direction of the light distribution pattern, has a fluorescent material having a higher y value in the CIE chromaticity coordinates than the fluorescent materials used in the other positions.

Moreover, in the light distribution pattern, the approximate position in the other direction side and upper portion of the central line extending in the vertical direction of the light distribution pattern for a vehicle corresponds to the region within $\pm 1°$ of $H=-2°$ and $V=-1°$ in the H-V graph (under the condition of: $-15° \leq H \leq -15°$, $-5° \leq V \leq 5°$) showing the measurement points for the light distribution pattern according to JIS D 5500 standard.

Next, a preferable embodiment of the color rendering properties will be described. In the light emitting device at the position corresponding to a part of the top portion in the other direction side of the light distribution pattern for a vehicle, a fluorescent material is used. This fluorescent material is capable of making the emission of the light emitting device have higher color rendering properties.

Moreover, the light emitting device at the position corresponding to a part of the top portion in the other direction side in the light distribution pattern for a vehicle has a longer peak wavelength than the light emitting device at the other positions. Moreover, the position corresponding to a part of the top portion in the oncoming side is higher than the extension of the horizontal cut-off line section in the light distribution pattern for a vehicle. In the light distribution pattern, a part of the top portion in the other direction side is within the range from ¼ to ½ of the length of the light distribution pattern from the edge of the other side. Moreover, in the light distribution pattern, a part of the top portion in the other side corresponds to the position defined as $H=-1.5°$ to $-7.5°$ and $0° \leq V \leq 1.5°$ in the H-V graph (under the condition of: $-15° \leq H \leq -15°$, $-5° \leq V \leq 5°$) showing the measurement points for the light distribution pattern according to the JIS D 5500 standard.

It is preferable to have the construction satisfying the color rendering properties described above. Here, this construction will be described in further detail.

As for the color rendering properties, it is preferable to form a region having a high color rendering properties in the light distribution pattern. Especially, the position corresponding to a part of the top portion in the other side, that is, the position for illuminating the pedestrians or the road signs on the road in the light distribution pattern for a vehicle preferably has higher color rendering properties than the other portions. Such positions correspond to the upper region of the extension of the horizontal cut-off line section in one side, and further within the range from ¼ to ½ of the length of the light distribution pattern for a vehicle from the end of the other direction.

In another respect, the position can correspond with the region defined as $H=-1.5°$ to $-7.5°$ and $0° < V \leq 1.5°$ in the above mentioned H-V graph.

Although the specific preferable constructions for the correlation color temperature and the color rendering properties are described in relation to the fluorescent material, such constructions can be used in various combinations. That is, in the lighting device of the present invention, the designated portion in the light distribution pattern for a vehicle which is the position approximately corresponding to the upper portion of the central line on the other side of the central line extending in the vertical direction to the light distribution pattern (for example, the portion illuminating ahead on the road surface) can only have high luminance. The position corresponding to a part of the top portion in the other side of the light distribution pattern (for example, the position illuminating the pedestrian and the road sign on the road) can only have high color rendering properties. However, it is desirable to realize both high luminance and high color rendering properties by combining both constructions described above.

When the n-electrode 14 on the first conductive type layer and the p-electrode 15 on the second conductive type layer are disposed so as to connect to the n-type semiconductor layer and the p-type semiconductor layer respectively, the shape, the position, the material, and the thickness of the electrodes are not specifically limited.

For example, when the n-type semiconductor layer, the light emitting layer, and the p-type semiconductor layer are stacked in sequence, it is suitable to remove a portion of the p-type semiconductor layer and a portion of the light emitting layer, and arbitrarily, a portion of the n-type semiconductor layer in the thickness direction, and the n-electrode 14 is disposed on the exposed n-type semiconductor layer and the p-electrode 15 is disposed on the p-type semiconductor layer.

The n-electrode 14 and the p-electrode 15 can be made of a material capable of establishing ohmic contact with the n-type semiconductor layer and the p-type semiconductor layer. Specific examples of such materials include a metal such as aluminum, nickel, gold, silver, copper, chromium, molybdenum, titanium, indium, gallium, tungsten, and element of the platinum group (Pt, Rh, Pd, Ir, Ru, Os), and a conductive oxide such as ITO (Indium Tin Oxide), ZnO, $SnO_2$. Such materials are used as a single layer or as a multilayer. These electrodes are formed with a thickness of, for example, about 50 nm to 15 µm. The material for the n-electrode 14 and the p-electrode 15 are needed to be selected so as to extract light most effectively, in accordance with the mounting configuration of the light emitting device (for example, face-down configuration or face-up configuration) and the direction of the luminescent surface and the like.

The n-electrode 14 and the p-electrode 15 can be formed using a known method in the art. For example, after disposing a layer of the conductive material on the approximately entire surface of the semiconductor layer, patterning is carried out by way of photolithography and an etching process, the lift-off method, or EB (electron beam) method and the like.

In the lighting device of the present invention, it is preferable that the luminescent surface of the light emitting device is arranged so as to face the illumination object, or in some cases, the luminescent surface is arranged so as to face in the opposite direction from the illumination object.

A preferred embodiment of the lighting device according to the present invention will be described below. The thermally conductive substrate used below is shown as an example of the submount in the present invention.

When the lighting device is used for the headlight for a vehicle, it is suitable to set the luminescent surface of the light emitting device parallel to the vertical direction and face the forward direction of the vehicle. It is suitable to position a reflective member on the back of the light emitting device or position a lens in front of the luminescent surface, or use both.

The luminescent surface of the light emitting device may be positioned along the vertical direction of the longitudinal axis and face the rear direction of the vehicle. In this case, a reflective member is needed in front of the luminescent surface and a lens may be disposed in the back of the luminescent surface.

In any cases described above, it is desirable that the lighting device is constructed so that the emitted light is extracted from the opposite side of the electrode layer side, that is, from the substrate side.

Moreover, in the light emitting device of the present invention, the following construction can be made as another embodiment. The p-electrode (it can be replaced by the n-electrode) of the light emitting device of the present invention may have a construction where the p-pad electrode is the first electrode which includes the first straight line section and the second straight line section, and the second electrode is the p-ohmic electrode. That is, the second electrode is in contact with the semiconductor layer and the first electrode is in contact with the second electrode which is apart from the semiconductor layer. Here, the optical output from the light emitting layer beneath the pad-electrode can be made higher than that from the portion other than the pad-electrode, by forming the second electrode layer thinner and the first electrode layer thicker. That is, the optical output of the first electrode can be enhanced. However, the resulting light distribution pattern tends to become blurred. Therefore, the first electrode is preferably formed away from the other electrodes. That is, in view of the clarity of the light distribution pattern, it is desirable to dispose the first electrode away from the other electrodes. A construction where the first electrode, the second electrode, and other electrodes are disposed on the same surface side is a clear example of this preferred embodiment.

Now, each component of the preferred embodiments of the present invention will be described in detail.

(Light Emitting Device)

The light emitting device is normally formed on a substrate. A layer of the first conductivity type, a light emitting layer (active layer), and a layer of the second conductivity type are stacked on the substrate in sequence. Then, a first electrode and a second electrode are disposed respectively on the first-type and second-type conductive layers. At least one of the first conductive-type layer, light emitting layer, and the second conductive-type layer (for example, the light emitting layer) is made of a nitride semiconductor layer.

Although it is desirable that all of those layers are made of the nitride semiconductor layers, a semiconductor layer made of a material other than a nitride may be included. The first conductive-type layer, light emitting layer, and the second conductive-type layer may not only be made into a stacked structure, but can also be connected in the lateral direction. Further, such constructions may be used in various combinations. Various constructions can be used for the light emitting device such as a MIS structure, a pn-junction structure, a homo-junction structure, a hetero-junction structure (double hetero-junction structure), and a PIN-structure. Especially, it is desirable that the first and the second conductive-type layers have different conductive types and form a p-n junction structure where the light emitting layer is placed between the n-type layer and the p-type layer. Moreover, a structure without a substrate or a structure where the n-type semiconductor layer and the p-type semiconductor layer are stacked in a reverse sequence can be used. Each of the n-type semiconductor layer and the p-type semiconductor layer may be formed as a multilayer.

Such a light emitting device has a peak wavelength of, for example, in a range from about 440 to 480 nm, preferably about 460 to 470 nm, and further preferably about 460 nm, and it emits a strong light in the region from ultraviolet light to visible light. In addition, an efficient emission can be obtained by forming a fluorescent material layer using a fluorescent material described hereinafter.

The material for the substrate is not specifically limited and any material can be used as long as it is capable of growing the semiconductor layers thereon. The examples of the substrate used for growing the stacked structure, especially the substrate for epitaxial growth include a foreign substrate made of a different material from the nitride semiconductor such as a insulative substrate of sapphire having a main surface in a C-plane, R-plane or A-plane, and spinal ($MgAl_2O_4$), SiC (including 6H, 4H, and 3C), ZnS, ZnO, GaAs, Si, and an oxide substrate which lattice matches with the nitride semiconductors, and a nitride substrate of a nitride semiconductor substrate such as GaN, AlN. Especially, the sapphire substrate and the spinel substrate are preferably used. Other than the substrate for growing, a substrate which is adhered after the semiconductor layers are grown and has a conductivity such as Cu—W, and a semiconductor substrate such as Si can be used.

Moreover, a substrate where an underlayer and the like are formed thereon can be used. In the case where a foreign substrate in relation to the semiconductor layer which is formed thereon is used, the specific examples of the underlayer include a buffer layer consisting of a low-temperature buffer layer of $Al_xGa_{1-x}N$ ($0 \leq x \leq 1$) grown at a low temperature (200 to 900° C.) and a buffer layer of single crystal which is grown at a high temperature on the low-temperature buffer layer, as the crystalline nucleus forming layer and the nucleus growth layer.

The thickness of the layer is, for example, about from 50 Å to 0.1 μm. A layer known as ELO (Epitaxial Lateral Overgrowth) can also be formed. For example, a growth layer formed in such a way that a growth region such as an island portion (protrusion, mask opening portion) is grown preferentially or selectively compared to other regions, then each of the selective growth portions are grown laterally and conjugated, so as to form a layer. By this, a device structure with an excellent crystallinity, especially where crystal defects are reduced, can be obtained. The underlayer may be included in the operative portion as a light emitting device structure. However, normally, the underlayer is used only for growing the light emitting structure and is provided as an inoperative portion which does not function as a light emitting device.

Specific examples of the nitride semiconductor layer include GaN, AlN, InN, and a group III–V nitride semiconductor which is a mixed crystal thereof. Specific examples of the group III–V nitride semiconductors include $In_\alpha Al_\beta Ga_{1-\alpha-\beta}N$ ($0 \leq \alpha$, $0 \leq \beta$, $\alpha+\beta \leq 1$), a compound as formulated above, but the group III element is partially or entirely substituted by boron and a compound as formulated above where N as a group V element is partially or entirely substituted by P, As, and Sb. InAlGaP-system materials, InP-system materials, AlGaAs-system materials, or mixed crystals thereof can also be used as the semiconductor layer.

The nitride semiconductor layer can be formed using various methods such as MOVPE (Metallorganic Vapor Phase Epitaxy), HVPE (Halide Vapor Phase Epitaxy), MBE (Molecular Beam Epitaxy), and MOCVD (Metal Organic Chemical Vapor Deposition). It is especially preferable to form the nitride semiconductor layer using MOCVD, or MBE.

The nitride semiconductor layer of each conductive type can be formed by adding a dopant which functions as an acceptor or a donor. As for the n-type dopant, the elements of group IV and the group VI such as Si, Ge, Sn, S, O, Ti, and Zr can be used. Especially, Si, Ge, and Sn are preferable, and Si is more preferable. As for the p-type dopant, Be, Zn, Mn, Cr, Mg, Ca etc. are used. Among them, Mg is most preferable. The nitride semiconductor layer can operate as the n-type layer even without having a dopant. The first conductive type layer and the second conductive layer may partially include an undoped layer or a semi-conductive layer.

The first conductive type layer has a layer structure where a dopant of either type is included and connected to the electrode so as to supply and diffuse the carriers into the active layer. Especially, the layer (contact layer) which supplies and diffuses the carrier into the region from the electrode connection region to under the light emitting layer is desirably doped in a higher concentration than the other layers. In addition to such layer for supplying the carriers and allowing in-plane diffusing (contact layer and its neighboring layers), it is desirable to form layers such as an interposing layer for moving and supplying carriers to the luminescent layer in the multilayer direction or a cladding layer for confining the carrier of the second conductive type into the luminescent layer. Such a layer can be formed as a low concentration impurity layer where the dopant concentration is lower than the in-plane diffusion layer, an undoped layer, or a multilayer including these layers.

This layer can prevent degradation of crystallinity caused by the in-plane diffusion layer having relatively high impurity concentration, so that the layers with good crystallinity can be grown thereon. Also, by providing a low impurity concentration layer or undoped layer adjacent to a layer including an impurity in a high concentration, the in-plane diffusion of the carrier can be accelerated and the pressure tightness can also be improved when the obtained light emitting device is in operation.

Here, the multilayer is preferably made with an alternating structure where at least two kinds of layers with different compositions are stacked alternately. A specific example includes a periodically chiming structure of the nitride semiconductor layer including In and a layer having a different composition thereof such as $In_xGa_{1-x}N/In_yGa_{1-y}N$ ($0 \leq x<y<1$). Also, a structure having a gradient composition, a periodic structure, or a gradient structure having a modulated impurity concentration, or a structure having a varied layer thickness can be used. Especially, in the light of crystallinity, it is preferable that the multilayer is formed with the layers each having a thickness of 20 nm or less, more preferably, layers each having a thickness of 10 nm or less.

The light emitting layer (also called the active layer) is preferably formed between the first conductive layer and the second conductive layer which will be described hereinafter. Especially, when the nitride semiconductor including In (for example, InGaN etc.) is used as the light emitting layer, the emission wavelength can be adjusted in the range from ultraviolet light to visible light (red, green, blue) by varying the ratio of the mixed crystal, and further preferable luminous efficiency can be obtained. Moreover, an ultraviolet radiation can be obtained by using a material such as GaN and AlGaN having a higher bandgap than that of InGaN.

Moreover, it is desirable that the active layer having a quantum well structure is used as the light emitting layer. Examples of the quantum well structure include a single quantum well structure having a single well layer and more preferable structure of a multiquantum well structure having a plurality of well layers stacked via the barrier layers. A well layer having InGaN layer is preferable, and a layer having a greater bandgap energy than the well layer such as InGaN, GaN, and AlGaN is preferable as the barrier layer. The thickness of the well layer and the barrier layer is preferably 30 nm or less, preferably 20 nm or less. Especially, the light emitting layer with excellent quantum efficiency can be obtained by controlling the thickness of the well layer to 10 nm or less. The well layer and the barrier layer can either be doped with each conductive type or undoped.

The light emitting layer contributes to determine the shape of the luminescent surface. Therefore, it is preferable to make the light emitting layer so as to form the light distribution pattern as described in Embodiment 4. For example, the shape is preferably almost the same shape as the second electrode 3a, 3b, and 3c shown in FIGS. 11(a) to 11(c), when viewed from the top surface side.

It is desirable to provide a cladding layer which confines the carrier into the light emitting layer and a contact layer which is connected to the electrode in the second conductive type layer. Especially, it is desirable that the cladding layer and the contact layer are formed on the light emitting layer in sequence, and the contact layer is doped with a dopant in a high concentration.

The nitride semiconductor includes Al, and more preferably an AlGaN layer is used for the cladding layer. Moreover, the efficiency of the light emitting layer can be improved by forming the cladding layer adjacent to or in contact with the light emitting layer.

Moreover, the device with an excellent pressure-resistance property can be obtained by forming a layer having lower impurity concentration than that of the contact layer and the cladding layer, between the contact layer and the cladding layer.

Furthermore, the crystallinity can be improved by doping the contact layer with a high concentration. The contact layer emits light below the region where the electrode is connected. Therefore, the contact layer can function as a layer where the carrier is diffused within the plane. With the electrode, in-plane diffusion occurs in the contact layer. Thus, the contact layer can aid diffusion of the p-type carrier with low mobility in the nitride semiconductor. A layer with high carrier concentration can be formed by reducing the thickness of the contact layer to smaller than the other layers (cladding layer, intervening low concentration layer) and doping with an impurity in higher concentrations than the other layers. As a result, the carrier injection from the electrode can be performed efficiently.

When the first and the second electrodes are disposed so as to connect to the first conductive-type layer and the second conductive-type layer respectively, the shape, the position, the material, the thickness and the like are not specifically limited.

For example, when the first conductive-type layer, the light emitting layer, and the second conductive-type layer are stacked in sequence, it is suitable to dispose the first electrode on the first conductive-type layer which is exposed by removing a part of the second conductive-type layer, the light emitting layer, and arbitrarily a part of the first conductive-type layer in the thickness direction, and dispose the second electrode on the second conductive-type layer.

The first and the second electrodes are made of a material capable of establishing ohmic contact with the first conductive-type layer and the second conductive-type layer.

Specific examples of the materials include a metal such as aluminum, nickel, gold, silver, copper, chromium, molybdenum, titanium, indium, gallium, tungsten, and platinum group metals (Pt, Rh, Pd, Ir, Ru, and Os), and a conductive oxide such as ITO, ZnO, $SnO_2$. For example, these electrodes can be formed with a thickness of about 50 nm to 15 μm. It is necessary to select the material for the first and the second electrodes so that the material extracts the luminescence most efficiently according to the mounting configuration of the obtained light emission element (for instance, face down, face up, etc.) and the direction of the luminescent surface and the like.

The first and the second electrodes can be formed by a well-known method in the art. For example, after disposing an electrode material layer on the almost entire surface of the semiconductor layer, the first and the second electrodes are formed by patterning using photolithography and etching processes, lift-off technology, EB (Electron Beam) technology etc.

(Fluorescent Material Layer)

The light emitting device described above can have a fluorescent material layer whose excitation source is the light emittied from the light emitting device.

The fluorescent material layer, or the phosphor layer absorbs a part of visible light or ultraviolet light emitted from the semiconductor layer of the light emitting device and emits light having different wavelengths from that of the absorbed light. In other words, the fluorescent material, or the phosphor is excited by the light emitted from the light emitting layer of the light emitting device and emits light whose wavelength is converted. For example, such a fluorescent material is disposed as thin dots or a layer to such an extent that light can penetrate, by using a resin (such as an epoxy resin, acrylic resin, silicone resin, and urea resin) or an inorganic material (transparent materials such as glass, silicon oxide, and aluminum oxide) as an adhesive agent with an arbitrary dispersing agent (such as barium titanate, titanium oxide, aluminum oxide, silicon oxide, calcium carbonate, and silicon dioxide). The phosphor layer can be disposed (arbitrarily via a protective layer etc.) on the electrode or the substrate of the light emitting device. When the light emitting device is encapsulated or molded, the phosphor layer may be disposed on the surface thereof.

By providing the phosphor layer, the light emitted from the light emitting device and the light emitted by the phosphor, which are complimentary colors, can be used. For example, the light emitted from the light emitting device and the light emitted from the phosphor which is excited by the light emitted from the light emitting device correspond to the light's three colors (red hue, green hue, and blue hue) respectively, and the respective lights can be mixed. As a result, a white mixed light, a mixed light with high luminance, and a mixed light with high color rendering properties can be obtained. Especially, by arbitrarily adjusting the shape of the phosphor, the settling time, the ratio between the phosphor and the adhesive material, the coating quantity, and the coating thickness, and further, by selecting the emission wavelength of the light emitting device, a light with a desired color tone such as an incandescent lamp color including white can be obtained.

Specific examples of the phosphors used for the phosphor layer include:

(1) yttrium aluminum garnet based phosphor activated with cerium (hereafter referred to as "YAG phosphor"), (2) aluminum garnet based phosphor, (3) nitride based phosphor, (4) alkaline earth metal salt based phosphor, (5) zinc cadmium sulphide (ZnCdS:Cu), $Y_2O_2S$:Eu, $La_2O_2S$:Eu, CaS:Eu, SrS:Eu, ZnS:Mn, ZnCdS:Ag,Al, ZnCdS:Cu,Al, and the like.

The YAG based phosphor of (1) include $(Re_{1-x}Sm_x)_3(Al_{1-y}Ga_y)_5O_{12}$:Ce ($0 \leq x < 1, 0 \leq y \leq 1$, wherein Re represents at least one element selected from the group consisting of Y, Gd, and La).

The phosphor represented by general formula $(Re_{1-x}Sm_x)_3(Al_{1-y}Ga_y)_5O_{12}$:Ce has a garnet structure, so that it is resistant to heat, light, and moisture and is especially suitable for long-term use while maintaining high luminance. Also, the excitation spectrum peak can be set about 470 nm. The luminescence peak is about 530 nm and the emission spectrum is broad with a tail continuing in the vicinity of 720 nm.

Specific examples of such phosphor are shown in the following table 1.

Especially, the RGB wavelength components can be increased by using the YAG based phosphor. This is achieved by mixing at least two kinds of phosphors represented by general formula $(Re_{1-x}Sm_x)_3(Al_{1-y}Ga_y)_5O_{12}$:Ce and having different contents of Al, Ga, Y, La, Gd, and Sm. At the present time, fluctuation may occur in the emission wavelength of the light emitting device. However, a mixed light with a desired white tone can be obtained by mixing two or more kinds of phosphors. That is, by combining the phosphors having different chromaticity in connection with the luminance wavelength of the light emitting device, the luminescence of an arbitrary chromaticity in the chromaticity diagram, which is the point on the line connecting the chromaticity of the phosphors and the light emitting device, can be obtained.

The aluminum garnet based phosphor of (2) includes Al, at least one element selected from Y, Lu, Sc, La, Gd, Tb, Eu, and Sm, and one element selected from Ga and In, and activated with at least one element selected from the rare earth elements, and excited by an ultraviolet light or a visible light and emits light. Such phosphors include the yttrium aluminum garnet based phosphor and the lutetium aluminum garnet based phosphor.

(Yttrium Aluminum Garnet Based Phosphor)

This kind of phosphor includes a garnet structure and its luminance spectrum can be shifted toward the shorter wavelength side by replacing a part of the Al with Ga. The luminance spectrum thereof can be shifted toward the longer wavelength side by replacing a part of Y with Gd and/or La in its composition. The luminescent color can be adjusted continuously by varying the composition as described above. Therefore, it has ideal properties for converting blue light of the nitride semiconductor into white light, such as the property capable of continuously changing the intensity in the longer wavelength side by adjusting the composition ratio of Gd. The green component increases and the red component decreases when the substitution of Y is less than 20%. When the substitution of Y is 80% or more, the red component increases, however, the luminance drops.

In the excitation absorption spectrum, similarly, in such a phosphor having a garnet structure, the excitation absorption spectrum can be shifted to a shorter wavelength side by replacing a part of Al with Ga, and to a longer wavelength side by replacing a part of Y with Gd and/or La. The peak wavelength of the excitation absorption spectrum of the phosphor is preferably shorter than the luminance spectrum of the light emitting device. With such a construction, the peak wavelength of the excitation absorption spectrum almost coincides with the peak wavelength of the luminance spectrum of the light emitting device when the electric current applied to the light emitting device is increased. Therefore, occurrence of chromaticity deviate can be prevented without decreasing the excitation efficiency of the phosphor.

Specific examples other than the YAG based phosphor described above include $YAlO_3:Ce$, $Y_3Al_5O_{12}:Ce$, $Y_4Al_2O_9:Ce$, $(Y_{0.8}Gd_{0.2})_3Al_5O_{12}:Ce$, $Y_3(Al_{0.8}Ga_{0.2})_5O_{12}:Ce$, $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, $Y_{2.90}Ce_{0.05}Pr_{0.05}Al_5O_{12}$, and the phosphors shown in the following table 2. Among them, the yttrium aluminum oxide based phosphor including Y and activated with Ce and/or Pr are preferable. Especially, it is desirable that two or more kinds of phosphors with different compositions are used in combination.

For example, the yttrium aluminum oxide based phosphor activated with cerium can emit light with a green hue or a red hue. The phosphor capable of emitting a green light has a garnet structure and is resistant to heat, light and moisture. The peak wavelength of the excitation absorption spectrum of the phosphor is in the vicinity of 420 nm to 470 nm, the luminance peak wavelength λp is in the vicinity of 510 nm, and the luminance spectrum is broad with a tail extending in the vicinity of 700 nm.

The phosphor capable of emitting a red light has a garnet structure and is resistant to heat, light, and moisture. The excitation absorption spectrum of the phosphor has the peak wavelength in the vicinity of 420 nm to 470 nm, and the luminance peak wavelength λp is in the vicinity of 600 nm, and the luminance spectrum is broad with a tail extending in the vicinity of 750 nm.

The emission of green light and red light from the phosphors having yellow body color for absorbing blue light, and the emission of blue light from the light emitting device using the nitride semiconductor can be combined so as to obtain a desired white light.

Moreover, this phosphor exhibits sufficient light stability with high efficiency when disposed in contact with or in proximity to the light emitting device having an irradiance (Ee) of 0.1 $W \cdot cm^{-2}$ or more and 1000 $W \cdot cm^{-2}$ or less.

Such phosphors can be manufactured in the following method.

First, oxides or compounds which can be easily converted into the oxides at high temperature are used as the raw materials such as Y, Gd, Ce, La, Al, Sm, Pr, Tb, and Ga, and they are mixed sufficiently in accordance with the stoichiometric ratio so as to obtain the raw material for the phosphor. The mixture material may also be made by dissolving the rare earth elements of Y, Gd, Ce, La, Sm, Pr, and Tb in stoichiometric proportions in an acid, coprecipitating the solution with oxalic acid and firing the coprecipitation to obtain an oxide of the coprecipitate, and then mixing it with aluminum oxide and gallium oxide.

The obtained raw material is mixed with an appropriate amount of fluoride, such as ammonium fluoride used as a flux, and is charged into a crucible and fired at 1350 to 1450° C. in air for 2 to 5 hours to obtain the calcinated material.

The calcinated material is then ball-milled in water, washed, separated, dried, and finally, sieved thereby obtaining the desired material.

Also, in another manufacturing method, the firing is carried out in two steps. The first step includes firing the mixture of raw materials for the phosphor and the flux in air or in a weakly reducing atmosphere. The second step includes firing them in a reducing atmosphere. Here, the weakly reducing atmosphere refers to an atmosphere containing the necessary amount of oxygen for the reaction process to form a desired fluorescent material from the mixed raw materials. By carrying out the first firing step in the weakly reducing atmosphere until the formation of the desired structure for the fluorescent material has completed, darkening of the fluorescent material and deterioration in its light absorbing efficiency can be prevented. Also, the reducing atmosphere refers to a reducing atmosphere stronger in the degree of reduction than the above discussed weakly reducing atmosphere. The phosphor with high absorption efficiency of the excitation wavelength is obtained when firing it in two steps as described above. Therefore, by using a phosphor manufactured as described above, the quantity of the phosphor necessary to obtain light with a desired color tone can be reduced, and the light extraction efficiency can be improved.

When two or more kinds of such phosphors with different compositions, especially the yttrium aluminum oxide based phosphor is used in a mixture, it is suitable to dispose each phosphor in a single layer. In this case, it is desirable that a phosphor which absorbs light and emits light easily in the shorter wavelength side be disposed closer than a phosphor which absorbs light and emits light easily in the longer wavelength side to the light emitting device. As a result, the phosphors can absorb and emit light efficiently.

(Lutetium Aluminum Garnet Based Phosphor)

A lutetium aluminum garnet based phosphor is represented by the general formula $(Lu_{1-a-b}R_aM_b)_3(Al_{1-c}Ga_c)_5O_{12}$ (where R represents at least one rare earth element where Ce is essential, M is at least one element selected from Sc, Y, La, Gd, and $0.0001 \leq a \leq 0.5$, $0 \leq b \leq 0.5$, $0.0001 \leq a+b<1$, $0 \leq c \leq 0.8$). For example, the phosphor is represented by composition formulas $(Lu_{0.99}Ce_{0.01})_3Al_5O_{12}$, $(Lu_{0.90}Ce_{0.10})_3Al_5O_{12}$, and $(Lu_{0.99}Ce_{0.01})_3(Al_{0.5}Ga_{0.5})_5O_{12}$.

The lutetium aluminum garnet based phosphor (hereafter referred to as "LAG based phosphor") can be obtained as described below. A lutetium compound, a compound of rare earth element R, a compound of rare earth element M, an aluminum compound, and a gallium compound are used as the raw materials for the phosphor. Each compound is weighed in accordance with the ratio in the above formula and mixed, or a flux is added to the raw materials and mixed, in order to obtain the raw material mixture. The raw material mixture is charged into a crucible and fired at 1200 to 1600° C. in reduction atmosphere, and after cooling, a distribution processing is carried out to obtain the phosphor of the present invention represented by the general formula shown above.

A compound such as an oxide or a carbonate which is easily converted into an oxide by thermal decomposition, or a hydroxide is preferably used as a raw material for the phosphor. A coprecipitation including all or a part of the metal elements which are the constituent of the phosphor can also be used. For example, coprecipitation is obtained by adding an aqueous solution of an alkali or a carbonate to an aqueous solution containing such elements, and the coprecipitation can be used after drying or thermal cracking. The fluoride and the borate etc. are desirable for the flux, which is added to the phosphor raw material in the range between 0.01 to 1.0 weight parts in relation to 100 weight parts of the phosphor raw material.

A reducing atmosphere is desirable for the firing atmosphere because cerium which is an activator is not oxidized in the reducing atmosphere. The mixed gas atmosphere of hydrogen and nitrogen which includes hydrogen of 3.0 volume % or less is more desirable. The firing temperature is preferably from 1200 to 1600° C., because a phosphor having a desired center diameter can be obtained. The more preferable temperature is from 1300 to 1500° C.

In the general formula, R is an activator and at least one rare earth element of Ce, La, Pr, Nd, Sm, Eu, Gd, Tb, Dy, Ho, Er, Tm, Yb, and Lr, where Ce is essential. R may include either only Ce, or Ce and at least one rare earth element other than Ce. This is because a rare earth element other than Ce functions as a co-activator. Here, R preferably includes 70 mol % or more of Ce in relation to the whole amount. The a-value (amount of R) is preferably in the range of $0.0001 \leq a \leq 0.5$, because the luminance is decreased with a value of less than 0.0001. When the value exceeds 0.5, the luminance is also decreased due to concentration quenching. $0.001 \leq a \leq 0.4$ is more desirable and $0.005 \leq a \leq 0.2$ is further desirable. The b-value (amount of M) is desirably $0 \leq b \leq 0.5$, more desirably $0 \leq b \leq 0.4$, and further desirably $0 \leq b \leq 0.3$. For example, when M is Y, if the b-value is greater then 0.5, the luminance by the excitation from the long wavelength ultraviolet light to the short wavelength visible light, especially the luminance from the excitation by the light with 360 to 410 nm wavelength drops. The c-value (amount of Ga) is desirably $0 \leq c \leq 0.8$, more desirably $0 \leq c \leq 0.5$, and further desirably $0 \leq c \leq 0.3$. When the c-value exceeds 0.8, the emission wavelength shifts to a shorter wavelength and the luminance is decreased.

The center diameter of the LAG based phosphor is preferably in a range from 1 to 100 μm, more preferably in a range from 5 to 50 μm, and further preferably in a range from 5 to 15 μm. The phosphor having a particle size less than 1 μm tends to form an aggregate. On the contrary, the phosphor having a particle size range from 5 to 50 μm has a high light absorption ratio and a high conversion efficiency, and is easy to form the light converting member. As described above, the productivity of the light emitting device can also be improved by including a phosphor having a large particle size with good optical properties. The phosphor particles having the center particle size described above are preferably contained with high frequency and the frequency value is preferably in a range from 20% to 50%. Color shading can be further controlled and a light emitting device having a good color tone can be obtained by using a phosphor having a low variability in particle size.

The LAG based phosphor has the true specific gravity of 5.4 g/cm$^3$ or more, preferably in a range from 5.4 to 8.0 g/cm$^3$. For example, when a mixture of the LAG based phosphor and an adhesive material is poured into a cup of the supporting member such as a lead frame, a large portion of the phosphor settles down on the light emitting device, because the LAG based phosphor has a larger true specific gravity than the YAG based phosphor described above (true specific gravity of the YAG phosphor is about 4.7 g/cm$^3$). As a result, the luminescence property is improved. Thus, in the lighting device using the LAG phosphor, a phosphor layer having high phosphor content is formed on the light emitting device surface side.

The LAG based phosphor has excellent properties especially as a photoluminescence phosphor which is excited by ultraviolet or visible light and it emits light. The LAG based phosphor is effectively excited by ultraviolet light having wavelength from 300 to 550 nm or visible light and emits light, however, the wavelength of the excitation source is preferably in a range from 300 to 500 nm. The LAG based phosphor has a peak wavelength of the emission spectrum in a range from 500 to 560 nm, the peak wavelength of the excitation spectrum in a range from 320 to 380 nm and from 390 to 480 nm, and the chromaticity coordinates of the x value in a range from 0.250 to 0.450 and the y value in a range from 0.540 to 0.600.

The lutetium aluminum garnet based phosphor is efficiently excited by ultraviolet light having the wavelength in a range from 300 nm to 550 nm or visible light and emits light. Therefore, it can be effectively used as a phosphor included in the light converting member. Furthermore, the luminescent color of the lighting device can be variously adjusted by using a plurality of LAG based phosphors or LAG based phosphors having different composition formulas. A conventional lighting device emits white mixed light by mixing the blue emission from the semiconductor light emitting device and the yellow luminescence from the phosphor which absorbs the emission from the semiconductor light emitting device and emits yellow light. This conventional lighting device uses a portion of the emission from the light emitting device by transmitting it. Therefore, this device simplifies the structure and enhances the output power with ease. On the other hand, the color rendering properties of the above-mentioned lighting device are unsatisfactory because its luminescence is a mixture of two colors, and improvement has been required. In the lighting device that emits white mixed light using the LAG based phosphor, the color rendering properties can be improved compared with the conventional lighting device. Moreover, a lighting device with less deterioration and color shifting can be obtained because the thermal property of the LAG based phosphor is superior than that of the YAG phosphor.

The nitride based phosphor of (3) is a phosphor capable of emitting red light which is excited by absorbing visible light, ultraviolet light, and luminance from other phosphors (for example, the YAG based phosphor) and it emits light. That is, the nitride based phosphor absorbs a portion of light emitted from the light emitting device (for example, blue light) and emits light in a region from yellow to red. The emission spectrum which excites the nitride based phosphor is preferably from 360 to 495 nm. Moreover, the emission spectrum is preferably in the vicinity of 440 to 480 nm. The emission spectrum of the nitride based phosphor preferably has a peak wavelength in the vicinity of 560 to 700 nm, and more preferably in the vicinity from 600 to 680 nm.

Therefore, for example, by using the light emitting device which emits blue light, the blue light emitted from the light emitting device and the yellow to red light emitted from the nitride phosphor are mixed so that mixed light with a warm white hue can be obtained.

The nitride based phosphor includes N, at least one element selected from Be, Mg, Ca, Sr, Ba, and Zn, and at least one element selected from C, Si, Ge, Sn, Ti, Zr, and Hf, and activated with at least one element selected from the rare earth elements (Z). Here, Z, which is the rare earth element and includes at least one element selected from Eu, Y, La, Ce, Pr, Nd, Gd, Tb, Dy, Ho, Er, Lu, Sc, Sm, Tm, and Yb.

Among them, the alkaline earth metal based silicon nitride, for instance, a compound represented by the general formula $L_XSi_YN_{(2/3X+4/3Y)}$:Eu or $L_XSi_YO_ZN_{(2/3X+4/3Y-2/3Z)}$: Eu (L is Sr and/or Ca, and although X, Y, and Z can be an arbitrary number, it is especially desirable that X=2 and Y=5 or X=1 and Y=7) is desirable. This is because a phosphor with good crystallinity can be obtained at a moderate rate by including Si in the component of the phosphor.

Specific examples of such phosphors include $Sr_2Si_5N_8$: Eu,Pr, $Ba_2Si_5N_8$:Eu,Pr, $Mg_2Si_5N_8$:Eu,Pr, $Zn_2Si_5N_8$:Eu,Pr, $SrSi_7N_{10}$:Eu,Pr, $BaSi_7N_{10}$:Eu,Ce, $MgSi_7N_{10}$:Eu,Ce, $ZnSi_7N_{10}$:Eu,Ce, $Sr_2Ge_5N_8$:Eu,Ce, $Ba_2Ge_5N_8$:Eu,Pr, $Mg_2Ge_5N_8$:Eu,Pr, $Zn_2Ge_5N_8$:Eu,Pr, $SrGe_7N_{10}$:Eu,Ce, $BaGe_7N_{10}$:Eu,Pr, $MgGe_7N_{10}$:Eu,Pr, $ZnGe_7N_{10}$:Eu,Ce, $Sr_{1.8}Ca_{0.2}Si_5N_8$:Eu,Pr, $Ba_{1.8}Ca_{0.2}Si_5N_8$:Eu,Ce, $Mg_{1.8}Ca_{0.2}Si_5N_8$:Eu,Pr, $Zn_{0.8}Ca_{0.2}Si_5N_8$:Eu,Ce, $Sr_{0.8}Ca_{0.2}Si_7N_{10}$:Eu,La, $Ba_{0.8}Ca_{0.2}Si_7N_{10}$:Eu,La, $Mg_{0.8}Ca_{0.2}Si_7N_{10}$:Eu,Nd, $Zn_{0.8}Ca_{0.2}Si_7N_{10}$:Eu,Nd, $Sr_{0.8}Ca_{0.2}Ge_7N_{10}$:Eu,Tb, $Ba_{0.8}Ca_{0.2}Ge_7N_{10}$:Eu,Tb, $Mg_{0.8}Ca_{0.2}Ge_7N_{10}$:Eu,Pr, $Zn_{0.8}Ca_{0.2}Ge_7N_{10}$:Eu,Pr, $Sr_{0.8}Ca_{0.2}Si_6GeN_{10}$:Eu,Pr, $Ba_{0.8}Ca_{0.2}Si_6GeN_{10}$:Eu,Pr, $Mg_{0.8}Ca_{0.2}Si_6GeN_{10}$:Eu,Y, $Zn_{0.8}Ca_{0.2}Si_6GeN_{10}$:Eu,Y, $Sr_2Si_5N_8$:Pr, $Ba_2Si_5N_8$:Pr, $Sr_2Si_5N_8$:Tb, and $BaGa_7N_{10}$:Ce, the phosphors shown in the following Table 3, furthermore, the phosphors shown with $(Sr_xCa_{1-x})_2Si_5N_8$:Eu, $Sr_2Si_5N_8$: Eu, $Ca_2Si_5N_8$:Eu, $Sr_xCa_{1-x}Si_7N_{10}$:Eu, $SrSi_7N_{10}$:Eu, and $CaSi_7N_{10}$:Eu, where Mn is added.

Moreover, at least one element selected from the group consisting of Mg, Ga, In, Li, Na, K, Re, Mo, Fe, Sr, Ca, Ba, Zn, B, Al, Cu, Mn, Cr, O and Ni may be included in the composition of the phosphors shown above. These elements have an action such as increasing particle diameter and luminance. Especially, B, Al, Mg, Cr and Ni can suppress afterglow.

The rare earth element is mixed into the raw materials as an elementary substance, an oxide, an imide, and an amide. The rare earth element mainly has a stable trivalent electronic configuration. However, Yb and Sm, etc., have a bivalent electric configuration and Ce, Tb, and Tb, etc., have a quadrivalent electric configuration. When the oxide of the rare earth element is used, oxygen affects the luminance properties of the phosphor. That is, there is an advantage such as shortening the afterglow while a decrease in luminescence may be caused by containing oxygen.

Particle size can be enlarged by using Mn and the luminance can be improved. In the case where La is used as the co-activator, the white crystal of lanthanum oxide ($La_2O_3$) is rapidly converted into the carbonate when it is left in the air, so that preserving it in the inert gas environment is desirable.

When Pr is used as the co-activator, praseodymium oxide ($Pr_6O_{11}$) is used. Different from the usual rare earth oxide $Z_2O_3$, praseodymium oxide is a nonstoichiometric oxide, and the oxalate, the hydroxide, and the carbonate etc. of praseodymium are heated to 800° C. in the air to obtain the praseodymium oxide, which is a black fine particle with the composition of $Pr_6O_{11}$. $Pr_6O_{11}$ is the starting material of the praseodymium compound synthesis, and $Pr_6O_{11}$ having a high purity is available in the market.

Europium (Eu) mainly has the bivalent and trivalent energy levels and used for the luminescence center. In the phosphor of the present invention, $Eu^{2+}$ is used as an activator. When $Eu_2O_3$ is used as the raw material, it is desirable to remove oxygen from the system in advance. Moreover, elemental europium or europium nitride is preferably used.

Mn, which is an additive, accelerates the diffusion of $Eu^{2+}$, therefore, the luminance, the energy efficiency, and the quantum efficiency can be improved. Mn is included in the raw materials, or included during the manufacturing processes as elemental Mn or a Mn compound and is fired with the raw materials. However, it is desirable that Mn is not included in the basic constituent elements after firing, or included in a small quantity compared to the initial quantity. The residual quantity of Mn is preferably 5000 ppm or less.

Among the nitride based phosphors (3), the manufacturing process of $(Sr_xCa_{1-x})_2Si_5N_8$:Eu (wherein Mn and O are included) will be described below.

First, the raw materials of Sr and Cr are ground. It is preferable to use elemental Sr and Ca for the raw materials, however, a compound such as an imide or an amide can be used. The raw materials of Sr and Ca are ground in a glove box in an argon atmosphere. The average particle diameter of ground Sr and Ca is preferably from about 0.1 µm to 15 µm. The purity of Sr and Ca is preferably 2 N and above. In order to improve the mixed state, a raw material can be used which is prepared by making an alloy of at least one of metallic Ca, metallic Sr, and metallic Eu, and then forming a nitride compound and grinding the formed nitride compound.

The Si raw material is ground. It is preferable to use elemental Si, however, a nitride, an imide, an amide, or the like, can also be used. For example, $Si_3N_4$, $Si(NH_2)_2$, $Mg_2Si$ or the like, can be used. The purity of Si is preferably 3 N and above. However, a compound such as $Al_2O_3$, Mg, metallic borate ($Co_3B$, $Ni_3B$, CrB), manganese oxide, $H_3BO_3$, $B_2O_3$, $Cu_2O$, CuO, or the like, can also be included. Si is also ground in an argon or nitrogen atmosphere in a glove box. The average particle diameter of the Si compound is preferably from about 0.1 µm to 15 µm.

Next, nitriding of the Sr and Ca raw materials is carried out in a nitrogen atmosphere, for example, at 600° C. to 900° C. for about 5 hours, and the nitride compounds such as $Sr_3N_2$, $Ca_3N_2$ are obtained.

Nitriding of the Si raw material is carried out in a nitrogen atmosphere, for example, 800° C. to 1200° C. for about 5 hours and the nitride compound $Si_3N_4$ is obtained.

The nitrides of Sr, Ca or Sr—Ca and the nitride of Si are ground respectively in an argon atmosphere or a nitrogen atmosphere in a glove box. Similarly, an Eu compound, such as $Eu_2O_3$ is also ground. As an Eu compound, europium oxide is used, however, metallic europium, nitride europium, and further, an imide or amide compound of europium can also be used.

After grinding, the average diameter of the nitride of the alkaline-earth metal, silicon nitride and europium oxide is preferably from about 0.1 µm to 15 µm.

The raw materials may include at least one selected from the group consisting of Mg, Sr, Ca, Ba, Zn, B, Al, Cu, Mn, Cr, O, Ni, MnO, $Mn_2O_3$ and $Al_2O_3$. Also, the above elements, such as Mg, Zn, B, may be mixed in the mixing process described below, with a predetermined ratio. These elements can be used as a single substance or as a compound. For example, $H_3BO_3$, $Cu_2O_3$, $MgCl_2$, $MgO \cdot CaO$, $Al_2O_3$, the metallic boride (CrB, $Mg_3B_2$, $AlB_2$, MnB), $B_2O_3$, $Cu_2O$, CuO are used.

After grinding, the nitrides of Sr, Ca, and Sr—Ca, the nitride of silicon, and $Eu_2O_3$ are mixed, and Mn is added. The mixing is carried out in an argon or nitrogen atmosphere in a glove box, because the mixture of these materials is susceptible to oxidation.

Finally, the mixture of the nitrides of Sr, Ca, and Sr—Ca, the nitride of silicon, and $Eu_2O_3$ are fired in a nitrogen atmosphere.

The raw material is loaded into a crucible or a boat made of boron nitride (BN), or a crucible made of alumina and it is fired. A tubular furnace, a compact furnace, a high-frequency furnace, a metal furnace, or the like, can be used for firing. The firing can be carried out in the temperature range of from 1200° C. to 1700° C. However, the range from 1400° C. to 1700° C. is preferable. A one step firing method is preferable, in which the furnace temperature is gradually increased, and the firing is carried out at 1200° C. to 1500° C. for several hours. However, a two step firing method (the multistage firing) can also be used, where the first firing step is carried out at 800° C. to 1000° C., and the furnace temperature is gradually increased, then the second firing step is carried out at 1200° C. to 1500° C.

By firing, a fluorescent material represented by the general formula $(Sr_xCa_{1-x})_2Si_5N_8$:Eu with additional Mn can be obtained. The composition of the objective fluorescent material can be changed by changing the mixing ratio of each raw material.

The alkaline earth metal salt of (4) is a phosphor which absorbs a portion of light emitted from the light emitting device and emits light having a different wavelength from the absorbed light. Specific examples of this phosphor include the alkaline earth metal silicate.

The alkaline earth metal orthosilicate represented by the general formula $(2-x-y)SrO \cdot x(Ba,Ca)O \cdot (1-a-b-c-d)SiO_2 \cdot aP_2O_5bAl_2O_3cB_2O_3dGeO_2$:$yEu^{2+}$ (wherein $0<x<1.6$, $0.005<y<0.5$, $0<a,b,c,d<0.5$), and $(2-x-y)BaO \cdot x(Sr,Ca)O \cdot (1-a-b-c-d)SiO_2 \cdot aP_2O_5bAl_2O_3cB_2O_3dGeO_2$:$yEu^{2+}$ (wherein $0.01<x<1.6$, $0.005<y<0.5$, $0<a,b,c,d<0.5$) are preferable as the alkaline earth metal salt.

Especially, the value of at least one of a, b, c, and d is preferably larger than 0.01.

The alkaline earth metal silicate can be manufactured as follows.

First, a stoichiometric amount of an alkaline earth metal carbonate, silicon dioxide, and europium oxide is thoroughly mixed according to the composition selected as an alkaline earth metal silicate.

Next, the mixture is converted into the desired phosphor by the solid state reaction regularly used in the phosphor manufacturing in a reducing atmosphere at 1100° C. and 1400° C. Here, it is desirable to add ammonium chloride or other halides of less than 0.2 moles. Moreover, if needed, a part of silicon may be substituted with germanium, boron, aluminum, and phosphorus, and a part of the europium may be substituted with manganese.

The alkaline earth metal silicate can be used in combination with the alkaline earth metal aluminate activated with europium and/or manganese, Y(V,P,Si)$O_4$:Eu, or the alkaline earth metal-magnesium-bisilicate represented by the general formula $Me_{(3-x-y)}MgSi_2O_3$:xEu,yMn (wherein $0.005<x<0.5$, $0.005<y<0.5$, Me represents at least one of Ba, Sr, and Ca).

The phosphor of (5) is a phosphor capable of emitting red light which is excited by light having a wavelength of 400 to 600 nm and emits light. Specific examples of such phosphors include $Y_2O_2S$:Eu, $La_2O_2S$:Eu, CaS:Eu, SrS:Eu, ZnS:Mn, ZnCdS:Ag, Al, and ZnCdS:Cu, Al.

An emission color which has a desired correlation color temperature and a high color reproductivity can be obtained by combination of the phosphor of (4) and the phosphor of (5), that is, combining at least one phosphor of an alkaline earth metal aluminate activated with europium and/or manganese, Y(V,P,Si) $O_4$:Eu, and $Y_2O_2S$:$Eu^{3+}$.

The phosphor can be used singly or in a mixture of two or more kinds in a single phosphor layer, or singly or in a mixture of two or more kinds in the respective phosphor layers in a stacked structure of two or more layers. Mixture of more than two kinds of phosphors can be made using the phosphors of the same system, or a combination of the phosphors of different systems. Thus, a desired mixed light can be obtained with ease by using two or more kinds of phosphors in combination, which enables mixing lights of emission from the light emitting device and more than two kinds of lights emitted from more than two kinds of phosphors.

It is desirable that the average diameter and the shape of the phosphors are similar in the case where two or more kinds of phosphors are used in combination, in order to decrease the unevenness in the emission from each phosphor and the mixed light. Here, the particle size in the present invention indicates the value obtained from the mass base particle size distribution. The mass base particle size distribution is obtained by measuring the particle distribution by means of a laser diffraction scattering method. Specifically, the phosphor is dispersed in a sodium hexamethaphosphate aqueous solution having a concentration of 0.05% with an environment having a temperature 25° C. and a humidity 70%. Then, the particle diameter is measured with the laser diffraction type particle size distribution measurement device (SALD-2000A) in the particle range from 0.03 μm to 700 μm.

The phosphor layer can be formed by a well-known method in the art such as the potting method, the spray method, and the screen printing method. In the case where the phosphor layer is formed on the surface of the light emitting device, the phosphor layer can be formed after arranging a plurality of light emitting devices in a predetermined pattern, or a plurality of light emitting devices can be arranged in a desired pattern after forming the phosphor layer on each light emitting device. The phosphor generally settles down by its weight in a vapor phase and in a liquid phase. Therefore, the phosphor layer with a high homogeneity can be formed by uniformly dispersing the phosphor in a vapor phase or a liquid phase and discharging onto the surface of the light emitting device with a resin etc. which is the component of the phosphor layer. Moreover, the phosphor layer can be formed with the desired thickness by repeating such a process two or more times if needed. Although in the present specification, the disposed phosphor is described as "phosphor layer", the phosphor can also be formed as an island shape, a line shape, or the like in the present invention. However, a phosphor layer is advantageous in view of homogeneity.

Especially, it is suitable to arrange the predetermined phosphor layer partially, in order to improve the luminance and/or the color rendering properties of a predetermined part of the luminous distribution pattern as described above.

(High Luminance Region)

For example, a phosphor layer using the YAG phosphor of (1) among the aforementioned phosphors is desirably formed in the region where an improvement in luminance is intended. Because the luminance might decrease when other kinds of phosphors shown in (2) to (5) are used in combination with the YAG phosphor of (1) when improvement in luminance is intended, it is desirable to dispose a single phosphor layer using the phosphor of (1) to the region where improvement in luminance is intended.

Specifically, it is suitable to select and use the YAG phosphor of (1) shown in the Table 1 below.

TABLE 1

| No. | Phosphor |
| --- | --- |
| 1-1 | Y(AlGa)O:Ce |
| 1-2 | YAlO:Ce |
| 1-3 | (YGd)AlO:Ce |
| 1-4 | TbAlO:Ce |
| 1-5 | LuAlO:Ce |
| 1-6 | $Ca_2Si_2O_2N_2$:Eu |
| 1-7 | $CaSrSi_2O_2N_2$:Eu |
| 1-8 | $Sr_2Si_2O_2N_2$:Eu |

The amount of phosphor can be properly adjusted according to the target luminance, the kind of phosphor, the kind and amount of adhesive material, etc. For example, it is suitable to include a phosphor with about 1 to 99 weight %, more preferably about 30 to 70 weight % in relation to the total weight of the phosphor layer, and adjust the phosphor layer thickness to about 20 to 40 μm.

Here, it is suitable to dispose the phosphor layer in a region other than the region where the improvement in luminance is intended, by selecting one or more phosphors of (2) to (5) respectively. Especially, it is suitable to form the phosphor by using at least one phosphor selected from the phosphor of (2) and the phosphor of (3) and/or (4) respectively. Moreover, it is suitable to use at least one kind of phosphor in combination, which is selected from the phosphors shown in Table 2 and Table 3 respectively. In this case, these phosphors can be used in a single layer in combination, or used as the respective different layers. The amount of phosphors can be adjusted according to the kind of phosphor and the kind and the amount of the adhesive material. For example, it is suitable to use the phosphors shown in Table 2 and Table 3 where a weight ratio of the phosphor of Table 3 to the phosphor of Table 2 is about 0.01 to 1.0, and more suitably from about 0.05 to 0.40. For this, the suitable total thickness of these phosphor layers is from about 20 to 40 μm.

TABLE 2

| No. | Phosphor |
| --- | --- |
| 2-1 | Y(AlGa)O:Ce |
| 2-2 | YAlO:Ce |
| 2-3 | (YGd)AlO:Ce |
| 2-4 | TbAlO:Ce |
| 2-5 | LuAlO:Ce |
| 2-6 | $Ca_2Si_2O_2N_2$:Eu |
| 2-7 | $CaSrSi_2O_2N_2$:Eu |
| 2-8 | $Sr_2Si_2O_2N_2$:Eu |
| 2-9 | $BaSi_2O_2N_2$:Eu |
| 2-10 | $(Sr_{0.9}Eu_{0.1})_4Al_{14}O_{25}$ |

TABLE 3

| No. | Phosphor |
| --- | --- |
| 3-1 | $(Ca_{0.97}Eu_{0.03})_2Si_5N_8$ |
| 3-2 | $Sr_2Si_5N_8$:Eu |
| 3-3 | $(SrCa)_2Si_5N_8$:Eu |
| 3-4 | $Ba_2Si_5N_8$:Eu |

For example, when the light emitting device having the peak wavelength shorter than 440 nm (for instance, ultraviolet light) is used, a phosphor layer capable of emitting an exciting light with a wavelength of about 440 nm to 480 nm may be formed on the entire area of the luminescent surface of the light emitting device, and then, the phosphor layer capable of enhancing the luminance may be formed thereon.

(High Color Rendering Properties)

Moreover, it is desirable to form the phosphor layer in a region where an improvement in the color rendering properties is intended. The phosphor layer includes a combination of an aluminum garnet based phosphor of (2), a nitride based phosphor of (3), and a phosphor of (4) and/or a phosphor of (5), among the phosphors mentioned above. For instance, the phosphors shown in Table 2 and Table 3 can be used for this combination. The phosphor of (2) and the phosphors of (3) to (5) can be used in combination in a single phosphor layer. However, it is desirable to stack phosphor layers in which each layer contains a single phosphor. Especially, a nitride based phosphor may absorb a part of light whose wavelength has been converted by the aluminum garnet based phosphor. Therefore, it is desirable to stack the nitride based phosphor of (3), the phosphor of (4), or the phosphor of (5) close to the light emitting device and the phosphor of (2) of the aluminum garnet based phosphor away from the light emitting device, in consideration of the light extracting efficiency. In this case, the quantity of the phosphor can be adjusted according to the desired color rendering properties, the kind of phosphor, and the kind and the amount of the adhesive material etc. For example, the phosphor of (2) and the phosphor of (3) to (5), or the phosphor shown in Table 2 and Table 3 are suitably used with the following weight ratio:

[Phosphor of Table 3, phosphor of (3) to (5)]/[phosphor of Table 2, phosphor of (2)]=about 0.01 to 1.0, more preferably from about 0.05 to 0.40. For this, it is suitable to adjust the total thickness of these phosphor layers from about 20 to 40 μm.

The aforementioned phosphor layer can be disposed only on the region where an improvement in color rendering properties is intended. However, in other regions, it is suitable to dispose the phosphor layer by selecting more than one kind of phosphor of (1) to (5) respectively, which are different phosphors from the phosphor used in the phosphor layer of high color rendering properties. That is, it is suitable to dispose a phosphor layer on the region with lower color rendering properties by using at least one kind of phosphor having less color rendering properties than that of the phosphor used in the region of high color rendering properties.

The chromaticity of the nitride based phosphor of (3) can be adjusted in combination with the aluminum garnet based phosphor of (2), especially with a yttrium aluminum oxide phosphor activated with cerium. The yttrium aluminum oxide phosphor activated with cerium can absorb a portion of light emitted from the light emitting device (for example, blue light) and emit light in the yellow region. Here, the blue light emitted from the light emitting device and the yellow light emitted from the yttrium aluminum oxide phosphor are mixed so that a white light is emitted. Therefore, a white mixed light can be emitted by using the yttrium aluminum oxide phosphor in combination with the nitride based phosphor which emits red light and the light emitting device which emits blue light.

Moreover, a white light whose chromaticity locates on the black body locus in the chromaticity diagram and improvement in the special color rendering index R9 can be obtained by adjusting the quantities of the yttrium aluminum oxide phosphor and the nitride based phosphor. That is, the special color rendering index R9 was almost 0 near the correlated color temperature Tcp=4600K and the red component was insufficient in the white light obtained by combining only the light emitting device which emits blue light and the yttrium aluminum oxide phosphor activated with cerium. Therefore, improvement in the special color rendering index R9 has been a problem to be solved. The special color rendering index R9 can be improved to about 40 in the vicinity of the correlated color temperature Tcp=4600K, by using the nitride based phosphor and the yttrium aluminum oxide phosphor in combination.

Also, in the case where an improvement in the color rendering properties is intended, the phosphor layer may be formed in advance on the entire area of the luminescent surface of the light emitting device as described above, by using a phosphor capable of emitting exciting light in the vicinity of 440 nm to 480 nm.

In the regions other than the region where the luminance and/or the color rendering properties are intended, a phosphor layer may not be formed or may be formed by using any kind of phosphors. Proper selection is suitable in consideration of the properties of the light emitting device and the kind of phosphor used in each region etc.

(Protective Member)

In the present invention, the light emitting device is preferably encapsulated or molded with a resin. With this construction, occurrences of a short-circuit or the like can be prevented and the light extract efficiency can be improved compared with the case where the light emitting device is exposed to the atmosphere. Moreover, when the metallic wire, etc., is connected to the light emitting device as the electrical connecting means, it is desirable that such a member is also encapsulated or molded with the resin. Although encapsulation with resin, etc., can be carried out to each light emitting device, it is desirable that the encapsulation is carried out at once after a plurality of light emitting devices are arranged in a predetermined pattern. A thermosetting resin is advantageous because of the easiness of molding. Specific examples of such resins include silicone resin, epoxy resin, and urea resin.

The resin covering the light emitting device is preferably formed into a hemispherical shape, so that the light emitting device without the directivity can be obtained. When the emission from the light emitting device does not have directivity, the emission uniformly enters the entire surface of the reflector, so that a desired light distribution can be obtained with ease.

Moreover, the light emitting device may be covered with a hemispherical, hollow glass or resin, etc. With this construction, the light emitting device can be downsized. That is, when the glass or the resin, etc. is hollow, it functions as a convex lens so that the apparent size of the light source becomes large. As a result, the luminescent surface becomes larger in relation to the reflector surface, etc. A larger optical system becomes necessary to achieve a predetermined light distribution characteristic with this construction. On the other hand, with a hollow cover, the luminescent surface can be made relatively smaller in relation to the reflector, etc., so that the light distribution property becomes easier to control, and excellent light distribution properties can be obtained.

A resin and a glass or a plurality of resins may be used in combination so that the light emitting device is covered with a hemispherical glass or resin and the interior portion thereof is filled with a silicone resin etc.

(Optical Member)

It is desirable to set the luminescent surface of the light emitting device so as to face the irradiation object, or in some cases, to face the opposite direction from the irradiation object.

Especially, when the light emitting device is used as the headlight for a vehicle, it is suitable to set the luminescent surface of the light emitting device perpendicular to the axis of the vehicle and have it face the forward direction of the vehicle. It is suitable to position the reflective member in the backside of the luminescent surface, or position the lens in front of the luminescent surface, or position them both.

Moreover, the luminescent surface of the light emitting device may be set perpendicular to the axis of the vehicle and facing the back of the vehicle. In this case, the reflective member is necessary to be positioned in front of the luminescent surface, and the lens may be positioned in the backside of the luminescent surface.

In either case described above, it is desirable that the light emitting device is formed so that the emission is extracted from the opposite side of the electrode layer side, that is, the emission is extracted from the substrate side.

Here, a reflective member, which is similar to the reflector or the reflecting mirror, etc. and normally is used for such a headlight, can be used as a reflective member. However, it is necessary to use a reflective member having a paraboloid shape with the focal point being adjusted on the luminescent surface of the light emitting device. That is, the light emitting devices are arranged to form almost the same light distribution pattern as that of for a vehicle in the lighting device. Therefore, it is necessary to use a member capable of reflecting light so as to reflect its pattern onto the object without modification.

A material which is usually used for the converging member and the lens, etc. for this kind of headlight can also be used for the lens. However, it is necessary to have the focal point adjusted on the luminescent surface of the light emitting device. That is, the light emitting devices are arranged to form almost the same light distribution pattern as that for a vehicle in the lighting device, therefore, it is necessary to use a member capable of reflecting light so as to reflect its pattern onto the object without modification.

(Heat Dissipation Member)

As a lighting system, especially as the headlight for a vehicle, the lighting device of the present invention has a light source which is the aforementioned lighting device. The light source can be mounted either directly or via the thermal conductive substrate. The lighting device may include the heat transfer unit which transmits heat from the light source to the heat dissipation unit and the reflecting unit has a reflecting surface which directs light from the light source in the front direction of the lighting device.

Here, the external electrode supplies the electric power to the light source in accordance with the conductive substrate or the conductive pattern arranged on the heat transfer unit.

(Thermal Conductive Substrate)

The thermal conductive substrate is capable of mounting the light source and transferring heat generated from the light source to the heat transfer unit. The thermal conductive substrate can be formed into various sizes in consideration of the heat dissipation, the output of the light source and the like. The heat transfer unit is connected to the conductive substrate and preferably has good thermal conductivity so as to release the heat generated from the light source to the heat transfer unit side effectively. Specifically, the thermal conductivity is preferably 0.01 cal/(s)(cm²)(° C./cm) or more, further preferably 0.5 cal/(s)(cm²)(° C./cm) or more.

The materials preferably used for such a thermal conductive substrate are a copper plate, an aluminum plate, and a phosphor bronze plate having the metal plating or the solder plating etc. with silver and palladium, or silver and gold on the surface thereof. Silver plating is preferable because the reflectivity of the light emitted from the light source becomes high so that the light extraction efficiency of the lighting device can be improved. Moreover, the conductive pattern which supplies electric power to the light source can be disposed on the thermal conductive substrate via an insulating member.

(Heat Transfer Unit)

As the heat transfer unit, a heat pipe may be used. In the heat pipe, the hydraulic fluid for heat transport such as water, flon, CFCs substitute, and fluorinert is enclosed in a metal pipe made of a metallic material such as copper and aluminum. The hydraulic fluid is heated at the heat input section (hot section) of the heat pipe so that it transforms into the vapor. Then, the vapor moves to the heat dissipation section (low temperature side) and condenses, and radiates heat. Then, the liquefied hydraulic fluid returns to the heat input section by capillary phenomenon. Extremely high thermal conductivity can be achieved by repeating this operation. It is desirable to form the heat transfer unit into a shape which does not block the light illuminated in the front direction from the reflective unit. The reflective unit will be described hereinafter. That is, the mounting portion for the light source is made with a minimum size to a degree just capable of mounting the light source. At the same time, the support portion which is continuously connected to the light source mounting portion and supports thereof is preferably made as thin as possible compared to the light source mounting portion. Specifically, the heat transfer unit may be bent so that the end portion thereof is connected to the heat dissipation unit or the terminal. Here, the terminal fixes the lighting device to the mounting surface such as the heat sink, and releases heat which is transmitted from the heat transfer unit to the mounting surface side.

Moreover, a conductive substrate having a conductive pattern for supplying electric power to the light source can be provided to the heat transfer unit. The surface of the heat transfer unit is processed into various shapes. The conductive substrate is mounted so as to fit the surface shape of the heat transfer unit. The size of the conductive substrate is made with a possible minimum size for arranging the conductive pattern. At the same time, the conductive substrate is arranged so as not to block the irradiating light, that is, the conductive substrate is placed behind the heat transfer unit so as not to be seen from the front side of the lighting device. Electric power may be supplied to the light source using the conductive pattern which is directly printed on the heat transfer unit via an insulating member.

The reflector unit is placed so as to face the light source and have a reflective surface in order to reflect the irradiating light from the reflector unit in the front direction of the lighting device. Therefore, the reflective surface of the reflector unit for reflecting the irradiating light is preferably formed into a concave shape and a metal plating such as silver plating is provided on its surface. The reflectance of the light can be improved by applying silver plating.

The following examples further illustrate the lighting device and the lighting fixture for a vehicle of the present invention in detail but are not to be construed to limit the scope thereof.

EXAMPLE 1

Figure 2:
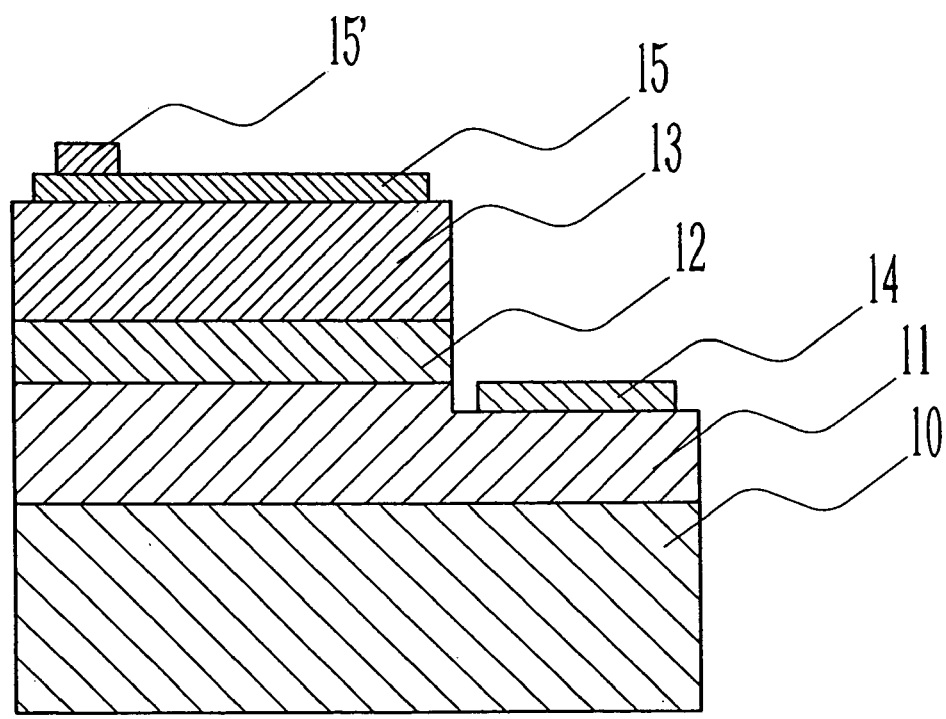
FIG. 2 is a sectional view taken along the line IA—IA in FIG. 1A of a light emitting device used for a lighting device according to the present invention.

The LED which is the light emitting device of the present Example is constructed as shown in FIG. 2. That is, an n-type semiconductor layer 11, an active layer 12, and a p-type semiconductor layer 13 are stacked in sequence on a substrate 10. An n-electrode 14 is disposed on the n-type semiconductor layer 11, a p-electrode which is an ohmic electrode 15 and a pad electrode 15' are disposed on the p-type semiconductor layer 13.

A sapphire substrate having a buffer layer made of undoped AlGaN (layer thickness of 1000 Å) thereon was used as the substrate.

As the n-type semiconductor layer, undoped GaN layer (15000 Å), Si doped GaN layer (41000 Å), undoped GaN layer (3000 Å), Si doped GaN layer (300 Å), undoped GaN layer (500 Å), and ten pairs of undoped GaN layer(40 Å)/InGaN layer (20 Å) were grown in sequence. As the active layer 12, undoped GaN layer (250 Å) and six pairs of undoped InGaN layer (30 Å)/GaN layer (265 Å) were grown in sequence. Further, as the p-type semiconductor layer, a layer having five pairs of Mg doped (doping concentration: $5\times10^{19}$ cm$^{-3}$) AlGaN (40 Å) layer/InGaN (25 Å) layer, undoped AlGaN layer (2800 Å), Mg doped (doping concentration: $1\times10^{20}$ cm$^{-3}$) GaN layer (1200 Å) were grown in sequence.

The ohmic electrode 15 composing the p-electrode was formed with a stacked layer of Ni layer (60 Å) and Au layer (100 Å). The pad electrode 16 was formed with a stacked layer of Ni layer, Ti layer, and Au layer. The n-electrode was formed with a stacked layer of W layer (200 Å), Al layer (1000 Å), W layer (500 Å), Pt layer (3000 Å), and Au layer (5000 Å).

The LED having the construction described above was formed into a chip with 320×320 µm. This LED is a blue LED with the peak wavelength in the vicinity of 460 nm.

Figure 3A:
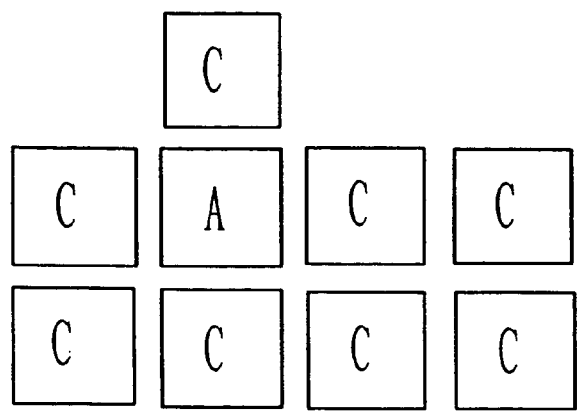
FIG. 3A is a schematic plan view showing a light emitting device arrangement.

Nine of the obtained LEDs were mounted on the submount substrate with face-up configuration using a known method in the art, as shown in FIG. 3A. Here, the submount substrate can be a transparent substrate made of plastic, etc., or an opaque substrate made of silicone, etc.

A phosphor layer was disposed on the surface of the substrate where the LEDs were mounted, in other words, on the surface of the LEDs.

The phosphor layer was formed by a spray method using a mixture of a phosphor, which is the YAG phosphor No. 1-1 in Table 1, and alumina sol with a ratio of 10:10 (alumina sol weight:phosphor weight, hereinafter referred to in the same manner). The center diameter of the phosphor was about 10.2 µm and the thickness of the phosphor layer was about 30 µm. The phosphor layer using the YAG phosphor was only disposed on the LED chip shown as A in FIG. 3A.

Also, the phosphors shown as No. 2-1 and No. 3-1 in Tables 2 and 3 (No. 3-1/No. 2-1=0.26) were mixed with a silicone resin with a ratio of 3:10 (weight ratio), and the phosphor layer was formed by way of screen printing. The central diameters of the phosphors were about 10.2 Am and about 7.3 µm respectively, and the thickness of the phosphor layer was about 30 µm. The phosphor layer using the above phosphors was formed on the LED chips (C in FIG. 3A) other than the LED chip shown as A in FIG. 3A.

Thus, nine of the LED chips were mounted on the submount substrate and the phosphor layer was formed on the surface thereof. Then, the submount was enclosed with a molding member of a silicone resin including a dispersing agent and the lighting device was obtained.

Figure 3B:
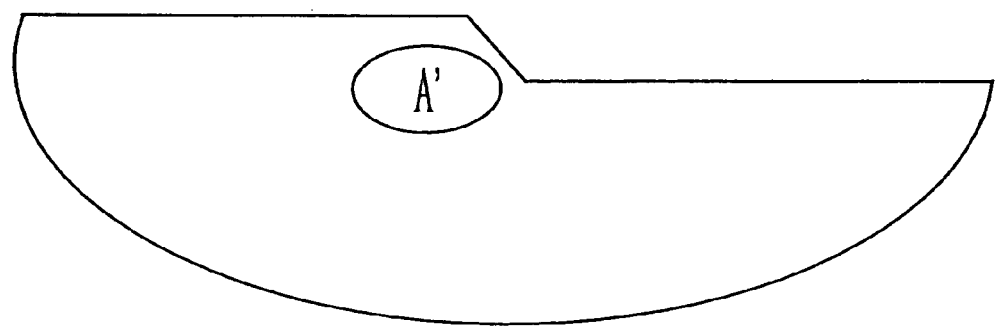
FIG. 3B is a diagram showing a light distribution pattern of a lighting device according to the present invention.

The obtained lighting device had the light distribution pattern as shown in FIG. 3B, where the luminance of the portion shown as A' in FIG. 3B was improved compared with the other portions. Moreover, the correlated color temperature, the y-value in the CIE chromaticity coordinates, and the output power of the portion A' in FIG. 3B were improved compared with the other portions.

Moreover, when each phosphor layer was formed with the respective phosphors of No. 1-2 to No. 1-8 in Table 1 in place of the phosphor No. 1-1 as the YAG phosphors, the obtained lighting device showed improved characteristics in the luminance, the correlated color temperature, the y-value in CIE chromaticity coordinates, and the output power, as in Example 1.

EXAMPLE 2

The substrate obtained in Example 1 having nine LED chips mounted thereon was used and the phosphor layer was formed on its surface, that is, on the surface of the LEDs.

Figure 4A:
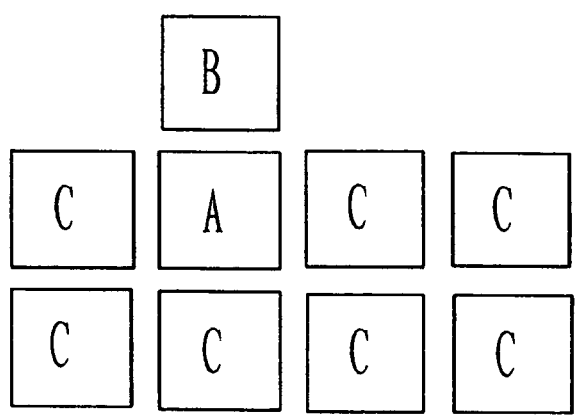
FIG. 4A is a schematic plan view showing a light emitting device arrangement.

As the phosphor, the YAG phosphor No. 1-1 in Table 1 was mixed with a silicone resin with a ratio of 3:10 (weight ratio) as in Example 1, and the phosphor layer was formed with the thickness of about 20 µm using a screen printing. The phosphor layer formed with this YAG phosphor was disposed only on the LED chip shown as A in FIG. 4A.

Moreover, the ratio between the phosphor No. 2-1 (or No. 2-5) and the phosphor No. 3-3 and No. 2-9 (or No. 2-10) in Table 2 and Table 3 is set as [No. 3-3 and No. 2-9 (or No. 2-10)/No. 2-1 (or No. 2-5)=0.62] and mixed with a silicone resin with a ratio of 3:10 (weight ratio), and the phosphor layer was formed using a screen printing. The central particle diameters were about 10.2 µm, 11.3 µm, and 9.9 µm respectively, and the thickness of the phosphor layer was about 20 nm. The phosphor layer using this phosphor was formed on the LED chip shown as B in FIG. 4A.

Moreover, the ratio between the phosphors No. 2-1 (or No. 2-5) and No. 3-1 or No. 3-2 shown in Table 2 and Table 3 is set as [No. 3-1/No. 2-1 (or No. 2-5)=0.26 or No. 3-2/No. 2-1 (or No. 2-5)=0.17] and mixed with a silicone resin with a ratio of 3:10 (weight ratio), and the phosphor layer was formed with the screen printing. The center particle diameters of the phosphors were about 10.2 µm and about 7.5 µm and the thickness of the phosphor layer was about 20 nm. The phosphor layer using this phosphor was formed on the LED chips shown as C in FIG. 4A.

The nine LED chips were mounted on the submount and the phosphor layer was formed on the surface thereof, as described above. Then the submount was enclosed with a mold member which is a silicon resin including a diffusion material, thus, the lighting device was obtained.

Figure 4B:
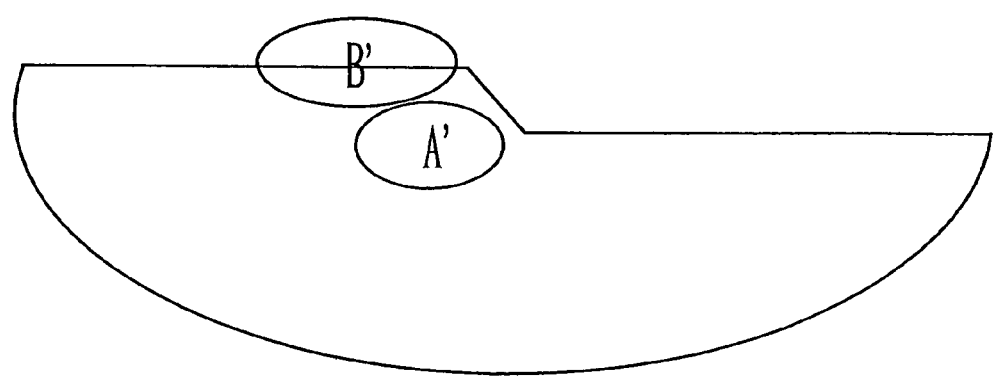
FIG. 4B is a diagram showing a light distribution pattern of another lighting device according to the present invention.

The light distribution pattern of the obtained lighting device had the shape as shown in FIG. 4B, and the luminance was enhanced in the portion shown as A' in FIG. 4B. Moreover, the properties of the correlation color temperature, y value of the CIE chromaticity coordinates, and the output power were increased compared with the other portions. Further, the color rendering properties were elevated in B' in FIG. 4B.

Figure 5:
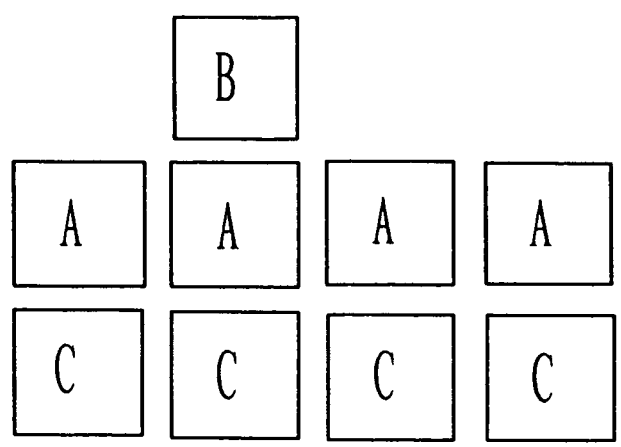
FIG. 5 is a schematic plan view showing a light emitting device arrangement of yet another lighting device according to the present invention.

The phosphor layer was formed on the portion shown as C in FIG. 5. Here, the ratio between the phosphors No. 2-1 (or No. 2-5) and No. 3-1 or No. 2-9 in Table 2 and Table 3 is set as [No. 3-1 and No. 2-9/No. 2-1 (or No. 2-5)=0.62] and mixed with a silicone resin with a ratio of 3:10 (weight ratio), and the phosphor layer was formed by screen printing.

In the obtained lighting device, in addition to the properties described above, the color rendering properties at B in FIG. 4B was elevated compared with the other portions.

EXAMPLE 3

Figure 6:
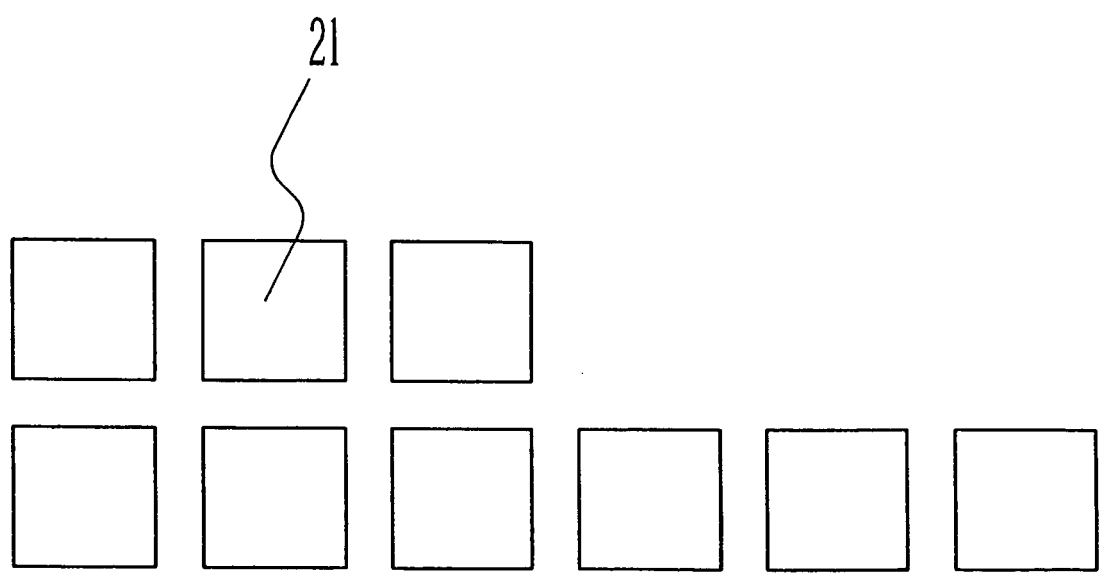
FIG. 6 is a schematic plan view showing a light emitting device arrangement of still another lighting device according to the present invention.
Figure 7A:
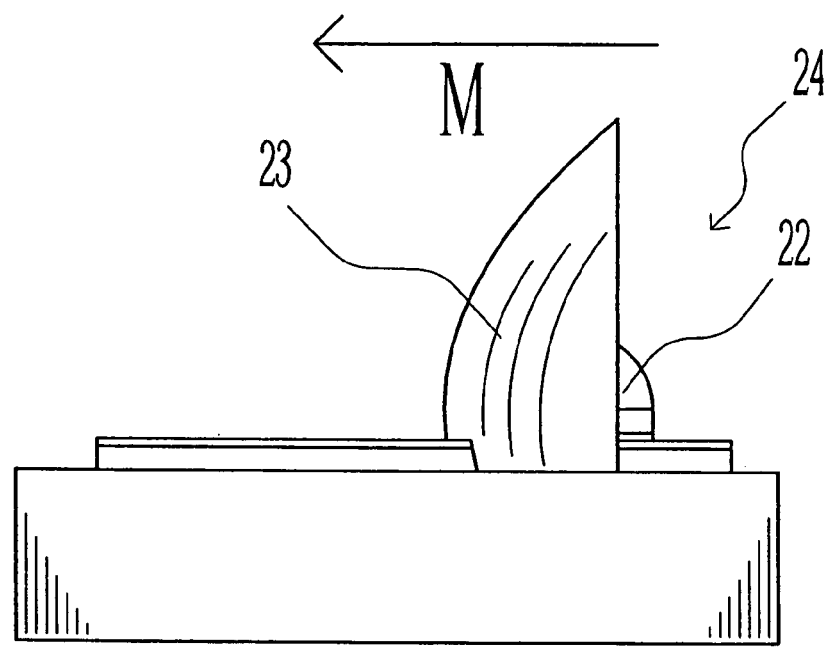
FIG. 7A is a side elevational view showing a major part of a headlight for a vehicle according to the present invention.
Figure 7B:
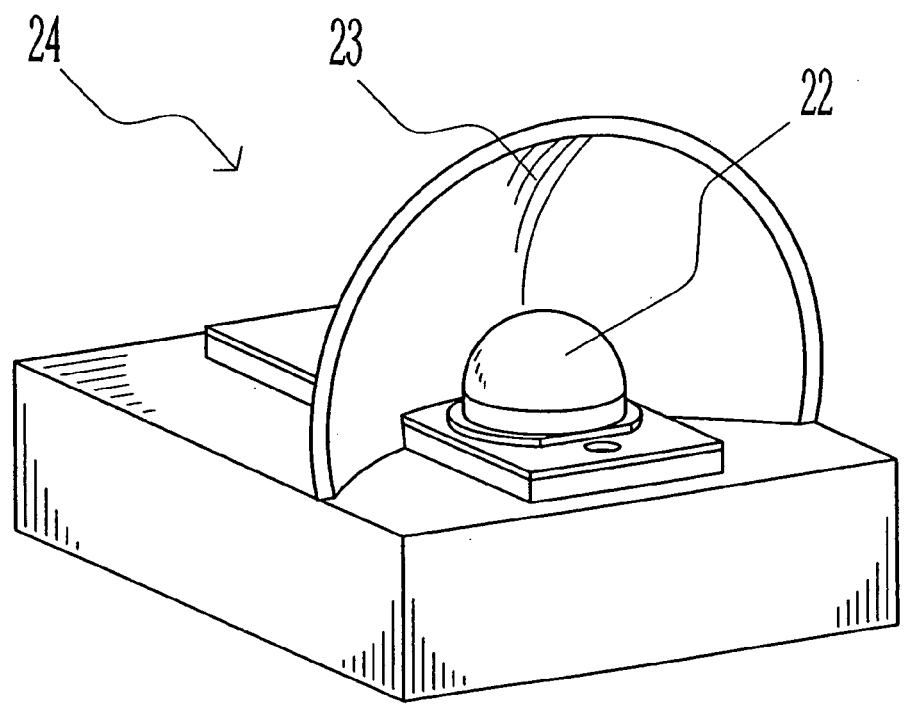
FIG. 7B is a schematic perspective view showing a major part of a headlight for a vehicle according to the present invention.

The lighting device 22 was made in the same manner in Embodiment 3 except for arranging nine of the light emitting devices 21 as shown in FIG. 6. The lighting device 22 was arranged so that the luminescent surface (not shown) of the light emitting device 21 faced in the direction of the arrow M as shown in FIG. 7A and FIG. 7B. The headlight for a vehicle was formed by disposing the reflection member 23 having a paraboloid whose focal point was adjusted on the luminescent surface so as to face the luminescent surface.

The light distribution pattern of the obtained headlight 24 had the pattern close to the patterns shown in FIG. 3B and FIG. 4B.

EXAMPLE 4

Figure 8:
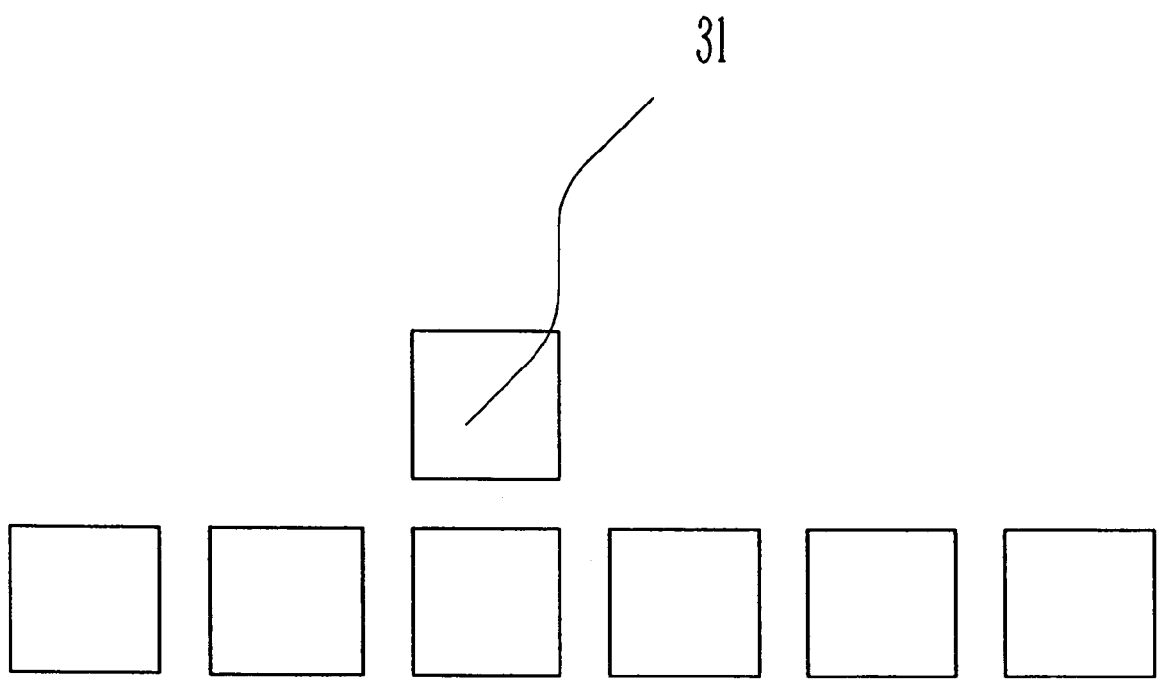
FIG. 8 is a schematic plan view showing a light emitting device arrangement of still another lighting device according to the present invention.
Figure 9A:
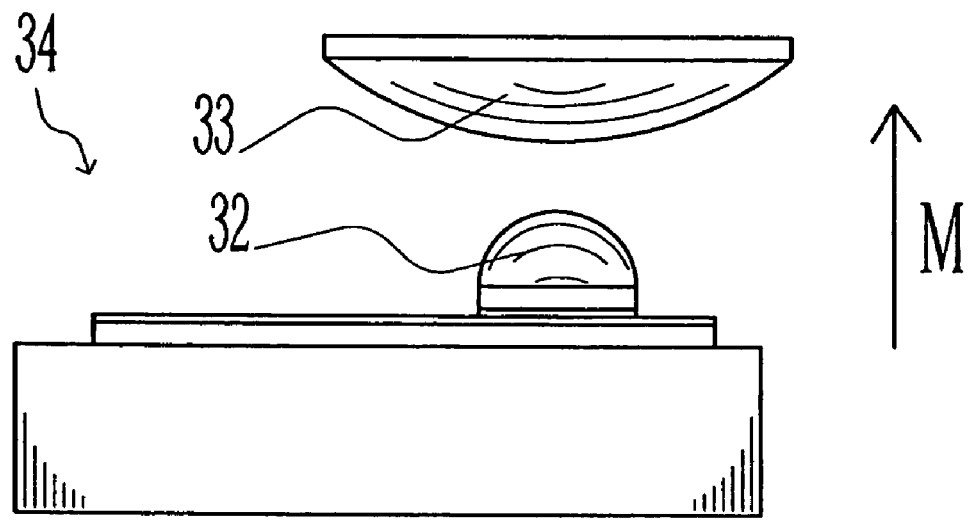
FIG. 9A is a schematic side elevational view of a major part of another headlight for a vehicle according to the present invention.
Figure 9B:
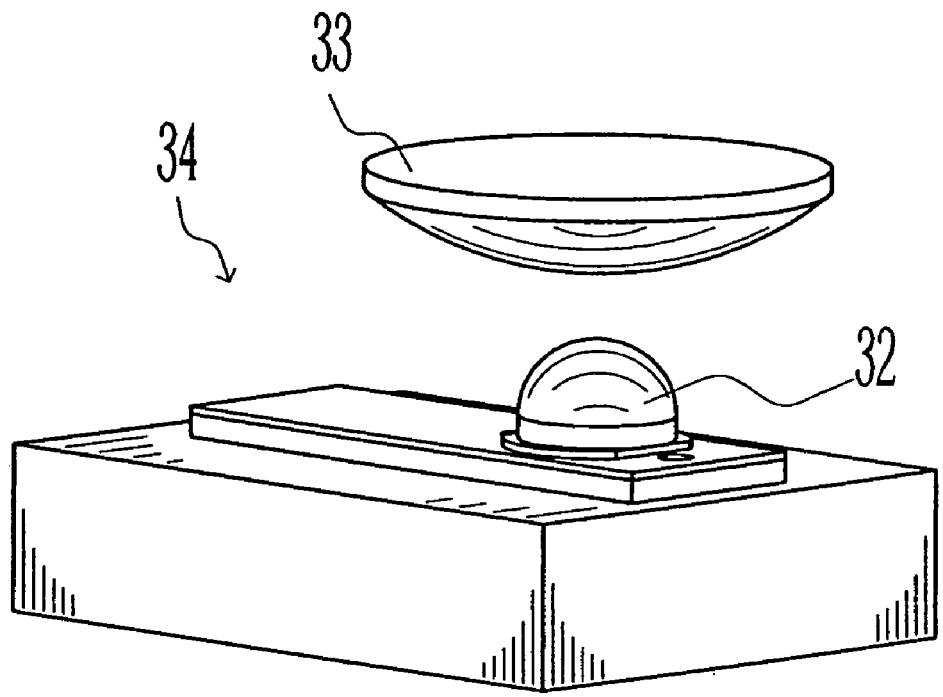
FIG. 9B is a schematic perspective view of a major part of another headlight for a vehicle according to the present invention.

The lighting device 32 was fabricated in the same manner as Embodiment 2 except for arranging seven light emitting devices 31 as shown in FIG. 8. Then, the luminescent surface (not shown) of the light emitting device 31 was disposed so as to face in the direction of the arrow M, as shown in FIG. 9A and FIG. 9B. The headlight for a vehicle 34 was fabricated by disposing a convex lens 33 having the focal point adjusted on the luminescent surface, in front of the luminescent surface of the light emitting device 31.

The light distribution pattern of the obtained headlight 34 had the pattern close to the patterns shown in FIG. 3B and FIG. 4B.

EXAMPLE 5

Figure 12:
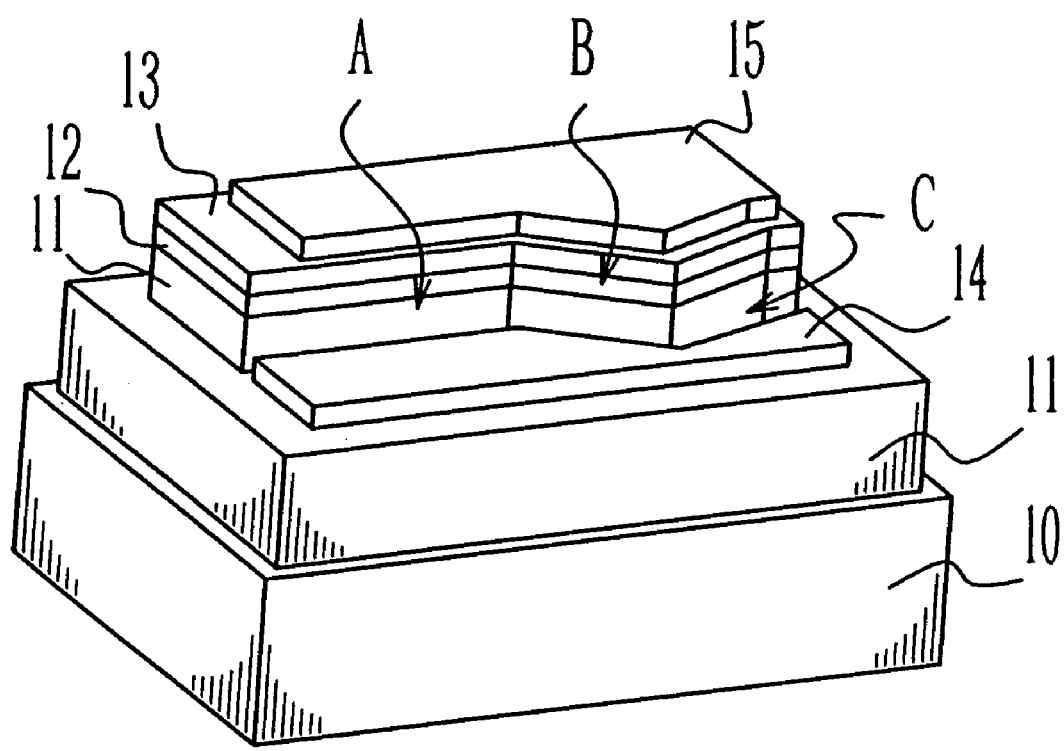
FIG. 12 is a perspective view of a light emitting device used in a lighting device according to the present invention.

The LED of the present example is fabricated with a similar multilayer structure as in Example 1 and divided into chips of 250 µm×750 µm. As shown in FIG. 12, a portion in the depth direction of the p-type semiconductor layer 13, the active layer 12, and the n-type semiconductor layer 11, and the p-electrode 15 are processed so as to have a flat plane A, an inclined plane B, and a plane C inclined in the inverse direction. The light distribution pattern obtained by this LED can be made into almost the same shape as the light distribution pattern for a vehicle which has a predetermined horizontal cut-off line section on the top in one side of the central line extending toward the vertical direction, and an oblique cut-off line section whose central line side being lowered in another side.

This LED is a blue LED having the peak wavelength in the vicinity of 460 nm.

The obtained LED is mounted on the submount substrate with face-up configuration by using a known method in the art. The submount substrate was then encapsulated with a silicone resin and thus the lighting device was fabricated.

Although an opaque substrate made of silicone can be used as the submount substrate, a transparent substrate made of plastic, etc. is more preferable.

Figure 13:
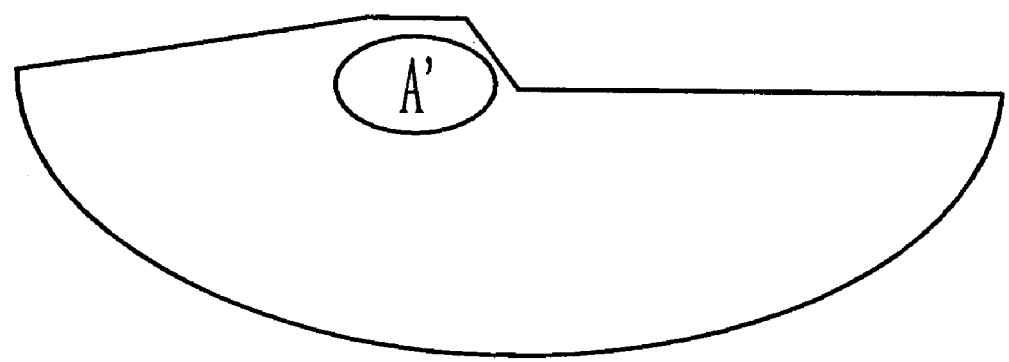
FIG. 13 is a diagram showing a light distribution pattern of a lighting device according to the present invention.

When the luminescent surface of the light emitting device of the lighting device was turned to a screen and it was illuminated, the light distribution pattern shown in FIG. 13 was obtained. Moreover, the region in the vicinity of the n-electrode has a high current density in the luminescent surface. Therefore, the luminance of the region shown as A' in FIG. 13 was higher than other regions, such as the center region of the p-electrode.

EXAMPLE 6

The phosphor layer was formed on the surface of the LED chip obtained in Embodiment 5.

Figure 14A:
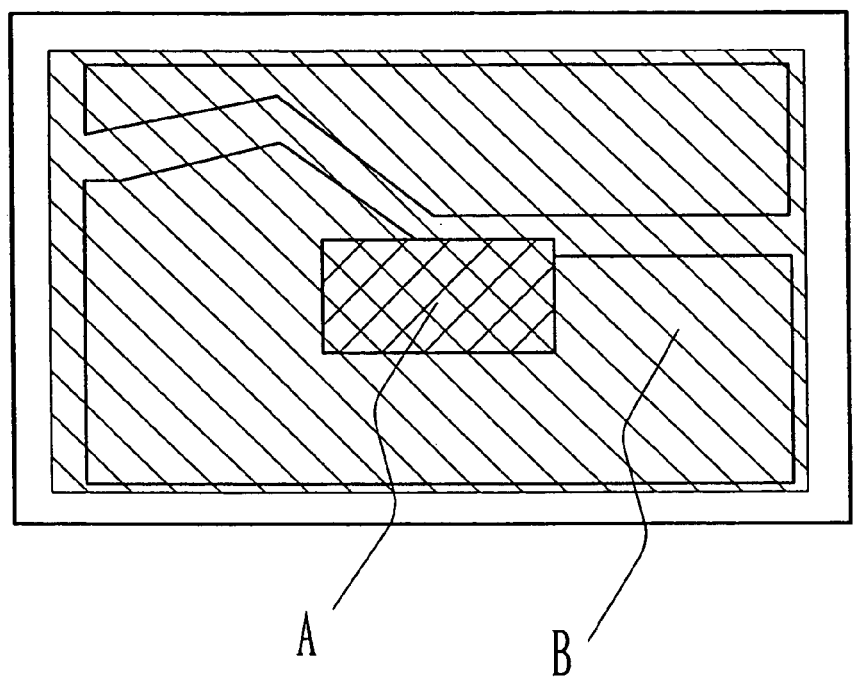
FIG. 14A is a schematic plan view showing a light emitting device.

The YAG phosphor of No. 1-1 in Table 1 was mixed with a silicone resin with a ratio of 3:10 (silicone resin weight: phosphor weight, hereinafter described in the same manner) and the phosphor layer was formed by way of screen printing. The central particle diameter of the phosphor was about 10.2 μm and the thickness of the phosphor layer was about 30 μm. The phosphor layer using this YAG phosphor was disposed only in the region shown as A in FIG. 14A.

The phosphors of No. 2-1 and No. 3-1 in Table 2 and Table 3 (No. 3-1/No. 2-1=0.26) were mixed with a silicone resin with a ratio of 3:10 (weight ratio), and the phosphor layer was formed by way of screen printing. The central particle diameters of the phosphors were about 10.2 μm and about 7.3 μm respectively, and the thickness of the phosphor layer was about 30 μm. This phosphor layer was formed in the region B which is different than the region shown as A in FIG. 14A.

The phosphor layer was formed on the surface of the LED chip as described above and the submount substrate was encapsulated with a mold member of a silicone resin including a diffusing agent, thus, the lighting device was obtained.

Figure 14B:
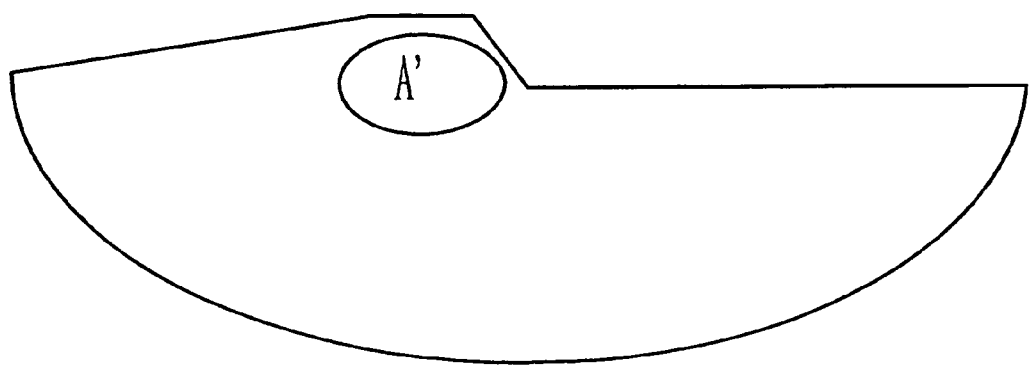
FIG. 14B shows the light distribution pattern of this lighting device according to the present invention.

The light distribution pattern of the obtained lighting device had the shape as shown in FIG. 14B. Furthermore, the luminance at the portion shown as A' in FIG. 14B was increased compared to other portions. Also, the correlated color temperature, the y-value in the CIE chromaticity coordinates, and the output power at the portion A in FIG. 14B were increased compared to other portions.

Moreover, as the YAG phosphor, the phosphor No. 1-1 was used in place of respective phosphors of No. 1-2 to No. 1-8 in Table 1, and the phosphor layer was formed. As in Example 1, the luminance, the correlated color temperature, the y-value in the CIE chromaticity coordinates, and the output power were partially increased in the obtained lighting device.

EXAMPLE 7

A phosphor layer was formed on the surface of the LED chip obtained in Example 5.

Figure 15A:
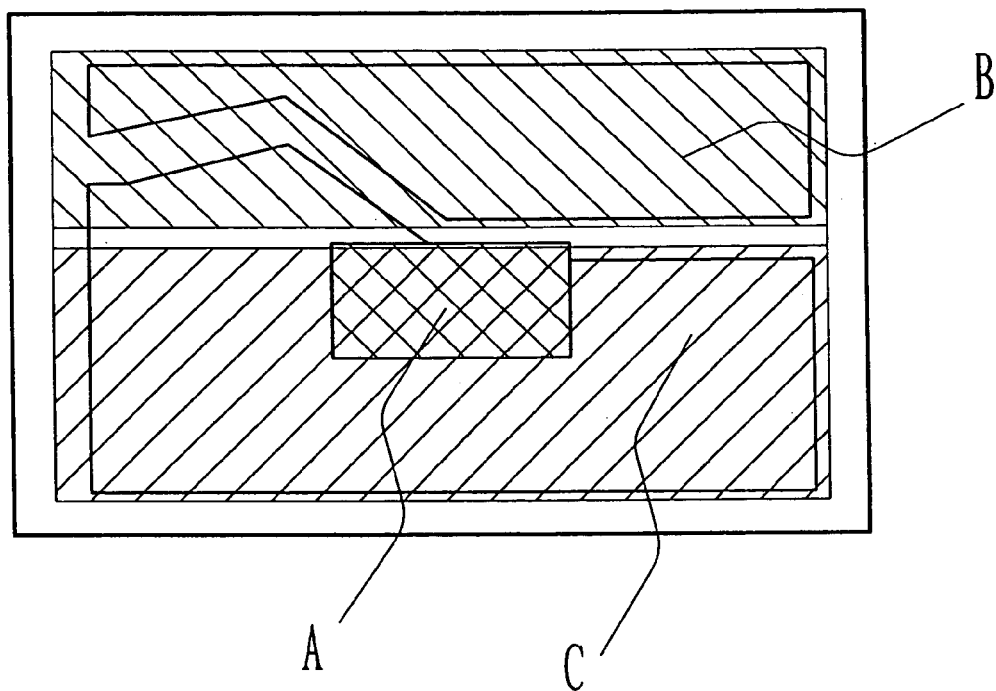
FIG. 15A is a schematic plan view showing a light emitting device.

As the same manner in Example 2, the YAG phosphor of No. 1-1 in Table 1 was mixed with aluminum sol with a ratio of 10:10 (weight ratio) and the phosphor layer was disposed by a spraying method. The phosphor layer using the YAG phosphor was formed only in the region shown as A in FIG. 15A.

The phosphors of No. 2-1 and No. 3-3 (No. 3-3/No. 2-1=0.14) were mixed with alumina sol with a ratio of 10:10 (weight ratio) and the phosphor layer was formed by a spraying method.

The center particle diameters were about 10.2 μm and 11.3 μm respectively, and the thickness of the phosphor layer was about 20 nm. This phosphor layer was formed in the region shown as B in FIG. 15A.

Moreover, the phosphors of No. 2-1 and No. 3-1 or No. 3-2 in Table 2 and Table 3 (No. 3-1 or No. 3-2/No. 2-1=0.26 or 0.17) were mixed with alumina sol with a ratio of 10:10 (weight ratio), and the phosphor layer was formed by a spraying method. The center particle diameter of the phosphors were about 10.2 μm with No. 2-1, about 7.3 μm with No. 3-1, and about 7.7 μm with No. 3-2, and the thickness of the phosphor layer was about 20 nm. This phosphor layer using the above phosphors was disposed in the region shown as C in FIG. 15A.

The phosphor layers were formed on the surfaces of the LED chips as described above, and the submount substrate was encapsulated with a mold member which is a silicone resin including a diffusion agent, thus, the lighting device was obtained.

Figure 15B:
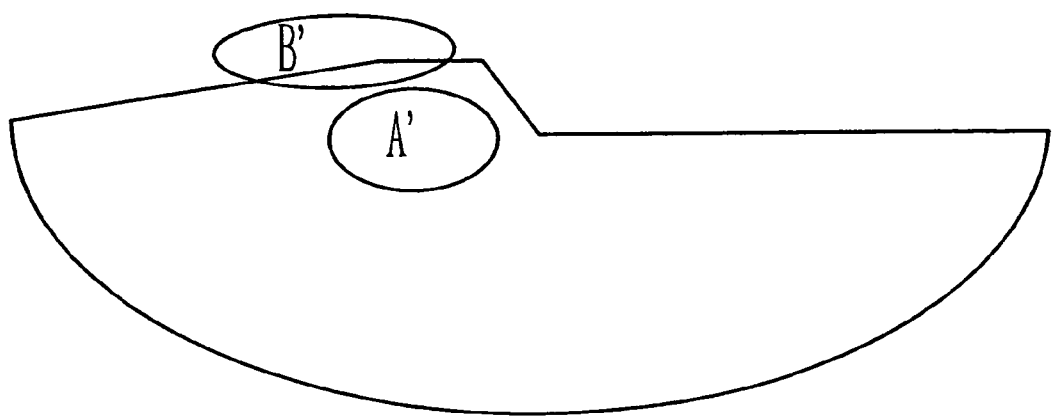
FIG. 15B is a diagram showing a light distribution pattern of another lighting device according to the present invention.

The light distribution pattern of the obtained lighting device had the shape as shown in FIG. 15B, and the luminance of the region A in FIG. 15B was increased compared to other regions. The correlated color temperature, the y-value of the chromaticity coordinates, and the output power of the region A in FIG. 15B were increased compared to the other regions. The color rendering properties in the region shown as B' in FIG. 15B was increased.

In the present example, the phosphors of No. 2-1 and No. 3-3 were respectively mixed with alumina sol with a ratio of 10:10 (weight ratio) and the phosphor layer was formed with a two-layer structure by repeating the spraying method. Moreover, the layer including the phosphor shown in FIG. 3 was disposed closer to the light emitting device (lower layer). With this construction, the color rendering properties were further improved compared with the above example.

EXAMPLE 8

Figure 27:
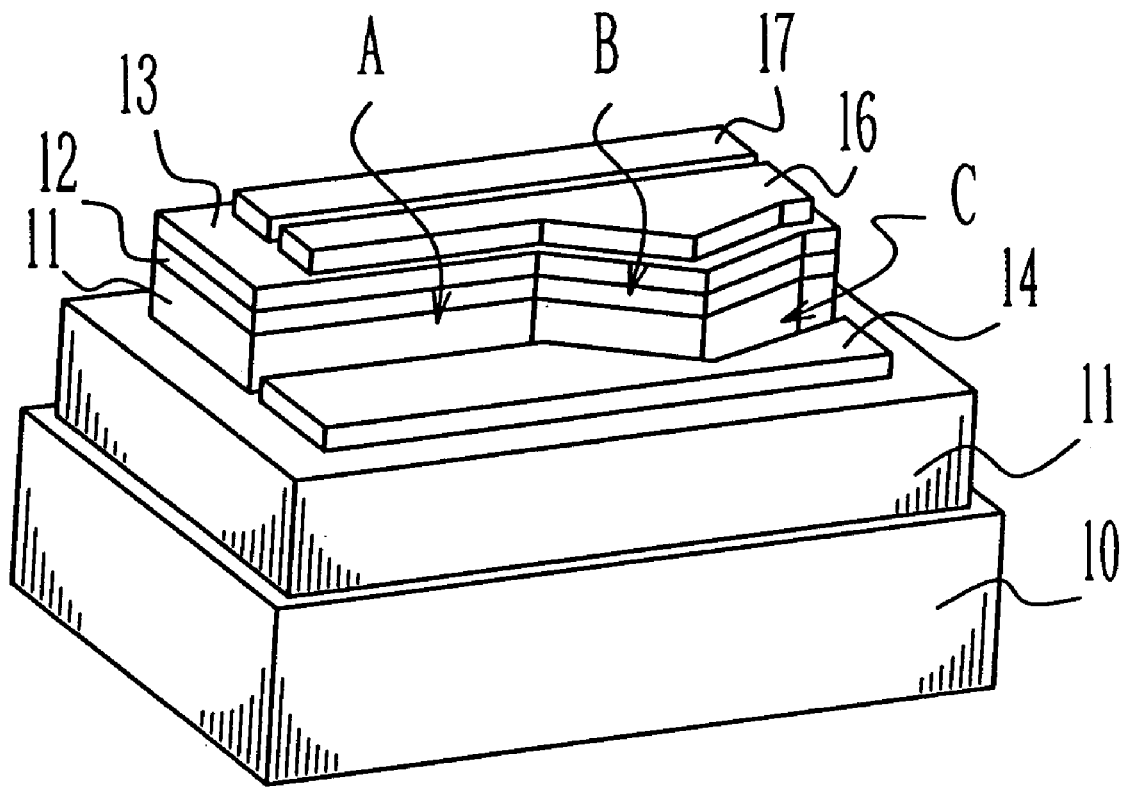
FIG. 27 is a schematic perspective view of the light emitting device shown in FIG. 17.

The LED which is the light emitting device according to the present Example has a structure shown in FIG. 27, where the n-type semiconductor layer 11, the active layer 12 and the p-type semiconductor layer 13 were stacked in sequence on the substrate 10, and the n-electrode was disposed on the n-type semiconductor layer 11 and the p-electrode was disposed on the p-type semiconductor layer 13.

The sapphire substrate 10 having undoped AlGaN (100 Å in thickness) as a buffer layer thereon was used as the substrate.

As the n-type semiconductor layer, undoped GaN layer (15000 Å), Si doped GaN layer (41000 Å), undoped GaN layer (3000 Å), Si doped GaN (300 Å), undoped GaN layer (500 Å), and a layer made with ten pairs of undoped GaN (40 Å)/InGaN (20 Å) were grown in sequence. As the active layer 12, undoped GaN layer (250 Å) and a layer made with six pairs of undoped InGaN (30 Å)/GaN (265 Å) were grown in sequence. Moreover, as the p-type semiconductor layer 13, a layer made with five pairs of Mg doped (doping concentration: $5 \times 10^{19}$ cm$^{-3}$) AlGaN (40 Å)/InGaN (25 Å), undoped AlGaN layer (2800 Å), Mg doped (doping concentration: $1 \times 10^{20}$ cm$^{-3}$) GaN layer (1200 Å) were grown in sequence on the active layer. The p-electrode was formed as a multilayer of Ni layer (60 Å) and Au layer (100 Å), and the n-electrode 14 was formed as a multilayer consisting of W layer (200 Å), Al layer (1000 Å), W layer (500 Å), Pt layer (3000 Å), and Au layer (5000 Å).

Further, patterning was provided for the first electrode 16 including the first straight line section 60 and the second straight line section 70 in its contour, and the second electrode 17, as shown in FIG. 17. Then, etching was carried out and the p-electrode was formed. The angle between the first straight line section 60 and the second straight line section 70 was adjusted to 135°.

The LED having such a multilayer structure was divided into chips of 250 μm×750 μm in size. The chips were processed to have a shape where a portion in the depth direction of the p-type semiconductor layer 13, the active layer 12, and the n-type semiconductor layer 11, and the p-electrode include a flat plane A, a sloped plane B, and an inverted sloped C, on one side of a lateral surface, as shown in FIG. 27. With this construction, the light distribution pattern obtained with this LED can be made into almost the same shape as the light distribution pattern for a vehicle having a predetermined horizontal cut-off line section 80 on the top of one side of the central line extending toward the vertical direction, and an oblique cut-off line section 90 whose central line side is lowered on another side.

This LED is a blue LED with the peak wavelength in the vicinity of 460 nm. The obtained LED was mounted on the submount substrate with a face-up configuration by a known method in the art. The submount substrate was then encapsulated with a silicone resin and the lighting device was made.

Figure 28:
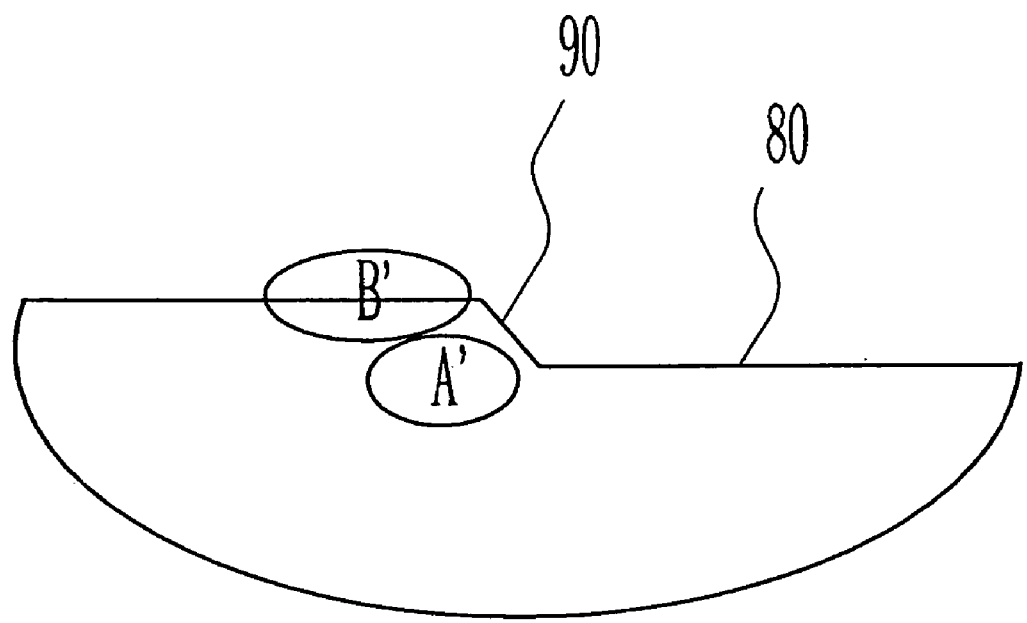
FIG. 28 is a schematic view showing a light distribution pattern of a light emitting device.

When the obtained lighting device was set so that the luminescent surface of the light emitting device is directed to the screen, the light distribution pattern shown in FIG. 28 was obtained.

EXAMPLE 9

The light emitting device according to Example 8 was mounted on the thermal conductive substrate as a submount. The p-electrode and the n-electrode 14 are placed facing each other on the submount and they are electrically connected to the submount with eutectic solder. That is, the substrate side becomes the luminescent surface. Here, the first electrode 16 and the second electrode 17 of the light emitting device are arranged on the submount so as not to electrically connected each other. Thus, in the obtained lighting device, a different amount of electric current can be supplied to the first electrode 16 and the second electrode 17 individually when connected to a power source. Moreover, the lighting device is operated so that a larger current is supplied to the first electrode 16 than that to the second electrode 17. In the present Example, the substrate side becomes the luminescent surface and the p-electrode is disposed in the submount side. In such cases, it is necessary that the p-electrode reflects light from the light emitting device at the electrode surface thereof and releases light from the substrate side. Therefore, using rhodium as the material, the p-electrode is formed to the thickness of 3000 Å.

The light distribution pattern shown in FIG. 28 was obtained when the luminescent surface of the light emitting device of the obtained lighting device was directed to the screen and illuminated it. Moreover, the luminance in the region including A' in FIG. 28 was increased compared to the other regions, for example, the region of the p-electrode which is the farthest from the p-electrode 14.

EXAMPLE 10

When the light emitting device according to Example 8 is mounted on the submount, the substrate of the light emitting device is placed opposite from the submount and mounted using an adhesive agent with good thermal conductivity, so that the p-electrode side becomes the luminescent surface. Next, the n-electrode 14 and the p-electrode 15 are electrically connected to the submount using metallic wires using wire-bonding method. Here, the lighting device is made so that a different electric current can be supplied to each of the first electrode 16 and the second electrode 17 of the p-electrode 15.

Moreover, the lighting device is constructed so that when operated a larger electric current is supplied to the first electrode 16 than to the second electrode 17. The light emitting device was made in the same manner as in Example 2 except for the construction described above.

The light distribution pattern shown in FIG. 28 was obtained when the luminescent surface of the light emitting device of the obtained lighting device was turned to the screen and illuminated it. Moreover, the luminance in the region including A' in FIG. 28 was confirmed to be higher than the other regions, for example, the region of the p-electrode 15 which is the farthest from the n-electrode 14.

EXAMPLE 11

In the light emitting device obtained in Example 8, the p-electrode was formed as the first to the third electrodes as shown in FIG. 18. Further, the first electrode 16 was made with Ni layer (60 Å) and Au layer (40 Å), and the second electrode 17 and the third electrode 18 were made with Ni layer (60 Å) and Au layer (100 Å). The light emitting device was made in the same manner as in Example 1 except for the construction described above. The optical output from the first electrode 16 was higher than that from the second and the third electrodes by forming the first electrode 16 thinner than the second and the third electrodes in addition to the effect achieved in Example 8.

EXAMPLE 12

In the light emitting device obtained in Example 8, the p-electrode was formed with the first to the third electrodes as shown in FIG. 19. The first electrode 16 was made of Ni layer (60 Å) and Au layer (100 Å), and the second electrode 17 and the third electrode 18 were made of Ni layer (40 Å) and Au layer (120 Å), so that the ohmic features between Mg doped GaN and the first electrode 16 were superior to the ohmic features between Mg doped GaN and the second electrode 17 or the third electrode 18. The light emitting device was made in the same manner as in Example 8 except for the construction described above.

The optical output from the first electrode 16 was higher than that from the second and the third electrodes by forming the first electrode 16 thinner than the second electrode 17 and the third electrode 18, in addition to the effect achieved in Example 8.

EXAMPLE 13

In the light emitting device obtained in Example 8, the p-electrode was formed with the first electrode 16, the second electrode 17, the third electrode 18, and the fourth electrode 19, as shown in FIG. 20. The first electrode 16 was made of Ni layer (60 Å) and Au layer (40 Å). The second electrode, the third electrode, and the fourth electrode were made of ITO (indium tin oxide) (5000 Å). Thus, separate electrodes were formed. Furthermore, the first electrode 16 was made so as to have better ohmic features than the second to the fourth electrodes. The light emitting device was made in the same manner as in Example 8 except for the construction described above. The optical output from the first electrode 16 was made higher than that from the second to fourth electrodes by changing the ohmic features of each electrodes, in addition to the effect achieved in Example 8.

EXAMPLE 14

In the lighting device obtained in Example 9, the light emitting device was constructed so that the region for forming the n-electrode was formed with a linearly extended portion along the second side and the third side which are adjacent to the first side of the light emitting device, as shown in FIG. 21. Then, the n-electrode 14 was formed in the n-electrode forming region with the same condition as in Example 9. The lighting device was fabricated in the same manner as in Example 9 except for the construction described above.

With this construction, in addition to the effect achieved in Example 9, the emission was obtained without having color shading at the first electrode 16 and the second electrode 17 of the p-electrode 15, respectively.

EXAMPLE 15

In the lighting device obtained in Example 14, the light emitting device was constructed so that the n-electrode forming region was formed with a linearly extended portion along the second side and the third side which are adjacent to the first side of the light emitting device, as shown in FIG. 21. Further, etching was carried out on the contour of the n-type semiconductor layer so as to expose the sapphire substrate 10. Then, the n-electrode 14 was formed from the n-electrode forming region to the side surface of the n-type semiconductor layer 11, until reaching the sapphire substrate 10. The lighting device was made in the same manner as in Example 9 except for the construction described above.

With this construction, in addition to the effect achieved in Example 14, the rate of occurrence of detachment of the n-electrode 14 from the n-type semiconductor layer 11 (electrode detachment) was reduced. Also, downsizing of the light emitting device became feasible.

EXAMPLE 16

In the light emitting device obtained in Example 11, the phosphor layer was formed on the surface of the LED chip (light emitting device).

The YAG phosphor of No. 1-1 in Table 1, as the phosphor, was mixed with a silicone resin with a ratio of 3:10 (silicone resin weight:phosphor weight, hereinafter referred in the same manner), and the phosphor layer was formed by using a screen printing method. The center particle diameter of the phosphor was about 10.2 μm and the thickness of the phosphor layer was about 30 μm. The phosphor layer using this YAG phosphor was disposed only on the first electrode 16.

Moreover, the phosphors of No. 2-1 and No. 3-1 in Table 2 and Table 3 [(No. 3-1/No. 2-1=0.26) were mixed with a silicone resin with a rate of 3:10 (weight ratio), and the phosphor layer was formed by using a screen printing method. The center particle diameters of the phosphors were about 10.2 μm and about 7.3 μm and the thickness of the phosphor layer was about 30 μm.

The phosphor layer using this phosphor was formed at least on the second electrode 17, and further, so as to cover the entire surface of the light emitting device except for above the first electrode 16. The lighting device was obtained where the n-electrode and the p-electrode were mounted on the submount so as to face each other.

The submount substrate having the phosphor layer disposed on the surface of the LED chip was formed. Then the substrate was encapsulated with a mold member which is a silicone resin including a diffusion agent, and the light emitting device and the lighting device were obtained.

The obtained lighting device had the light distribution pattern almost the same shape as the pattern shown in FIG. 28, and the luminance of the portion A' was increased compared with the other portions in FIG. 28, in addition to the effect achieved in Example 11. The first electrode 16 and the second electrode 17 were made with different thicknesses so as to make the luminance of the first electrode 16 higher than that of the other electrodes, and the different phosphors were used for the phosphor layer disposed on the surface. Thus, the light emitting devices having a large difference in optical output between each device were obtained. The correlation color temperature, the y-value in the CIE chromaticity coordinates, and optical output at the portion A' in FIG. 28 were increased compared with the other portions. Moreover, as the YAG phosphor No. 1-1 were used in place of No. 1-2 to No. 1-8 in Table 1 and the phosphor layer was formed. In the lighting device, the luminance, the correlation color temperature, the y-value in the CIE chromaticity coordinates, and optical output were increased in a portion compared with the other portions.

EXAMPLE 17

Figure 10A:
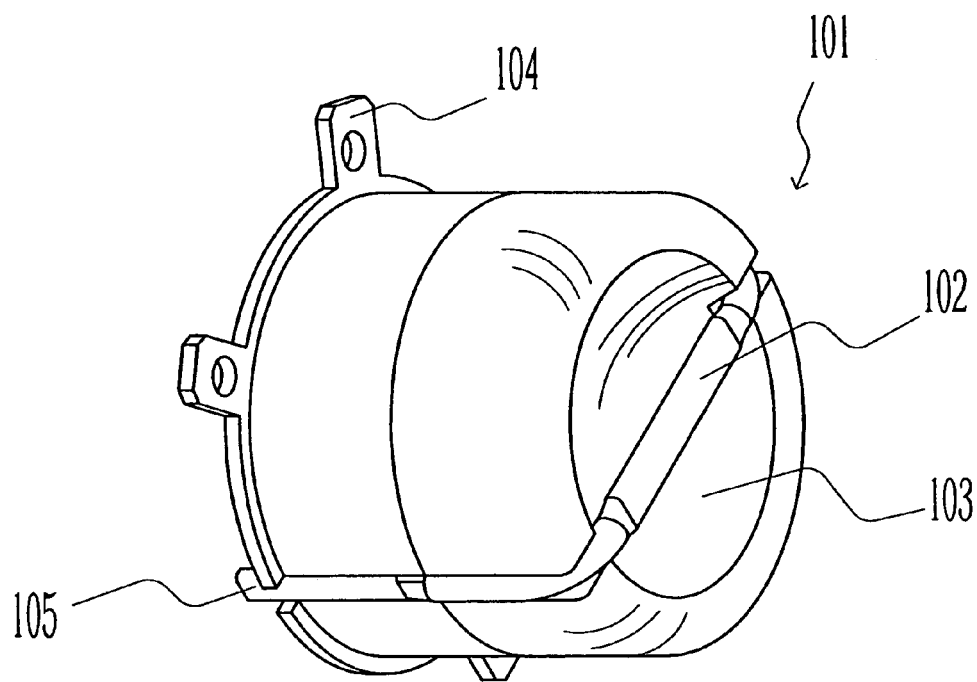
FIG. 10A is a perspective view of a lighting system using a lighting device according to the present invention.
Figure 10B:
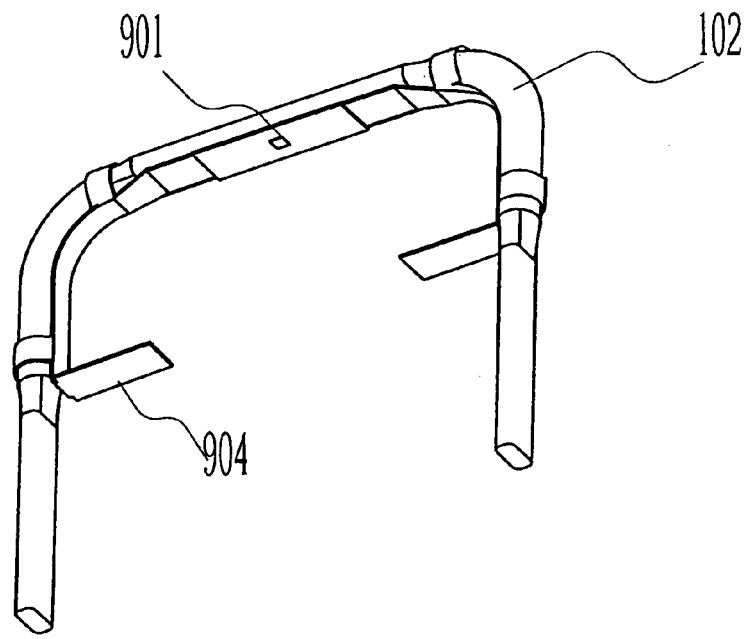
FIG. 10B is a perspective view of a heat transfer unit used in the lighting device.

The lighting system 101 of the present Example can be used as the headlight of a vehicle, and constructed so that the lighting device 101, obtained in the above Example, is mounted on the rear surface of the heat pipe 102, as shown in FIG. 10A and FIG. 10B. The conductive substrate 104 is mounted on the heat pipe 102. The conductive substrate 104 is disposed on the insulating substrate via the insulating member by pattern printing and processed into the shape so as to fit the surface configuration of the heat pipe 102. The size of the conductive substrate 904 is minimized to the degree capable of arranging the conductive pattern, and is disposed behind the heat transfer unit 102 so as not to be seen from the front side of the lighting device. Moreover, the bending process is carried out on the end portion of the conductive substrate 904 so as to form the electric connection with the external electrode with ease. The surface of the conductive substrate 904 was silver-plated.

The heat pipe is placed so as to cross in front of the reflective unit 103. In addition, the heat pipe 102 is bent to fit the surface of the external wall of the lighting device and the end portion 105 thereof is kept so as to be able to make contact with the mounting surface where the lighting device is to be mounted. The terminal 104 having a through hole is placed on the bottom of the lighting device 101. The terminal 104 is used for fixing and for directly releasing heat from the heat pipe 102 to the mounting surface by directly connecting the end portion of the heat pipe 105 with the terminal 104. The reflecting surface of the reflective unit 103 is processed to a concave configuration plated with silver and the curvature is adjusted so that the light from the light emitting diode is reflected to form a parallel light in the forward direction of the lighting device 101.

The light from light emitting device 901 can be reflected in the direction of the reflection unit on the surface of the conductive substrate 904 according to such a construction. Moreover, the electric power can be supplied to the light source without using the wiring code, etc. which blocks light, by installing the conductive substrate over the heat transfer unit. In addition, heat dissipation can be improved by such a construction, and the lighting device using the light emitting device which is capable of high power irradiation can be obtained.

The light distribution pattern of the obtained lighting device shows the approximate pattern in FIG. 4B.

INDUSTRIAL APPLICABILITY

The present invention can be used for the light source of various lighting devices. As the lighting device, the present invention can be applied not only to the headlight for a vehicle but also to the illumination for the road signs and signboards, etc. and for indoor lighting, etc.

It is to be understood that although the present invention has been described with regard to preferred embodiments thereof, various other embodiments and variants may be made by those skilled in the art, which are within the scope and spirit of the invention, and such other embodiments and variants are intended to be covered by the following claims.

This application is based on Japanese Patent Applications No. 2003-314553 filed on Sep. 5, 2003, No. 2003-314554 filed on Sep. 5, 2003, No. 2003-314555 filed on Sep. 5, 2003, and No. 2003-398211 filed in Japan on Nov. 27, 2003, the contents of which are incorporated hereinto by reference.

What is claimed is:

1. A lighting device comprising:
a light source including a plurality of semiconductor light emitting devices, wherein said light source is capable of emitting light having a predetermined light distribution pattern including an upper cut-off line including a horizontal cut-off line section on one side of a central vertical line and an oblique cut-off line section extending angularly on another side; and
wherein said plurality of semiconductor light emitting devices are arranged in a configuration substantially similar to the light distribution pattern and at least two of said plurality of semiconductor light emitting devices each has an n-electrode, said at least two of said plurality of semiconductor light emitting devices are oriented such that a portion opposite to the n-electrode in each of said at least two of said plurality of semiconductor light emitting devices is disposed adjacent to each other, whereby forming a high luminance region adjacent to a connecting point of the oblique cut-off line and the horizontal cut-off line in the light distribution pattern.

2. The lighting device according to claim 1, wherein said light source further includes a fluorescent material disposed on a surface of a p-electrode, whose excitation source is an emission from said semiconductor light emitting device, and a part of a region of said fluorescent material is capable of emitting light with at least one of a higher luminance, higher color rendering properties, a higher correlated color temperature, and a higher y-value in CIE chromaticity coordinates than another part of the region.

3. The lighting device according to claim 1, wherein each of said plurality of semiconductor light emitting devices is mounted face-down.

4. A lighting device comprising:
a plurality of light emitting devices each comprising a nitride semiconductor and a pair of electrodes including a p-electrode,
said plurality of light emitting devices each having a fluorescent material disposed on a surface of said p-electrode, whose excitation source is an emission from said nitride semiconductor, and wherein said plurality of light emitting devices are arranged so as to form a predetermined pattern having an upper cutoff line including a horizontal cut-off line section on one side of a central vertical line and an oblique cut-off line section extending angularly on the other side of the central vertical line and at least two of said plurality of light emitting devices each has an n-electrode, said at least two of said plurality of light emitting devices are oriented such that a portion opposite to the n-electrode in each of said at least two of said plurality of light emitting devices is disposed adjacent to each other, whereby forming a high luminance region adjacent to a connecting point of the oblique cutoff line and the horizontal cutoff line in the light distribution pattern.

5. The lighting device according to claim 4, wherein said light emitting device is disposed in a position corresponding to an upper central portion of the light distribution pattern for a vehicle and has a higher luminance than that of another light emitting device disposed in other position.

6. The lighting device according to claim 4, wherein said light emitting device disposed in the position corresponding to an upper portion in another side of the light distribution pattern for a vehicle includes a fluorescent material capable of emitting light with higher color rendering properties than other light emitting devices.

7. The lighting device according to claim 6, wherein said fluorescent material includes at least one fluorescent material selected from the group consisting of $(Ca_{0.97}Eu_{0.03})_2Si_5N_8$, $Sr_2Si_5N_8{:}Eu$, $(SrCa)_2Si_5N_8{:}Eu$, and $Ba_2Si_5N_8{:}Eu$.

8. The lighting device according to claim 4, wherein said light emitting device disposed in a position corresponding to an upper portion in another side of the light distribution pattern for a vehicle has a longer peak wavelength than that of another light emitting device in another position.

9. The lighting device according to claim 4, wherein each of said plurality of light emitting devices is mounted face-down.

10. A lighting device comprising:
a plurality of light emitting devices each including a nitride semiconductor layer and a pair of electrode layers, and
a fluorescent material layer disposed on a surface of a p-electrode and whose excitation source is an emission from said light emitting device,
wherein at least two of said plurality of light emitting devices each has an n-electrode, said at least two of said plurality of light emitting devices are oriented such that a portion opposite to the n-electrode in each of said at least two of said plurality of light emitting devices is disposed adjacent to each other, whereby forming a high luminance region adjacent to a connecting point of the oblique cut-off line and the horizontal cut-off line in the light distribution pattern and
said fluorescent material layer is capable of emitting light with at least one of a higher luminance and higher color rendering properties in response to a portion of light emitted from said light emitting device.

11. The lighting device according to claim 10, wherein said fluorescent material includes at least one fluorescent material selected from the group consisting of $(Ca_{0.97}Eu_{0.03})_2Si_5N_8$, $Sr_2Si_5N_8{:}Eu$, $(SrCa)_2Si_5N_8{:}Eu$, and $Ba_2Si_5N_8{:}Eu$.

12. The lighting device according to claim 10, wherein said fluorescent material layer comprises a combination of (i) a first fluorescent material and (ii) a second fluorescent material which is a nitride-based fluorescent material, wherein said first fluorescent material (i) includes Al, at least one element selected from Y, Lu, Sc, La, Gd, Tb, Eu, and Sm, and an element selected from Ga and In, and activated with at least one element selected from the rare earth elements, and wherein said second fluorescent material (ii) includes N, at least one element selected from Be, Mg, Ca, Sr, Ba, and Zn, and at least one element selected from C, Si, Ge, Sn, Ti, Zr, and Hf, and activated with at least one element selected from Eu, Y, La, Ce, Pr, Nd, Gd, Tb, Dy, Ho, Er, Lu, Sc, Sm, Tm, and Yb, and wherein a combination of said first fluorescent material and said second fluorescent material is disposed on a portion of the surface of the light emitting device.

13. The lighting device according to claim 12, wherein said fluorescent material layer has a multilayer structure comprising a first layer including at least one of said first fluorescent materials and a second layer including at least one of said second fluorescent materials, and said second layer is disposed closer to the light emitting device than said first layer.

14. The lighting device according to claim 12, wherein said first fluorescent material includes at least one of the compounds selected from the group consisting of Y(AlGa)O:Ce, YAlO:Ce, (YGd)AlO:Ce, TbAlO:Ce, LuAlO:Ce, $Ca_2Si_2O_2N_2$:Eu, $CaSrSi_2O_2N_2$:Eu, $Sr_2Si_2O_2N_2$:Eu, and $BaSiO_2N_2$:Eu.

15. The lighting device according to claim 12, wherein said second fluorescent material includes at least one of the fluorescent materials selected from a group of alkaline earth metal-based silicon nitrides represented by formulas:

$L_XSi_YN_{(2/3X+4/3Y)}$:Eu or $L_XSi_YO_ZN_{(2/3X+4/3Y-2/3Z)}$:Eu, wherein L represents Sr and/or Ca, and X and Y represent an arbitrary number.

16. The lighting device according to claim 12, wherein said second fluorescent material includes at least one fluorescent material selected from the group consisting of $(Ca_{0.97}Eu_{0.03})_2Si_5N_8$, $Sr_2Si_5N_8$:Eu, $(SrCa)_2Si_5N_8$:Eu, and $Ba_2Si_5N_8$:Eu.

17. The lighting device according to claim 10, wherein each of said plurality of light emitting devices is mounted facedown.

18. A light fixture comprising: a light source including a semiconductor light emitting device, said light source being capable of emitting light having a light distribution pattern having an upper cut-off line including a horizontal cut-off line section on one side of a central vertical line and an oblique cut-off line section extending angularly on the other side of the central vertical line, and the light distribution pattern of the light source forming the light distribution pattern includes a plurality of semiconductor light emitting devices arranged in a configuration substantially similar to the light distribution pattern for a vehicle, wherein at least two of said plurality of semiconductor light emitting devices each has an n-electrode, said at least two of said plurality of semiconductor light emitting devices are oriented such that a portion opposite to the n-electrode in each of said at least two of said plurality of semiconductor light emitting devices is disposed adjacent to each other, whereby forming a high luminance region adjacent to a connecting point of the oblique cut-off line and the horizontal cutoff line in the light distribution pattern.

19. The light fixture according to claim 18, further comprising a reflective member having a parabolic surface;

wherein the luminance surface of said light emitting device is disposed in a vertical direction, and a focal point of the parabolic surface is set on said luminance surface.

20. The light fixture according to claim 18, wherein each of said plurality of semiconductor light emitting devices is mounted face-down.

21. A light fixture comprising:

a plurality of light emitting devices each having a nitride semiconductor, a pair of electrodes including a p-electrode, and a fluorescent material disposed on a surface of said p-electrode, wherein at least two of said plurality of light emitting devices each has an n-electrode, said at least two of said plurality of light emitting devices are oriented such that a portion opposite to the n-electrode in each of said at least two of said plurality of light emitting devices is disposed adjacent to each other, whereby forming a high luminance region adjacent to a connecting point of the oblique cut-off line and the horizontal cut-off line in the light distribution pattern and said fluorescent material is capable of emitting light with at least one of a higher luminance and higher color rendering properties in response to a portion of light emitted from said light emitting device.

22. The light fixture according to claim 21, wherein each of said plurality of semiconductor light emitting devices is mounted face-down.

* * * * *